United States Patent
Kasai

(10) Patent No.: US 11,307,455 B2
(45) Date of Patent: Apr. 19, 2022

(54) LIGHT-EMITTING MODULE HAVING ARRAY OF LIGHT SOURCES, SOME ALIGNED AND OTHERS OFFSET WITH ARRAY OF LENSE STRUCTURES

(71) Applicant: NICHIA CORPORATION, Anan (JP)

(72) Inventor: Daisuke Kasai, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 17/032,827

(22) Filed: Sep. 25, 2020

(65) Prior Publication Data

US 2021/0088844 A1    Mar. 25, 2021

(30) Foreign Application Priority Data

Sep. 25, 2019  (JP) .............................. JP2019-174488
Jul. 20, 2020  (JP) .............................. JP2020-123726

(51) Int. Cl.
*G02F 1/13357* (2006.01)
*F21V 8/00* (2006.01)

(52) U.S. Cl.
CPC ..... *G02F 1/133603* (2013.01); *G02B 6/0055* (2013.01)

(58) Field of Classification Search
CPC .... F21V 5/007; F21V 7/0083; F21Y 2105/12; G02F 1/133603
See application file for complete search history.

(56) References Cited

U.S. PATENT DOCUMENTS

| | | | | |
|---|---|---|---|---|
| 4,254,453 A * | 3/1981 | Mouyard | ................ | G09F 13/22 340/815.54 |
| 4,914,731 A * | 4/1990 | Chen | ........................ | G09F 9/33 340/815.45 |
| 7,736,019 B2 * | 6/2010 | Shimada | ................. | F21S 8/026 362/244 |
| 7,828,461 B2 * | 11/2010 | Mayer | ................... | F21V 7/0058 362/241 |
| 8,804,066 B2 * | 8/2014 | Imajo | ................ | G02F 1/133603 349/61 |
| 9,212,796 B2 * | 12/2015 | Ngai | ..................... | G02B 6/0021 |
| 9,448,436 B2 * | 9/2016 | Sakai | ................ | G02F 1/133606 |
| 9,593,823 B2 * | 3/2017 | Schadt | ................... | F21V 7/0083 |
| 2005/0265029 A1 | 12/2005 | Epstein et al. | | |

(Continued)

FOREIGN PATENT DOCUMENTS

EP    3540504 A1    9/2019
JP    2013089726 A    5/2013

(Continued)

*Primary Examiner* — Ismael Negron
(74) *Attorney, Agent, or Firm* — Hunton Andrews Kurth LLP

(57) ABSTRACT

A light-emitting module includes a light-transmitting plate member having a first main surface and an opposite second main surface light-transmitting plate member including a plurality of light sources provided on the first surface; and a plurality of lens structures provided in the second surface and corresponding to each of the light sources, such that an optical axis of some of the lens structures coincident with the optical axis of a corresponding one of the light sources, and, an optical axis of some of the lens structures is offset from an optical axis of a corresponding one of the light sources.

20 Claims, 30 Drawing Sheets

(56) References Cited

U.S. PATENT DOCUMENTS

| | | | |
|---|---|---|---|
| 2007/0030676 A1* | 2/2007 | Ichihara | F21K 9/00 |
| | | | 362/244 |
| 2012/0099046 A1* | 4/2012 | Kasai | G02F 1/133603 |
| | | | 349/61 |
| 2012/0199852 A1 | 8/2012 | Lowes et al. | |
| 2015/0146424 A1* | 5/2015 | Karg | F21V 5/007 |
| | | | 362/240 |
| 2018/0136520 A1 | 5/2018 | Kim | |
| 2018/0239193 A1 | 8/2018 | Hayashi | |
| 2019/0049649 A1 | 2/2019 | Hayashi et al. | |
| 2020/0363039 A1* | 11/2020 | Chu | F21V 3/049 |
| 2021/0091055 A1* | 3/2021 | Kasai | H01L 33/58 |

FOREIGN PATENT DOCUMENTS

| | | |
|---|---|---|
| JP | 2013175429 A | 9/2013 |
| JP | 2014116235 A | 6/2014 |
| JP | 2016129215 A | 7/2016 |
| JP | 2018133304 A | 8/2018 |
| JP | 2019012681 A | 1/2019 |
| KR | 20090117419 A | 11/2009 |
| WO | 2014091686 A1 | 6/2014 |

\* cited by examiner

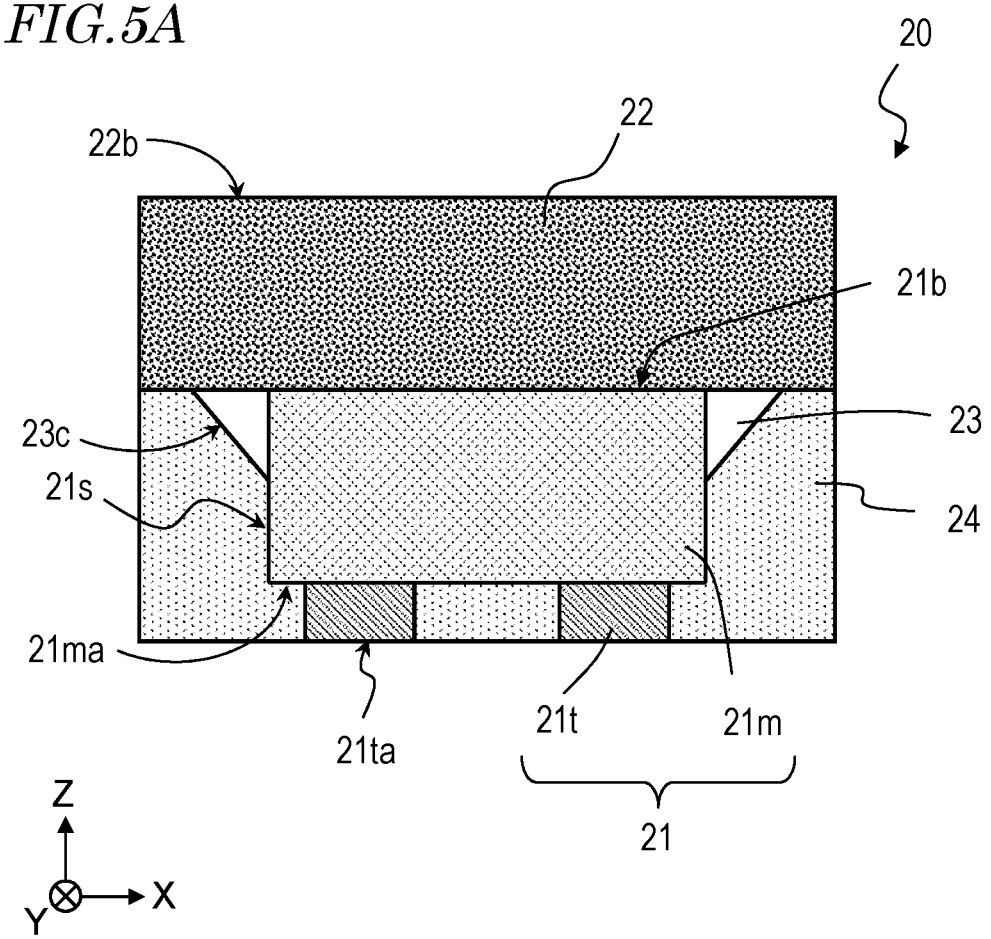

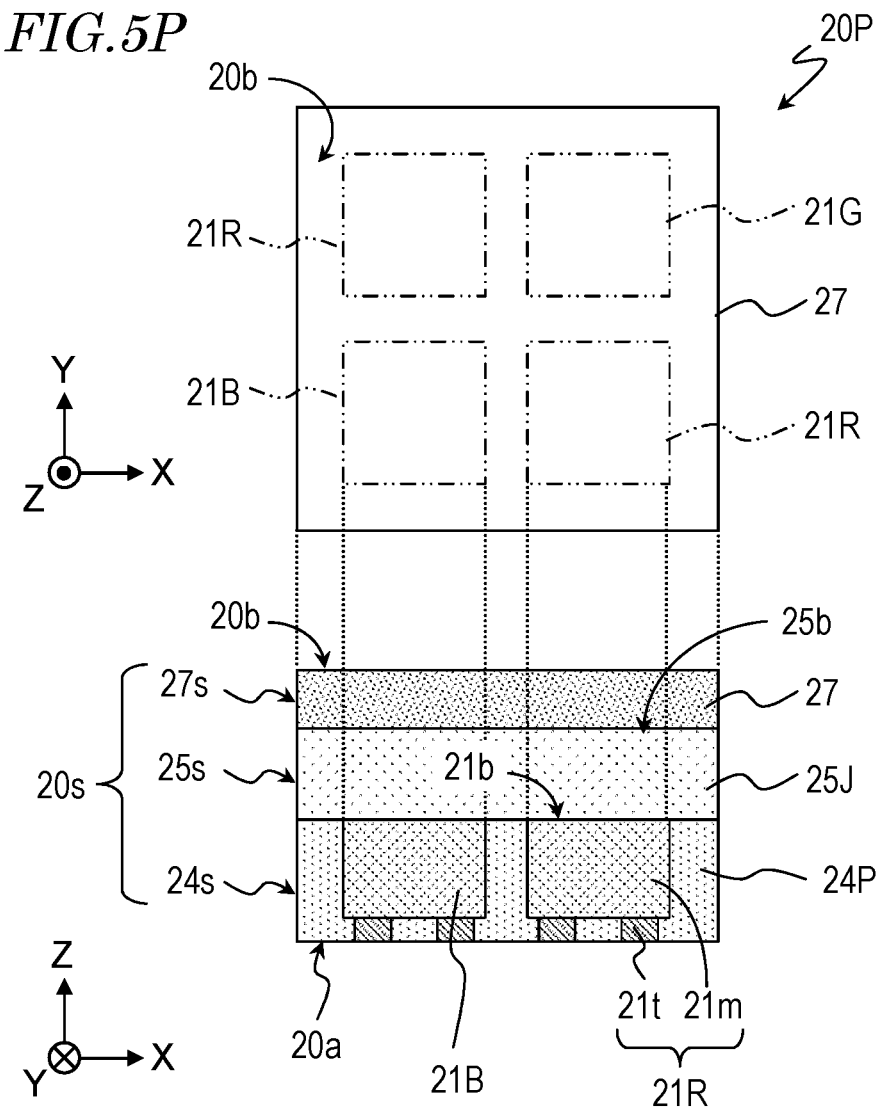

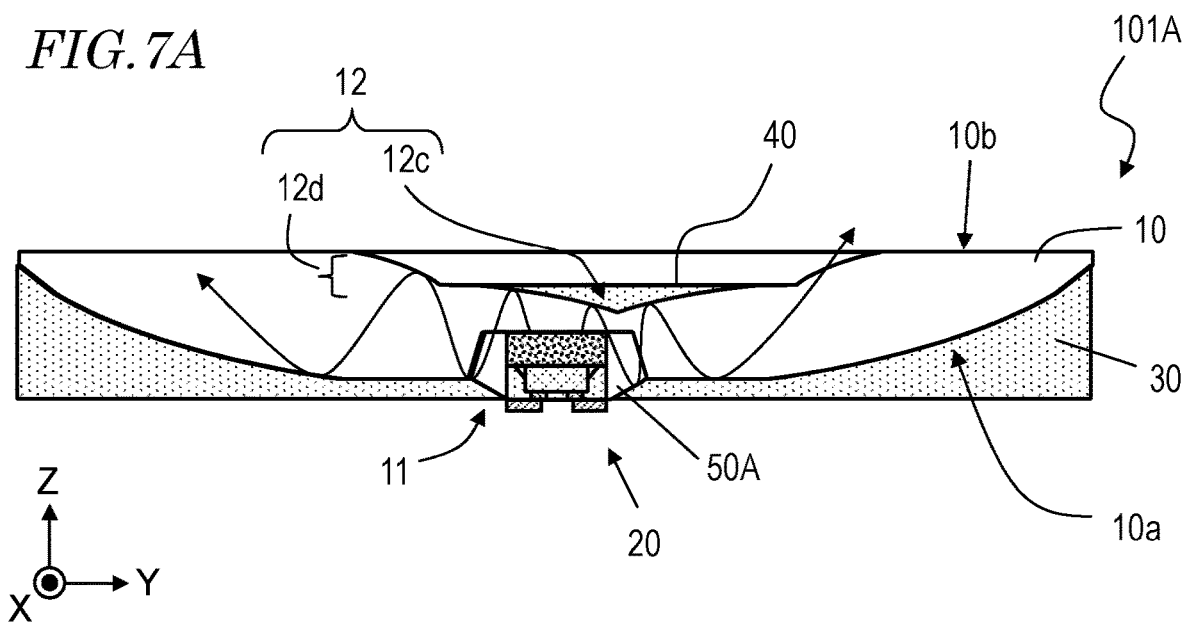
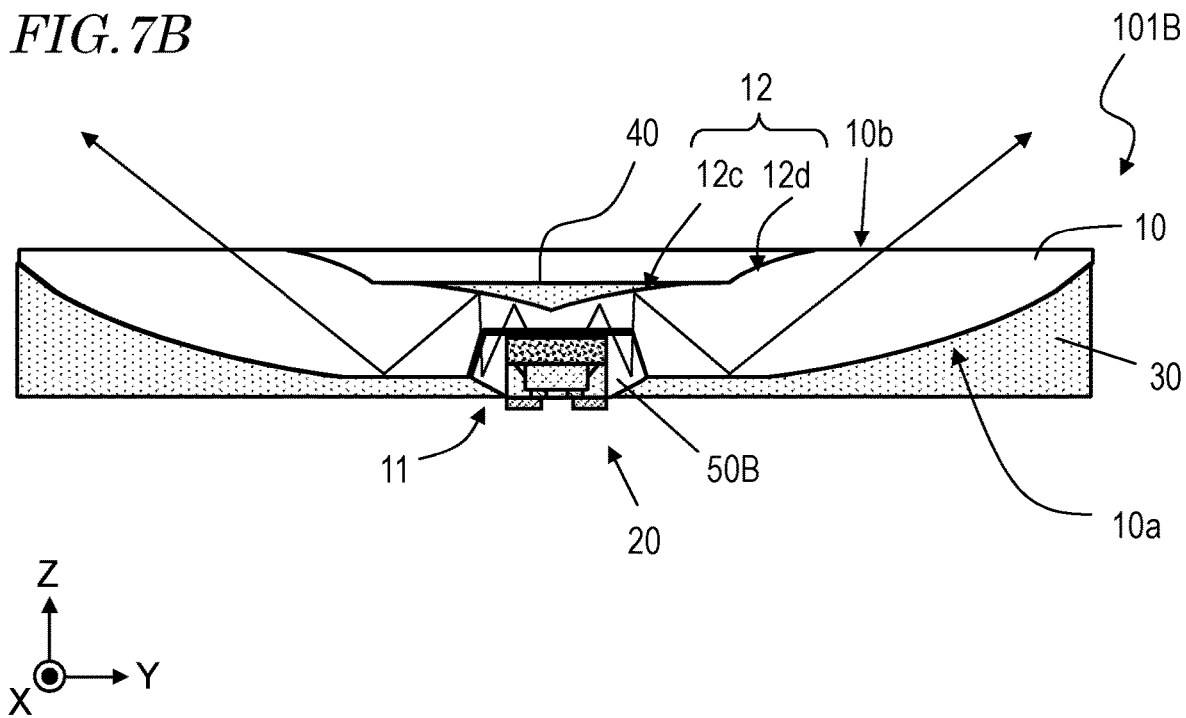

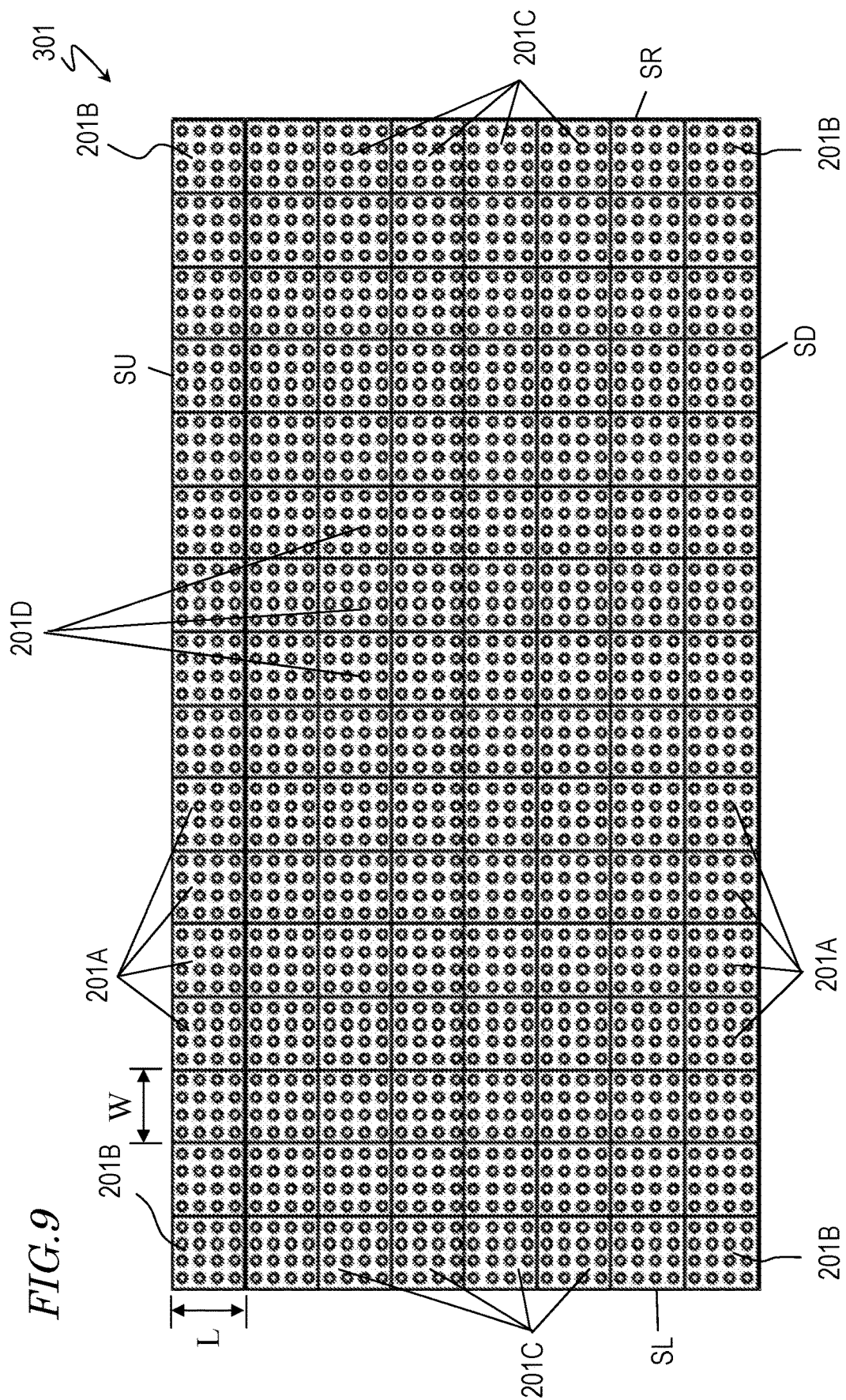

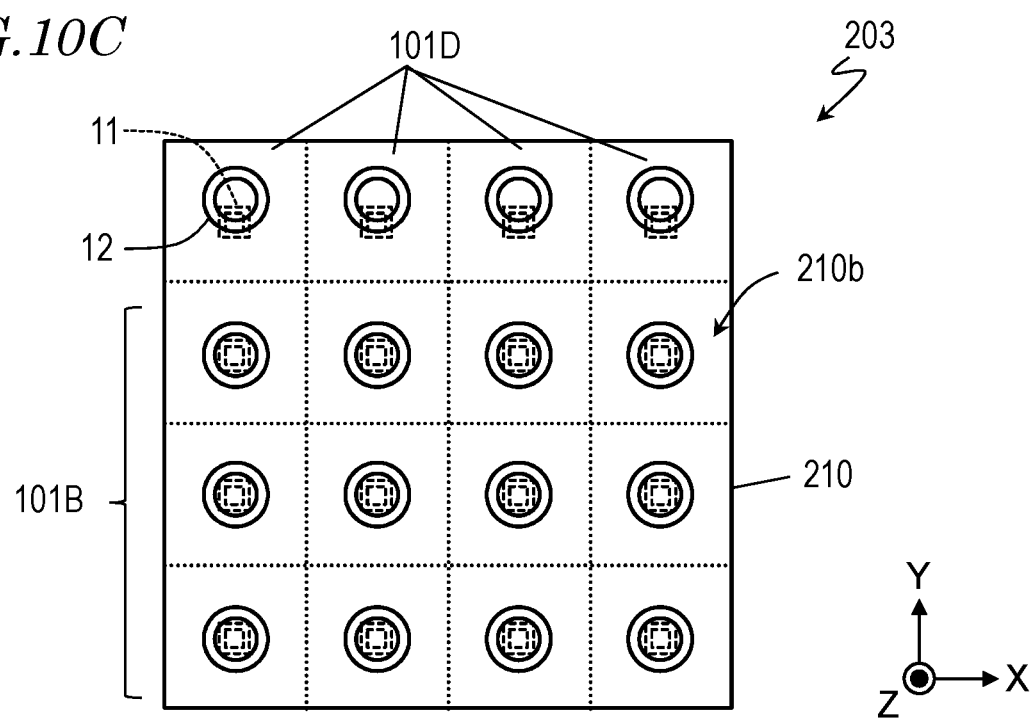

LIGHT-EMITTING MODULE HAVING ARRAY OF LIGHT SOURCES, SOME ALIGNED AND OTHERS OFFSET WITH ARRAY OF LENSE STRUCTURES

CROSS REFERENCE TO RELATED APPLICATIONS

This application claims priority to Japanese Patent Application No. 2019-174488, filed on Sep. 25, 2019, and Japanese Patent Application No. 2020-123726, filed on Jul. 20, 2020, the disclosures of which are hereby incorporated by reference in their entireties.

BACKGROUND

The present disclosure relates to a light-emitting module.

A light-emitting device which includes a light-emitting element, such as a light-emitting diode, has been widely used as a backlight for a liquid crystal display device or the like. Particularly, a direct-lit backlight is used for improving the luminance of the display or for improving the contrast of images by partial driving such as local dimming.

In some uses, it is required to reduce the thickness of a display which includes a direct-lit backlight as much as possible. Therefore, in some cases, it is also required to reduce the thickness of the direct-lit backlight as much as possible. For example, Japanese Patent Publication No. 2018-133304 discloses a light-emitting module which includes a structure for diffusing light throughout a light-transmitting plate member and in which light-emitting elements are bonded to the light-transmitting plate member. This configuration can realize a thin light-emitting module.

SUMMARY

In a light-emitting module in which light-emitting elements are bonded to a light-transmitting plate member, it is required, in some cases, to partially adjust the light distribution characteristic of the light emission surface. The present disclosure provides a light-emitting module which is capable of partially adjusting the light distribution characteristic of the light emission surface.

A light-emitting module of an embodiment of the present disclosure includes: a light-transmitting plate member having a first main surface and a second main surface opposite to the first main surface, the light-transmitting plate member including a plurality of unit regions arrayed one-dimensionally or two-dimensionally, the plurality of unit regions including at least one first unit region and a plurality of second unit regions;
a plurality of lens structures provided in the second main surface of the light-transmitting plate member, each of the plurality of lens structures corresponding to respective one of the plurality of unit regions;
and a plurality of light sources provided at the first main surface of the light-transmitting plate member, each of the light sources corresponding to respective one of the plurality of unit regions, wherein in the plurality of second unit regions, an optical axis of the lens structure and an optical axis of the light source are coincident with each other in a plan view, and in the at least one first unit region, an optical axis of the lens structure is offset from an optical axis of the light source in the plan view.

According to the present disclosure, a light-emitting module is provided which is capable of partially adjusting the light distribution characteristic of the light emission surface.

BRIEF DESCRIPTION OF THE DRAWINGS

FIG. 5A is a schematic cross-sectional view of a light source 20 of the light-emitting module shown in FIG. 1A.

FIG. 5P shows still another example of the configuration of a light source which is applicable to a light-emitting unit.

FIG. 7A is a diagram illustrating the light distribution characteristic of the first light-emitting unit of the light-emitting module shown in FIG. 1A.

FIG. 7B is a diagram illustrating the light distribution characteristic of the second light-emitting unit of the light-emitting module shown in FIG. 1A.

FIG. 9 is a schematic top view showing an example of a backlight of the first embodiment.

FIG. 10C is a schematic top view of another exemplary light-emitting module of the second embodiment of the present disclosure.

DETAILED DESCRIPTION

Figure 1A:
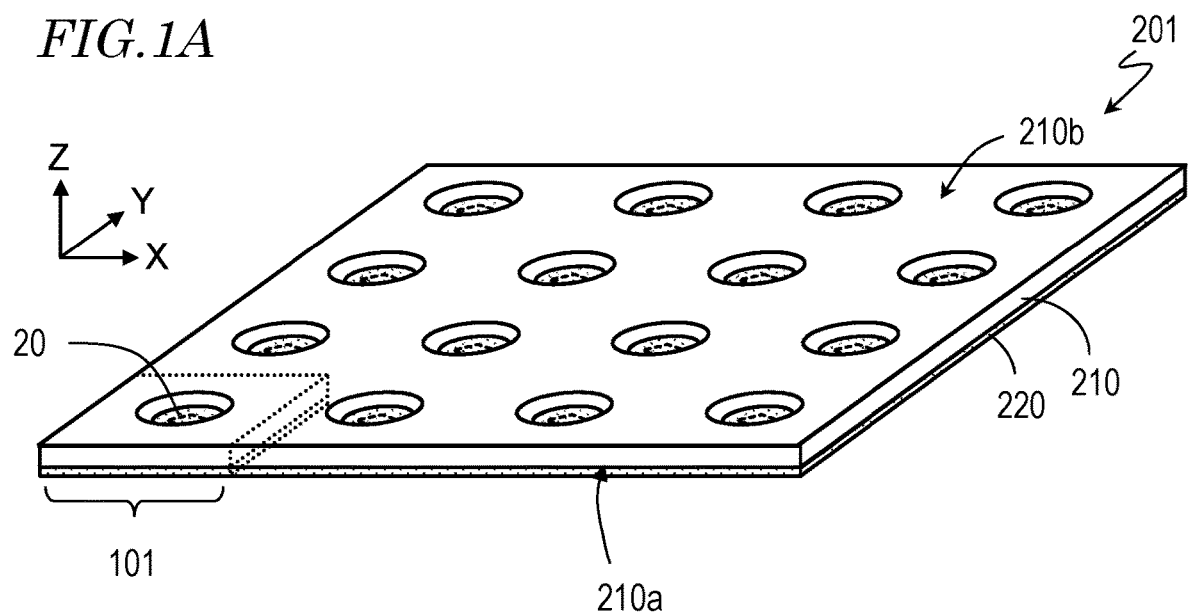
FIG. 1A is a schematic perspective view showing the first embodiment of a light-emitting module according to the present disclosure.

When a light-emitting unit in which light-emitting elements are bonded to a light-transmitting plate member, such as disclosed in Japanese Patent Publication No. 2018-133304, is used as a direct-lit backlight of a display, for example, it is possible to use a single light-emitting unit corresponding to the screen size of the display. In this case, it is necessary to array a large number of light-emitting elements over the single light-transmitting plate member corresponding to the screen size and bond the arrayed light-emitting elements to the light-transmitting plate member. Therefore, for example, if at least one of the light-emitting elements bonded to the single light-transmitting plate member is inoperative, or if the light-emitting elements are not arrayed at appropriate positions, the light-emitting unit as a whole can be defective, and the production yield can decrease.

To avoid such decrease in production yield, one possible solution is to divide the screen of the display into a plurality of regions, produce a plurality of light-emitting units which have a size corresponding to the divided regions, and arrange the plurality of light-emitting units. For example, firstly, a plurality of light-emitting elements are arrayed over a rectangular light-transmitting plate member of several centimeters on each side and bonded to the light-transmitting plate member, whereby a small-size light-emitting unit is produced. Thereafter, a plurality of small-size light-emitting units are two-dimensionally arrayed, so that a resultant array as a whole can be used as a backlight corresponding to a large screen.

The number of light-emitting elements bonded to this small-size light-emitting unit is smaller than the number of light-emitting elements in a case where light-emitting elements are arrayed over and bonded to a light-transmitting plate member whose size is equal to the entire screen and, therefore, the production yield can be increased. Also, by varying the number of small-size light-emitting units to be arrayed, it can be adapted to screens of displays of various sizes. The production cost can be reduced as compared with a case where a light-emitting unit is provided which includes a light-transmitting plate member whose size corresponds to the size of the screen.

Since it is easy to adapt it to displays of various sizes, such a light-emitting module can be used for various uses, such as displaying of movies, displaying of information in various devices and vehicles, e.g., automobiles, etc. In this case, in some uses, it is expected that the light-emitting module can be adapted to a broader variety of uses or can provide new modes of use which are different from traditional ones so long as the light distribution characteristic can be partially adjusted at the light emission surface of the light-emitting module.

In view of the foregoing circumstances, the present disclosure provides a novel light-emitting unit. Embodiments of the present disclosure will now be described in detail with reference to the drawings. The following embodiments are illustrative, and the light-emitting module of the present disclosure is not limited thereto. For example, the numerical values, shapes, materials, steps, and the order of steps, etc., to be shown in the following embodiments are merely examples, and various modifications can be made thereto so long as they do not lead to technical contradictions. The embodiments described below are merely illustrative, and various combinations are possible so long as they do not lead to technical contradictions.

The size, the shape, etc., of the components shown in the figures may be exaggerated for the ease of understanding, and they may not represent the size and the shape of the components, the size relationship therebetween in an actual light-emitting module. Some components may be omitted in order to prevent the figures from becoming excessively complicated.

In the following description, components of like functions may be denoted by like reference signs and may not be described redundantly. Terms indicating specific directions and positions (e.g., "upper", "lower", "right", "left", and other terms including such terms) may be used in the following description. Note however that these terms are used merely for the ease of understanding relative directions or positions in the figure being referred to. The arrangement of components in figures from documents other than the present disclosure, actual products, actual manufacturing apparatuses, etc., does not need to be equal to that shown in the figure being referred to, as long as it conforms with the directional or positional relationship as indicated by terms such as "upper" and "lower" in the figure being referred to. In the present disclosure, the term "parallel" encompasses cases where two straight lines, sides, planes, etc., are in the range of about 0±5°, unless otherwise specified. In the present disclosure, the term "perpendicular" or "orthogonal" encompasses cases where two straight lines, sides, planes, etc., are in the range of about 90±5°, unless otherwise specified.

First Embodiment (Configuration of Light-Emitting Module 201)

Figure 1B:
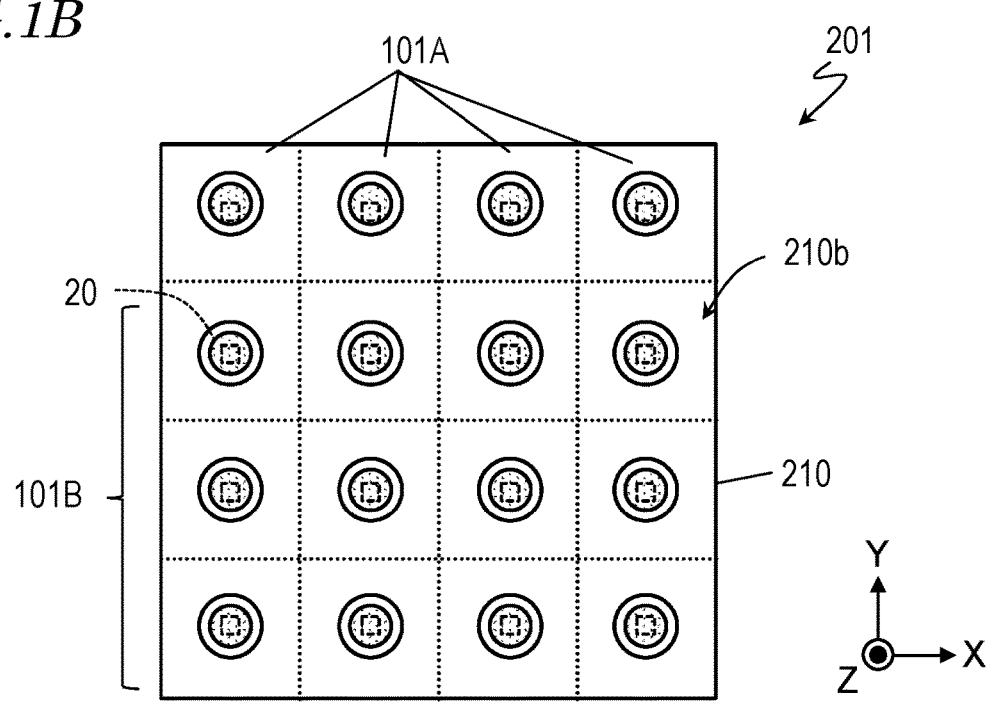
FIG. 1B is a schematic top view of the light-emitting module shown in FIG. 1A.
Figure 1C:
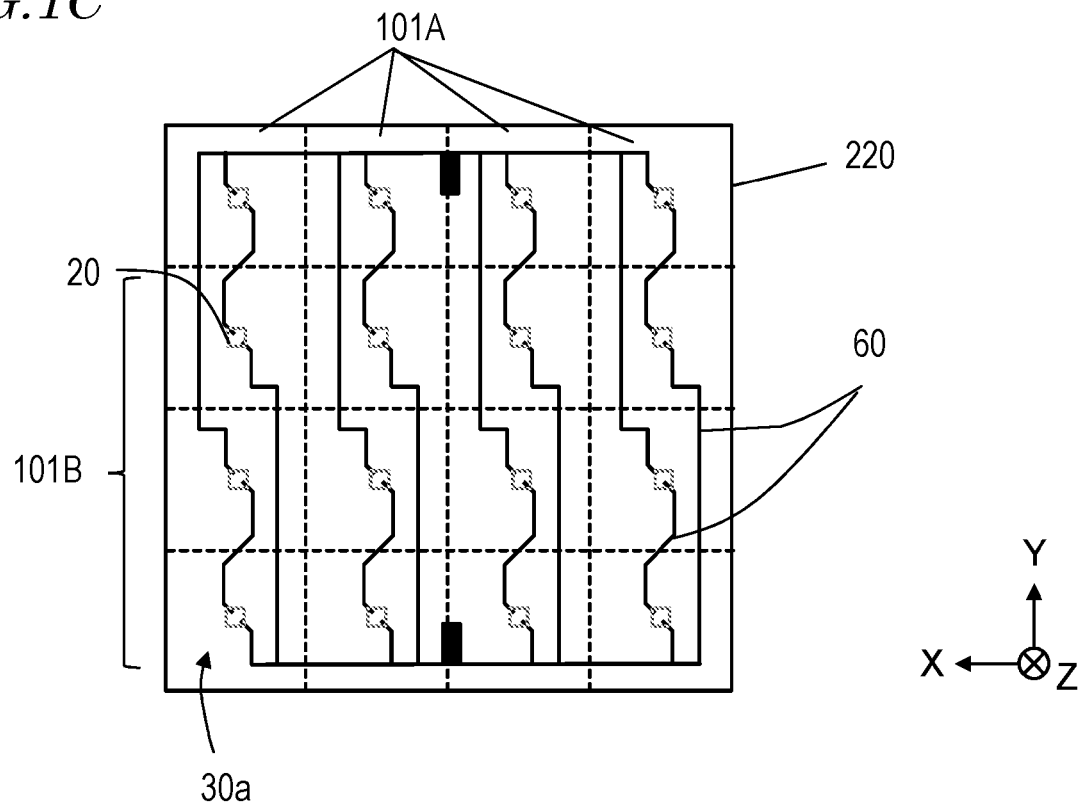
FIG. 1C is a schematic bottom view of the light-emitting module shown in FIG. 1A.

FIG. 1A is a schematic perspective view showing a light-emitting module 201 according to the first embodiment of the light-emitting module of the present disclosure. FIG. 1B and FIG. 1C are a schematic top view and a schematic bottom view of the light-emitting module 201. The light-emitting module 201 as a whole has a plate-like shape. The light-emitting module 201 includes a light-transmitting plate member 210, a plurality of light sources 20, and a light reflecting layer 220. In FIG. 1A, for the sake of convenience in description, arrows indicative of X direction, Y direction and Z direction, which are orthogonal to each other, are also shown. Arrows indicative of these directions may also be shown in other drawings of the present disclosure. X direction and Y direction are also referred to as the first direction and the second direction, respectively.

Figure 2A:
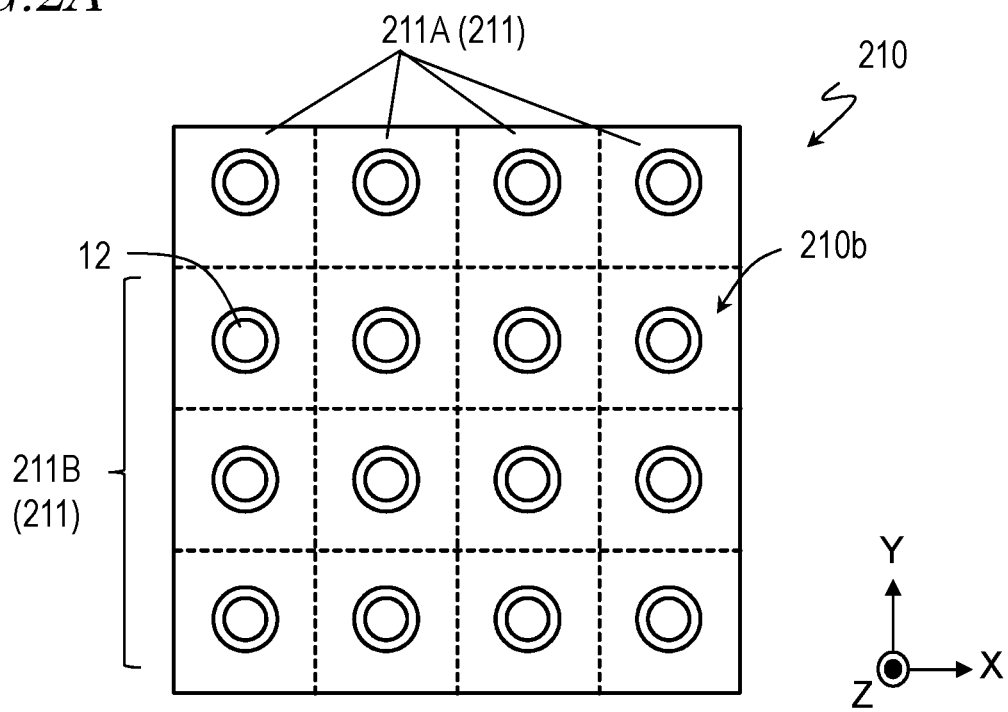
FIG. 2A is a schematic top view of a light-transmitting plate member of the light-emitting module shown in FIG. 1A.
Figure 2B:
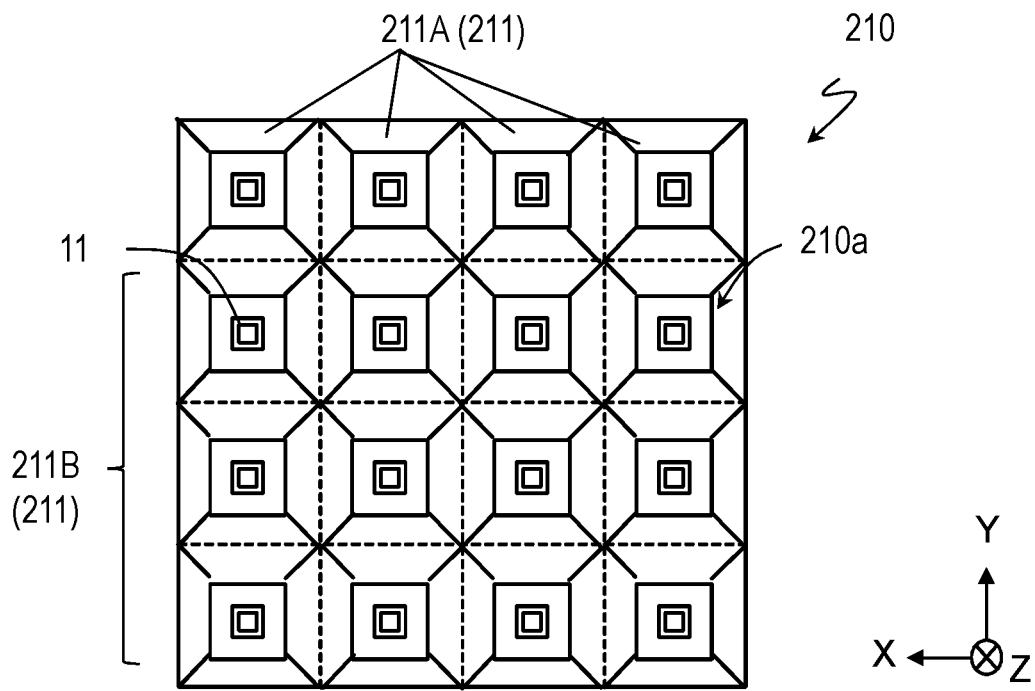
FIG. 2B is a schematic bottom view of the light-transmitting plate member of the light-emitting module shown in FIG. 1A.
Figure 2C:
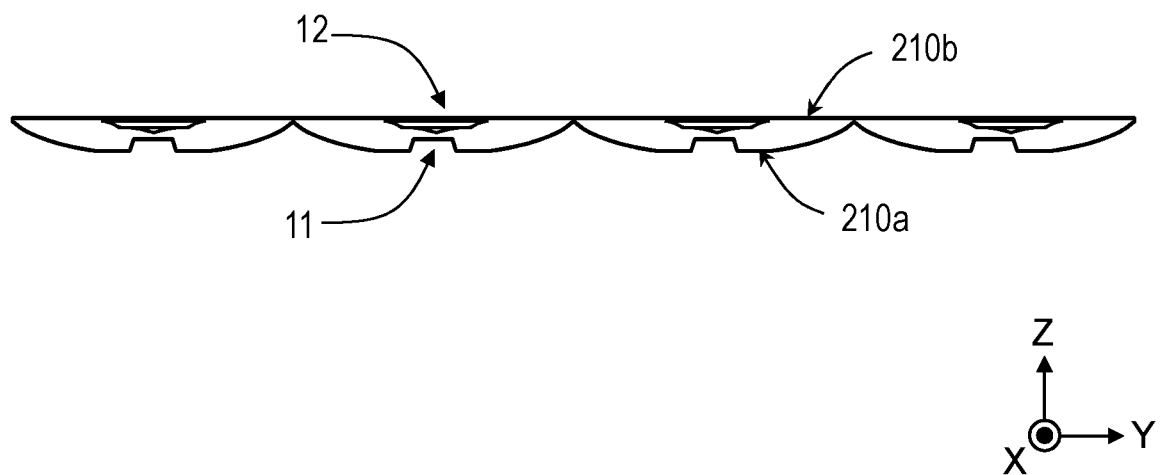
FIG. 2C is a schematic cross-sectional view of the light-transmitting plate member of the light-emitting module shown in FIG. 1A.

FIG. 2A, FIG. 2B and FIG. 2C are, respectively, a schematic top view, a schematic bottom view and a schematic cross-sectional view of the light-transmitting plate member 210. The light-transmitting plate member 210 has a first main surface 210a and a second main surface 210b that is opposite to the first main surface 210a. The light-transmitting plate member 210 has a light guiding structure which allows light emitted from the plurality of light sources 20 respectively provided in a plurality of first recesses 11 in the first main surface 210a to outgo from the second main surface 210b.

The light reflecting layer 220 reflects light emitted from the light sources 20 at the first main surface 210a. The second main surface 210b is the light emission surface of the light-emitting module 201. Typically, the second main surface 210b of the light-transmitting plate member 210 has a rectangular shape. Herein, X direction and Y direction described above respectively coincide with one and the other of mutually orthogonal sides of the rectangular shape of the light-transmitting plate member 210. The length of one side of the rectangular shape of the second main surface 210b is in the range of, for example, not less than 1 cm and not more than 200 cm. In a typical embodiment of the present disclosure, one side of the rectangular shape of the second main surface 210b of the light-transmitting plate member 210 has a length of not less than 10 mm and not more than 30 mm. The longitudinal length and the transverse length of the rectangular shape of the second main surface 210b may be, for example, about 24.3 mm and about 21.5 mm, respectively. Alternatively, the longitudinal length and the transverse length of the rectangular shape of the second main surface 210b may be about 21.7 mm and about 24.0 mm, respectively.

As shown in FIG. 2A and FIG. 2B, the first main surface 210a and the second main surface 210b of the light-transmitting plate member 210 are divided into a plurality of unit regions 211 which are one-dimensionally or two-dimensionally arrayed. Each of the unit regions 211 forms a light-emitting unit 101 (see FIG. 1A). In this example, the light-transmitting plate member 210 includes 16 unit regions 211 which are two-dimensionally arrayed. The 16 unit regions 211 are arrayed in 4 rows and 4 columns. The number and arrangement of unit regions 211 included in the light-transmitting plate member 210, i.e., the number and arrangement of light-emitting units 101 included in the light-emitting module 201, are arbitrary and not limited to the configuration shown in FIG. 1A, FIG. 1B and FIG. 1C.

The plurality of light-emitting units 101 include at least one first light-emitting unit 101A. In the example shown in FIG. 1B and FIG. 1C, the plurality of light-emitting units 101 include four first light-emitting units 101A. The plurality of light-emitting units 101 further include a plurality of second light-emitting units 101B. In the configuration illustrated in FIG. 1B and FIG. 1C, the plurality of light-emitting units 101 include 12 second light-emitting units 101B. These second light-emitting units 101B are arrayed in 3 rows and 4 columns. Therefore, herein, as shown in FIG. 2A and FIG. 2B, the plurality of unit regions 211 include 4 first unit regions 211A and 12 second unit regions 211B. Of the plurality of unit regions 211, the first unit regions 211A correspond to the first light-emitting units 101A, and the second unit regions 211B correspond to the second light-emitting units 101B.

In the present embodiment, the second main surface 210b of the light-transmitting plate member 210 includes a lens structure for adjusting the distribution of light outgoing from the second main surface 210b. As shown in FIG. 2A and FIG. 2C, a plurality of lens structures are provided on the second main surface 210b side of the light-transmitting plate member 210. The plurality of lens structures correspond to the plurality of unit regions 211 of the light-transmitting plate member 210. Herein, each of the plurality of lens structures that correspond to the plurality of unit regions 211 is a second recess 12 provided in the second main surface 210b. As shown in FIG. 2A, the second recess 12 corresponds to one of the plurality of unit regions 211. In other words, in this example, each of the plurality of light-emitting units 101 includes a single lens structure.

Figure 3A:
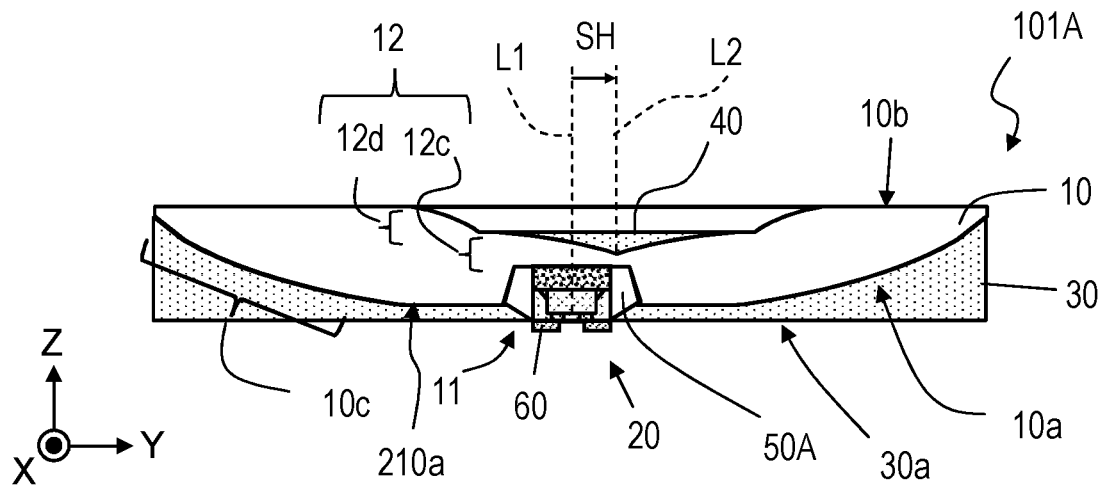
FIG. 3A is a schematic cross-sectional view of a first light-emitting unit of the light-emitting module shown in FIG. 1A.
Figure 3B:
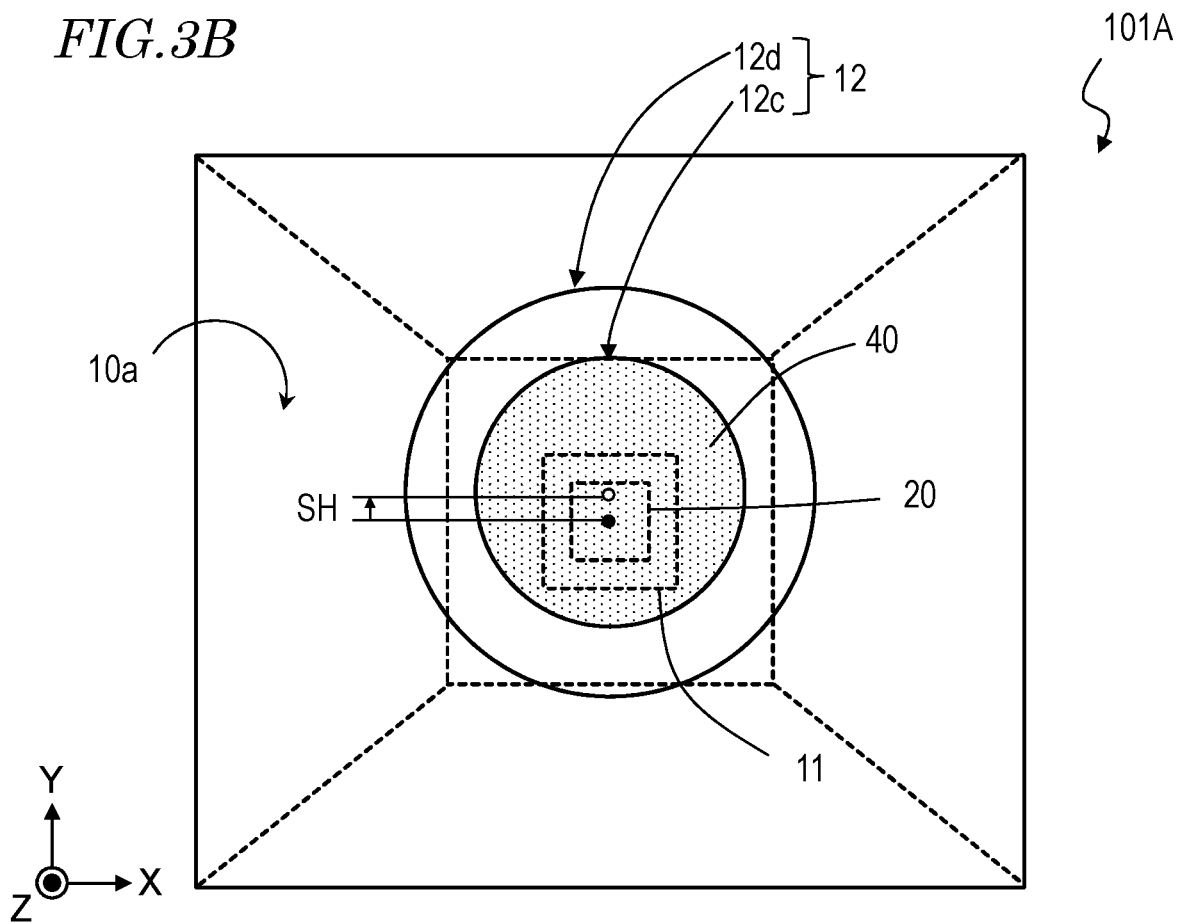
FIG. 3B is a schematic top view of the first light-emitting unit of the light-emitting module shown in FIG. 1A.
Figure 4A:
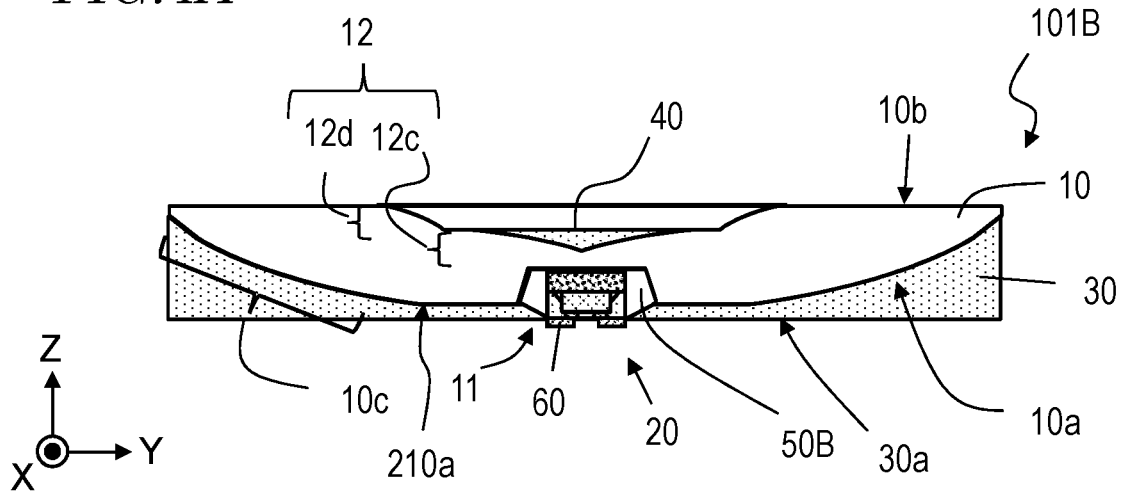
FIG. 4A is a schematic cross-sectional view of a second light-emitting unit of the light-emitting module shown in FIG. 1A.
Figure 4B:
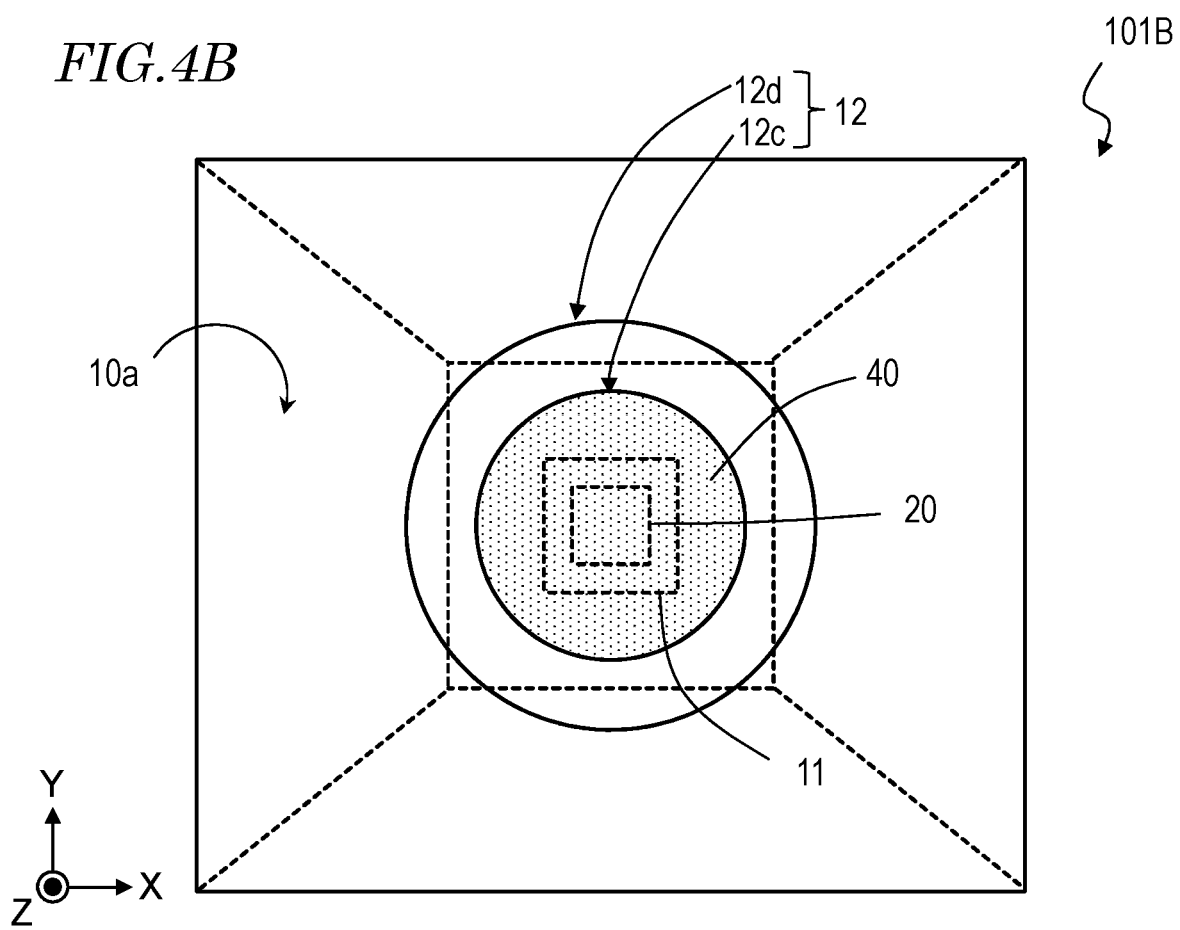
FIG. 4B is a schematic top view of the second light-emitting unit of the light-emitting module shown in FIG. 1A.

FIG. 3A and FIG. 3B are, respectively, a schematic cross-sectional view and a schematic top view of a first light-emitting unit 101A. FIG. 4A and FIG. 4B are, respectively, a schematic cross-sectional view and a schematic top view of a second light-emitting unit 101B. As will be described below in detail, between the first light-emitting unit 101A and the second light-emitting unit 101B, the arrangement of one of the optical axis of the lens structure and the optical axis of the light source 20 relative to the other optical axis is different. In the second light-emitting unit 101B, the optical axis of the light source 20 provided on the first main surface 210a side of the light-transmitting plate member 210 is generally coincident with the optical axis of the lens structure provided on the second main surface 210b side. In contrast, in the first light-emitting unit 101A, the optical axis of the lens structure is not coincident with the optical axis of the light source 20. In the example shown in FIG. 3A and FIG. 3B, the optical axis L1 of the lens structure is offset from the position of the optical axis L2 of the light source 20 (dot in FIG. 3B) in +Y direction in the drawings as represented by arrow SH in the drawings. In this case, the first light-emitting unit 101A and the second light-emitting unit 101B can realize different light distribution characteristics.

Hereinafter, the configuration of the first light-emitting unit 101A and the second light-emitting unit 101B is described in detail. In the following section, the first light-emitting unit 101A and the second light-emitting unit 101B are sometimes generically referred to as "light-emitting units 101". Also, light-transmitting members 50A, 50B are sometimes generically referred to as "light-transmitting members 50".

The light-emitting unit 101 includes a unit light-transmitting plate member 10, a light source 20 and a light-transmitting member 50. The light-emitting unit 101 may further include a light reflecting layer 30, a light-reflective member 40 and an interconnect layer 60.

Light-Transmitting Plate Member 10

The unit light-transmitting plate member 10 is a portion of the light-transmitting plate member 210 shown in FIG. 1A corresponding to each of the unit regions 211. The unit light-transmitting plate member 10 supports the light source 20. The unit light-transmitting plate member 10 has such a light guiding structure that light emitted from the light source 20 outgoes from one surface of the unit light-transmitting plate member 10 as uniformly as possible. Specifically, the unit light-transmitting plate member 10 has a first main surface 10a and a second main surface 10b that is opposite to the first main surface 10a. The first main surface 10a has a first recess 11. The first recess 11 has the shape of, for example, a truncated square pyramid of which the top surface is smaller than the base surface. The top surface is located at the bottom of the first recess 11. In the present embodiment, the truncated square pyramid shape is arranged such that the four sides of the top surface and the base surface are generally parallel with the four sides of the unit region 211. However, the truncated square pyramid shape may be arranged such that the diagonals of the top surface and the base surface are generally parallel with the four sides of the unit region 211. In the first recess 11, the light source 20 is provided.

The first main surface 10a of the unit light-transmitting plate member 10 may have a curved surface portion 10c for reflecting light traveling toward the first main surface 10a. The curved surface portion 10c is provided in, for example, a peripheral region of each of the unit regions 211 of the first main surface 10a. Since the light reflecting layer 30 is provided on the first main surface 10a, light impinging on the first main surface 10a at a large angle is totally reflected at the curved surface portion 10c toward the second main surface 10b side, so that the light extraction efficiency is improved.

The unit light-transmitting plate member 10 has a lens structure for adjusting the distribution of light outgoing from the second main surface 10b. The lens structure may be a second recess 12 provided in the second main surface 10b. The second recess 12 includes, for example, a first portion 12c which has a conical shape and a second portion 12d which has a truncated conical shape. The apex of the conical shape is located at the inner side of the unit light-transmitting plate member 10. The top surface of the truncated conical shape of the second portion 12d is in contact with the base surface of the conical shape of the first portion 12c. In this case, as seen from FIG. 3A, the optical axis L2 of the lens structure is coincident with the perpendicular extending from the apex to base of the conical shape of the first portion 12c. When the first light-emitting unit 101A is considered, the center of the second recess 12 in plan view, i.e., as viewed from the second main surface 10b or the first main surface 10a, is offset from the center of the first recess 11 in +Y direction as shown in FIG. 3B. Meanwhile, in the second light-emitting unit 101B, it is preferred that the center of the second recess 12 is coincident with the center of the first recess 11 in plan view.

Figure 3C:
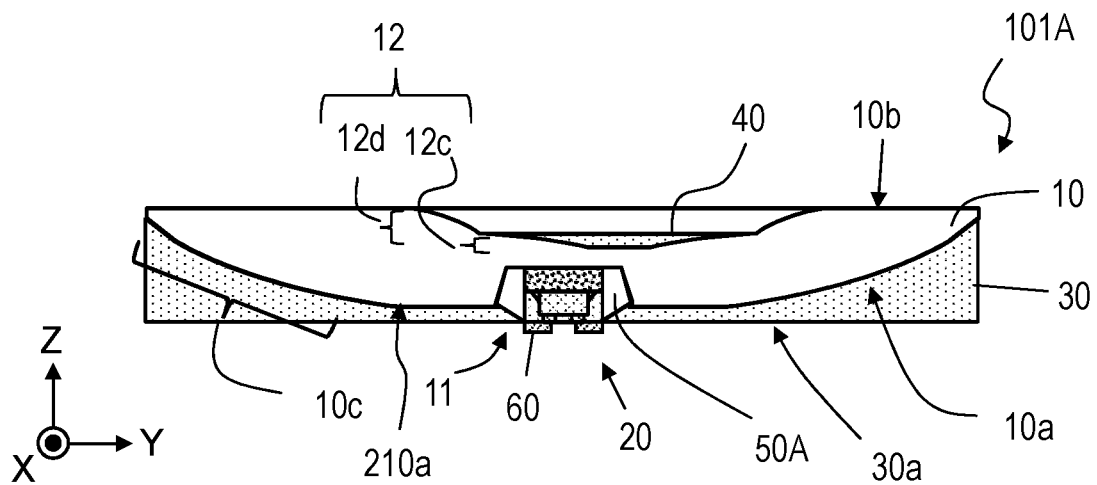
FIG. 3C is a schematic cross-sectional view of the first light-emitting unit of the light-emitting module shown in FIG. 1A, and shows another form of the light-transmitting plate member.

The lens structure of the unit light-transmitting plate member 10 is not limited to the above-described example but may have any other shape. For example, as shown in FIG. 3C, the second recess 12, which is the lens structure of the unit light-transmitting plate member 10, may include a first portion 12c which has a truncated conical shape and a second portion 12d which has a truncated conical shape.

The lens structure controls the direction of outgoing light by taking advantage of refraction at the boundary between the inner lateral surface and bottom surface of the second recess 12 and the external environment. In the present embodiment, the light-reflective member 40 is provided in the first portion 12c of the second recess 12.

The unit light-transmitting plate member 10 may be made of a thermoplastic resin such as acrylic, polycarbonate, cyclic polyolefin, polyethylene terephthalate and polyester, a thermosetting resin such as epoxy and silicone, or a light-transmitting material such as glass. For example, a light-transmitting plate member 210, which is realized by two-dimensionally combining together a plurality of unit light-transmitting plate members 10, may be formed by injection molding or the like using a die which has a shape corresponding to the first recess 11, the curved surface portion 10c and the second recess 12. According to a molding method with the use of a die which has protrusions corresponding to the first recess 11 and the second recess 12 in the inner surface of the cavity, the relationship in position between the center of the first recess 11 and the center of the second recess 12 can be relatively easily changed, for example, in each of the light-emitting units 101. For example, in the second light-emitting unit 101B, the center of the first recess 11 and the center of the second recess 12 are coincident in plan view. Meanwhile, in the first light-emitting unit 101A, the second recess 12 is provided in the unit light-transmitting plate member 10 with the position of the center of the second recess 12 being offset in +Y direction relative to the position of the center of the first recess 11 such that the center of the first recess 11 and the center of the second recess 12 are not coincident in plan view.

Light-Reflective Member 40

When the unit light-transmitting plate member 10 has the second recess 12, the light-reflective member 40 may be provided inside the second recess 12. Herein, the light-reflective member 40 is provided in the first portion 12c of the second recess 12. Since the light-reflective member 40 is provided above the light source 20, the light-reflective member 40 can reflect part of light emitted from the light source toward the first main surface 10a side.

In the configuration illustrated in FIG. 3A and FIG. 4A, the first portion 12c has a conical shape and, therefore, light reflected at the interface between the unit light-transmitting plate member 10 and the light-reflective member 40 travels to the first main surface 10a side while the light is diffused through a broader extent in the unit light-transmitting plate member 10. Thus, light from the light source 20 can be more efficiently diffused throughout the plane of the unit light-transmitting plate member 10. Further, by providing the light-reflective member 40 in the second recess 12 such that at least part of the light-reflective member 40 opposes the light source 20, the luminance immediately above the light source 20 in the second main surface 10b of the unit light-transmitting plate member 10 can be prevented from being extremely high as compared with the other regions. Further, by selectively providing the light-reflective member 40 inside the first portion 12c of the second recess 12, the luminance immediately above the light source 20 can be prevented from being excessively decreasing. As a result, more uniform light can be achieved while the total thickness of the light-emitting unit 101 is reduced.

The light-reflective member 40 may be made of a light-reflective material, such as a resin material in which, for example, a light-reflective filler is dispersed. Herein, in this specification, the terms "reflective" and "light-reflective" refer to a circumstance where the reflectance at the emission peak wavelength of the light source 20 is not less than 60%. The reflectance of the light-reflective member 40 at the emission peak wavelength of the light source 20 is more beneficially not less than 70%, still more beneficially not less than 80%.

The base material used for forming the light-reflective member 40 may be a silicone resin, a phenolic resin, an epoxy resin, a BT resin, a polyphthalamide (PPA), etc. The light-reflective filler used may be metal particles, or particles of an inorganic or organic material which has a higher refractive index than the base material. Examples of the light-reflective filler include particles of titanium dioxide, silicon oxide, zirconium dioxide, potassium titanate, aluminum oxide, aluminum nitride, boron nitride, mullite, niobium oxide, barium sulfate, or particles of various rare earth oxides such as yttrium oxide and gadolinium oxide. It is beneficial that the light-reflective member 40 is white.

The distribution of the light-reflective filler in the light-reflective member 40 may be generally uniform throughout the light-reflective member 40 or may be nonuniform or gradient. For example, if in the step of forming the light-reflective member 40 the filler sinks or separates from the base material before the base material is cured, the distribution of the light-reflective filler in the light-reflective member 40 can be nonuniform. If the number density of the filler which is defined by the number of the filler per unit area in plan view is relatively high in the vicinity of the center of the light-reflective member 40 as compared with the vicinity of the periphery of the light-reflective member 40, the luminance in a region immediately above the light source 20 can readily be prevented from being locally excessively high and, therefore, this is beneficial.

Light Reflecting Layer 30

The light reflecting layer 30 is a portion of the light reflecting layer 220 shown in FIG. 1A corresponding to each of the unit regions 211. The light reflecting layer 30 covers the first main surface 10a of the unit light-transmitting plate member 10. As shown in FIG. 3A, the light reflecting layer 30 may cover the light-transmitting member 50 that is provided inside the first recess 11. The light reflecting layer 30 may cover the entirety of the light-transmitting member 50. The light reflecting layer 30 may be formed using, for example, a material previously mentioned as the material of the light-reflective member 40. Since the light reflecting layer 30 covers the first main surface 10a, light impinging on the first main surface 10a of the unit light-transmitting plate member 10 can be reflected to the second main surface 10b side.

Interconnect Layer 60

The interconnect layer 60 is located on the first main surface 30a of the light reflecting layer 30, which is identical with the lower surface of the light-emitting unit 101, and is electrically coupled with the light source 20. As shown in FIG. 1C, the interconnect layer 60 electrically couples the light source 20 of each of the light-emitting units 101 at the first main surface 30a of the light reflecting layer 30 of the light-emitting module 201. The circuit formed by the interconnect layer 60 is determined according to the driving method of the light-emitting units 101 of the light-emitting module 201. For example, when the light-emitting units 101 of the light-emitting module 201 are driven at the same timing, 8 serial circuits, which are formed by connecting in series every two of the light sources 20 of the light-emitting unit 101 which are arrayed in 4 rows and 4 columns, may be connected in parallel. Alternatively, a circuit may be configured such that the light sources 20 of the light-emitting unit 101, which are arrayed in 4 rows and 4 columns, are divided into two or more groups, such that the light-emitting units 101 can be driven on a group-by-group basis. The interconnect layer 60 may be, typically, a single-layer or multilayer film which is made of a metal such as Cu.

Light Source 20

FIG. 5A is a schematic cross-sectional view of the light source 20. In the configuration illustrated in FIG. 3A, FIG. 3B, FIG. 3C, FIG. 4A and FIG. 4B, the light source 20 is provided in the first recess 11 of the unit light-transmitting plate member 10. The light source 20 includes a light-emitting element 21, a wavelength conversion member 22, a bonding member 23 and a light-reflective member 24.

A typical example of the light-emitting element 21 is an LED. For example, the light-emitting element 21 includes a main body 21*m*. The main body 21*m* includes a support substrate of sapphire or gallium nitride, etc., and a semiconductor layered structure on the support substrate. The semiconductor layered structure includes an n-type semiconductor layer, a p-type semiconductor layer, and an active layer interposed between these semiconductor layers. The semiconductor layered structure may include a nitride semiconductor ($In_xAl_yGa_{1-x-y}N$, $0 \leq x$, $0 \leq y$, $x+y \leq 1$) capable of emitting light in the ultraviolet to visible range. The light-emitting element 21 further includes electrodes 21*t* electrically coupled with the n-type semiconductor layer and the p-type semiconductor layer.

The light-emitting element 21 may be an element that emits blue light or may be an element that emits white light. The light-emitting elements 21 of the plurality of light-emitting units 101 may include elements that emit light of different colors from each other. For example, the light-emitting elements 21 of the plurality of light-emitting units 101 may include elements that emit red light, elements that emit blue light, and elements that emit green light. In the present embodiment, an LED that emits blue light is shown as an example of the light-emitting elements 21.

The light-emitting element 21 typically has a rectangular shape in plan view. The lengths of the sides of the rectangular shape of the light-emitting element 21 are, for example, 1000 μm or less. The lengthwise and widthwise dimensions of the rectangular shape of the light-emitting element 21 may be 500 μm or less. Light-emitting elements whose lengthwise and widthwise dimensions are 500 μm or less are available at low cost. Alternatively, the lengthwise and widthwise dimensions of the rectangular shape of the light-emitting element 21 may be 200 μm or less. In the case where the light-emitting element 21 is applied to a backlight unit of a liquid-crystal display device, if the lengths of the sides of the rectangular shape of the light-emitting element 21 are small, the light-emitting element 21 is advantageous to representation of high-definition images, local dimming, etc. In particular, in the case of a light-emitting element whose lengthwise and widthwise dimensions are both 250 μm or less, the area of the upper surface is small, and therefore, the amount of light emitted from the lateral surface of the light-emitting element relatively increases. Therefore, it is easy to obtain batwing light distribution characteristics. As used herein, the term "batwing light distribution characteristics" refers, in a broad sense, to light distribution characteristics that are defined as an emission intensity distribution in which the emission intensity is higher at light distribution angles whose absolute values are greater than zero, compared to the emission intensity at a light distribution angle of 0°, where the optical axis that is perpendicular to the upper surface of the light-emitting element has a light distribution angle of 0°.

The wavelength conversion member 22 is provided on or above the light emission surface 21*b* of the light-emitting element 21. The wavelength conversion member 22 absorbs at least part of light emitted from the light-emitting element 21 and emits light at a wavelength different from the wavelength of the light from the light-emitting element 21. For example, the wavelength conversion member 22 converts the wavelength of part of blue light from the light-emitting element 21 and emits yellow light. With such a configuration, blue light which has passed through the wavelength conversion member 22 and yellow light emitted from the wavelength conversion member 22 are mixed together, resulting in white light. The light emitted from the light-emitting element 21 is basically guided into the unit light-transmitting plate member 10 via the wavelength conversion member 22. Therefore, the color-mixed light is diffused inside the unit light-transmitting plate member 10 and, for example, white light with suppressed unevenness in luminance can be extracted from the second main surface 10*b* of the unit light-transmitting plate member 10. In this point, using the light source 20 of the present embodiment is advantageous in achieving uniform light as compared with a case where light is first diffused in the light-transmitting plate member and then the wavelength thereof is converted.

The wavelength conversion member 22 is, typically, a member in which phosphor particles are dispersed in a resin. Examples of the resin in which the phosphor particles are to be dispersed include silicone resins, modified silicone resins, epoxy resins, modified epoxy resins, urea resins, phenolic resins, acrylic resins, urethane resins, fluoric resins, and a material containing two or more of these resins. From the viewpoint of efficiently guiding light into the unit light-transmitting plate member 10, it is beneficial that the base material of the wavelength conversion member 22 has a lower refractive index than the material of the unit light-transmitting plate member 10. A material which has a different refractive index from that of the base material may be dispersed in the material of the wavelength conversion member 22 such that the wavelength conversion member 22 can have a light diffusion function. For example, particles of titanium dioxide, silicon oxide, or the like, may be dispersed in the base material of the wavelength conversion member 22.

The phosphor may comprise a known material. Examples of the phosphor include fluoride-based phosphors such as KSF-based phosphors, nitride-based phosphors such as CASN, YAG-based phosphors, and β-SiAlON phosphors. The YAG-based phosphors are examples of a wavelength conversion substance which is capable of converting blue light to yellow light. The KSF-based phosphors and CASN are examples of a wavelength conversion substance which is capable of converting blue light to red light. The β-SiAlON phosphors are examples of a wavelength conversion substance which is capable of converting blue light to green light. The phosphor may be a quantum dot phosphor.

It is not essential that the phosphor contained in the wavelength conversion member 22 is common among the plurality of light-emitting units 101. Among the plurality of light-emitting units 101, the phosphor dispersed in the base material of the wavelength conversion member 22 may differ.

The bonding member 23 is a light-transmitting member that covers at least part of a lateral surface 21*s* of the light-emitting element 21 and part of a surface of the wavelength conversion member 22 which is opposite to the light-emitting element 21. The bonding member 23 bonds together the wavelength conversion member 22 and the light-emitting element 21. Although not shown in FIG. 5A, the bonding member 23 may also be present between the light-emitting element 21 and the wavelength conversion member 22.

The material of the bonding member 23 may be a resin composition which contains a transparent resin material as the base material. The bonding member 23 has a transmittance of, for example, not less than 60% for light which has the emission peak wavelength of the light-emitting element 21. From the viewpoint of effectively using light, the transmittance of the bonding member 23 at the emission peak wavelength of the light-emitting element 21 is beneficially not less than 70%, more beneficially not less than 80%.

A typical example of the base material of the bonding member 23 is a thermosetting resin such as an epoxy resin or a silicone resin. Examples of the base material of the bonding member 23 include a silicone resin, a modified silicone resin, an epoxy resin, a phenol resin, a polycarbonate resin, an acrylic resin, a polymethylpentene resin or a polynorbornene resin, or a material containing two or more of these resins. The bonding member 23 typically has a lower refractive index than the refractive index of the unit light-transmitting plate member 10. In the bonding member 23, for example, a material which has a different refractive index from the base material may be dispersed such that the bonding member 23 has a light diffusion function.

As previously described, the bonding member 23 covers at least part of the lateral surface 21s of the light-emitting element 21. The bonding member 23 has an outer surface 23c which is the interface with the light-reflective member 24 which will be described later. Light emitted from the lateral surface 21s of the light-emitting element 21 so as to be incident on the bonding member 23 is reflected, at the position of the outer surface 23c of the bonding member 23, upward relative to the light-emitting element 21. The cross-sectional shape of the outer surface 23c of the bonding member 23 is not limited to a linear shape such as shown in FIG. 5A but may be a zigzag line, a curve which is convex in a direction toward the light-emitting element 21, or a curve which is convex in a direction away from the light-emitting element 21.

The light-reflective member 24 is capable of reflecting light and is arranged so as to cover the light-emitting element 21 and the bonding member 23. The light-reflective member 24 is also present on a surface of the light-emitting element 21 on which the electrodes 21t are provided. The lower surfaces 21ta of the electrodes 21t are exposed out of the light-reflective member 24.

The material of the light-reflective member 24 may be, for example, similar to the material of the light reflecting layer 30. For example, the material of the light-reflective member 24 and the material of the light reflecting layer 30 may be the same. The lower surface 21ma of the main body 21m, exclusive of the electrodes 21t, is covered with the light-reflective member 24, whereby leakage of light to the first main surface 10a side of the unit light-transmitting plate member 10 can be suppressed.

The light source 20 may be produced, for example, through the following process. First, a plurality of light-emitting elements 21 are two-dimensionally arrayed over and bonded to a sheet-like wavelength conversion member 22 using the bonding member 23. Thereafter, the gaps between the plurality of light-emitting elements 21 are filled with the light-reflective member 24. By cutting the sheet-like wavelength conversion member 22 and the light-reflective member 24 at boundaries between every two adjacent light-emitting elements 21, a plurality of light sources 20 can be efficiently produced.

Herein, the optical axis of the light source 20 refers to an axis which is perpendicular to the light emission surface 21b that is the upper surface of the light-emitting element 21 and which passes through the center of the light emission surface 21b of the light-emitting element 21 in plan view or an axis which is perpendicular to the upper surface of the light source 20 and which passes through the center of the upper surface of the light source 20 in plan view. In the example shown in FIG. 5A, the upper surface 22b of the wavelength conversion member 22 forms the upper surface of the light source 20.

The configuration of the light source applied to the light-emitting units 101 is not limited to the example shown in FIG. 5A. Instead of the above-described light source 20, various configurations are applicable. Hereinafter, other examples of the light source which are applicable to the light-emitting units 101 is described. Each of the light sources illustrated below has a first surface 20a and a second surface 20b which is opposite to the first surface 20a. In each of the examples described in the following sections, the electrodes of the light source are located on the first surface 20a side that serves as the lower surface of the light source. The second surface 20b is the upper surface of the light source.

Figure 5B:
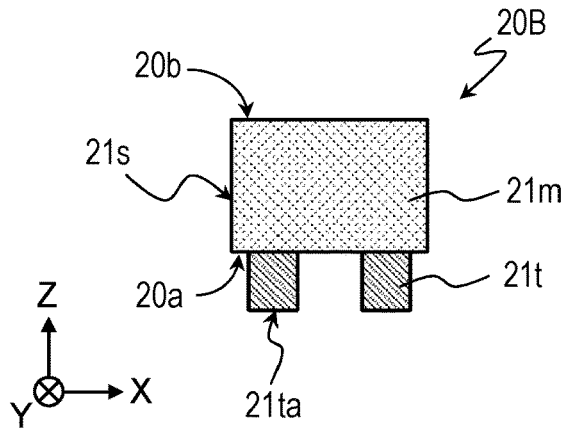
FIG. 5B is a schematic cross-sectional view showing another example of a light source which is applicable to a light-emitting unit of a light-emitting module of an embodiment of the present disclosure.

The light source 20B shown in FIG. 5B is an example realized by applying the above-described light-emitting element 21 to the light source. As previously described with reference to FIG. 5A, the light-emitting element 21 as the light source 20B includes a main body 21m, which includes a semiconductor layered structure, and a pair of electrodes 21t provided on the first surface 20a side that is opposite to the light emission surface 21b (see FIG. 5A). In this example, the lower surface 21ma of the main body 21m (see FIG. 5A) is identical with the first surface 20a of the light source 20B, and the light emission surface 21b of the light-emitting element 21 is identical with the second surface 20b of the light source 20B. In this example, a lateral surface 21s of the light-emitting element 21 forms a lateral surface of the light source 20B.

The emission peak wavelength of the light source 20B is adjustable according to the materials of semiconductor layers included in the semiconductor layered structure and the mixed crystal ratios thereof. For example, a light source which is capable of emitting red light is produced by using GaAs, GaP, InP or the like for the materials of semiconductor layers. The shape of the main body 21m of the light-emitting element 21 is also appropriately selectable according to the use of the light-emitting module 201. For example, the planar shape of the main body 21m may be rectangular such as square, oblong square, or the like. Alternatively, it may be polygonal such as triangular, hexagonal, or the like. The height of the light source 20B may be, for example, 5 μm to 300 μm. The thickness of the electrodes 21t may be, for example, 0.5 μm to 100 μm. The material of the electrodes 21t may be Cu, Au, Ni, or the like.

Likewise as in the example previously described with reference to FIG. 5A, the light source applied to the light-emitting units 101 may include a member which covers the light-emitting element 21 in addition to the light-emitting element 21. The light source 20C shown in FIG. 5C includes a light-emitting element 21 and a light adjusting member 27 located on the light emission surface 21b of the light-emitting element 21. The light adjusting member 27 may be a resin layer that is made of a material which contains, for example, a transparent resin as the base material and which contains a light-reflective filler.

By providing the light adjusting member 27 above the light-emitting element 21, the amount of part of the light extracted from the light source which is emitted in a direction generally normal to the second surface 20b can be adjusted. Thus, for example, at the second main surface 210b of the light-transmitting plate member 210 which serves as the light extraction surface of the light-emitting module 201, the luminance in a region immediately above the light source can be more effectively prevented from being excessively high as compared with the other regions. That is, a light-emitting module 201 is provided in which the unevenness in luminance across the light emission surface of the light-emitting module 201 can be prevented and which is capable of emitting light with excellent uniformity. The light adjusting member 27 may contain a material whose refractive index is different from that of the base material. In this case, the light adjusting member 27 may serve as a light diffusing layer. The light adjusting member 27 may contain phosphor particles or the like.

Figure 5C:
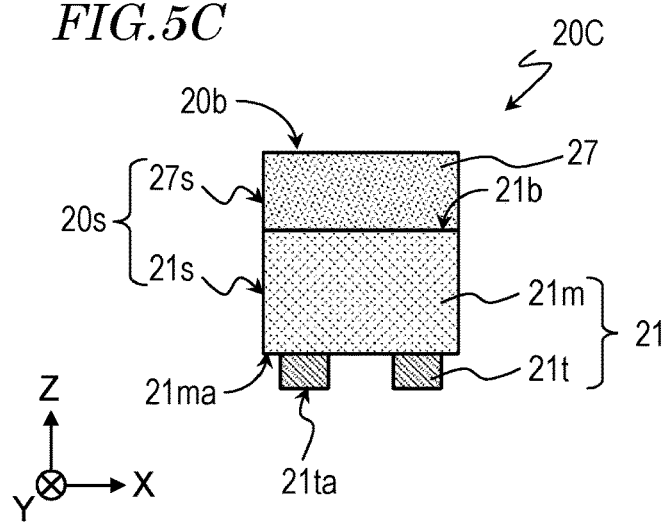
FIG. 5C is a schematic cross-sectional view showing still another example of the configuration of a light source which is applicable to a light-emitting unit.

The example shown in FIG. 5C is the same as the example previously described with reference to FIG. 5B in that the lower surface 21ma of the main body 21m of the light-emitting element 21 is identical with the first surface 20a of the light source 20C. Meanwhile, in this example, the upper surface of the light adjusting member 27 forms the second surface 20b of the light source 20C. In this example, the lateral surface 20s of the light source 20C includes the lateral surface 21s of the light-emitting element 21 and the lateral surface 27s of the light adjusting member 27.

Figure 5D:
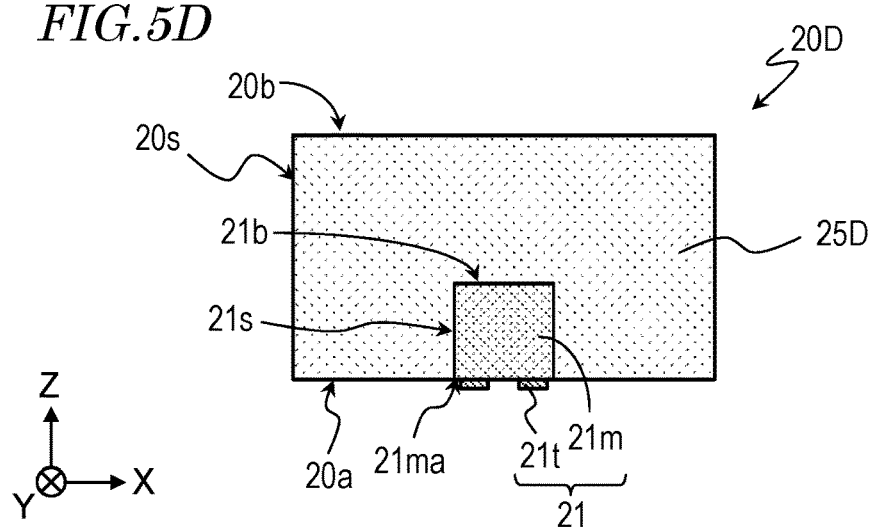
FIG. 5D is a schematic cross-sectional view showing still another example of the configuration of a light source which is applicable to a light-emitting unit.

FIG. 5D shows a light source 20D which includes a light-emitting element 21 and a light-transmitting member 25D. As shown in FIG. 5D, the light-transmitting member 25D covers not only the light emission surface 21b, which is the upper surface of the light-emitting element 21, but also the lateral surface 21s. As described herein, the light source applied to the light-emitting units 101 may include a member which also covers the lateral surface 21s of the light-emitting element 21. Herein, the lower surface and the upper surface of the light-transmitting member 25D respectively form the first surface 20a and the second surface 20b of the light source 20D. Also, herein, the lateral surface of the light-transmitting member 25D is identical with the lateral surface 20s of the light source 20D. In the configuration illustrated in FIG. 5D, the electrodes 21t of the light-emitting element 21 are projecting out of the light-transmitting member 25D.

The light-transmitting member 25D is made of the same material as that of the above-described bonding member 23 for example and is therefore capable of transmitting light. Not only the upper surface of the light-emitting element 21 but also the lateral surface 21s is covered with the light-transmitting member 25D, so that light emitted from the lateral surface 21s of the light-emitting element 21 can be easily extracted from the lateral surface 20s of the light source 20D. The light source 20D is bonded to the unit light-transmitting plate member 10 such that at least part of the light-transmitting member 25D of the light source 20D which has such a configuration is present inside the first recess 11 of the unit light-transmitting plate member 10, so that light can easily be introduced into the unit light-transmitting plate member 10 through not only one of the surfaces that define the shape of the first recess 11 which is opposite to the second surface 20b of the light source 20D but also the other surfaces. The light-transmitting member 25D may contain a material whose refractive index is different from that of the base material such that the light-transmitting member 25D has a light diffusing function. The light-transmitting member 25D may contain a wavelength converting material, such as phosphor particles or the like.

Figure 5E:
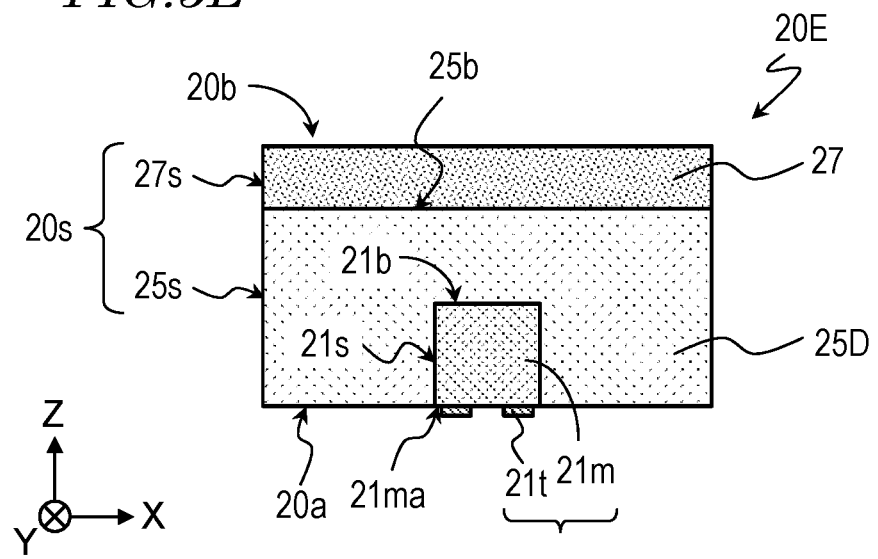
FIG. 5E is a schematic cross-sectional view showing still another example of the configuration of a light source which is applicable to a light-emitting unit.
Figure 5F:
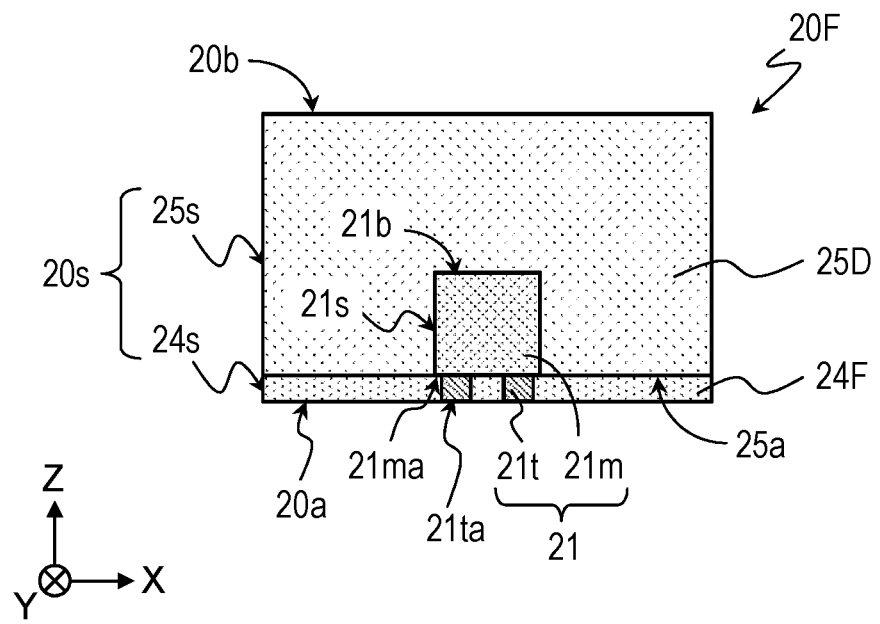
FIG. 5F is a schematic cross-sectional view showing still another example of the configuration of a light source which is applicable to a light-emitting unit.

FIG. 5E shows an example of the configuration of a light source which further includes a light adjusting member 27. FIG. 5F shows an example of the configuration of a light source which further includes a light reflecting member 24F.

The light source 20E shown in FIG. 5E includes a light adjusting member 27 in the form of a layer provided on the upper surface 25b of the light-transmitting member 25D. In this example, the upper surface of the light adjusting member 27 is identical with the second surface 20b of the light source 20E. The lateral surface 20s of the light source 20E includes the lateral surface 27s of the light adjusting member 27 and the lateral surface 25s of the light-transmitting member 25D.

The example shown in FIG. 5E is the same as the light source 20D shown in FIG. 5D in that the electrodes 21t of the light-emitting element 21 are projecting out of the light-transmitting member 25D and that the lower surface 21ma of the main body 21m of the light-emitting element 21 is also exposed out of the light-transmitting member 25D. In such a configuration, it is preferred that the electrodes 21t of the light-emitting element 21 have a small thickness. The thickness of the light source (i.e., the distance from the lower surface 21ta of the electrodes 21t to the second surface 20b of the light source) can be reduced and, as a result, the thickness of the light-emitting module 201 can be smaller.

The light source 20F shown in FIG. 5F includes a light reflecting member 24F which covers the lower surface 25a side of the light-transmitting member 25D. In the configuration illustrated in FIG. 5F, the lower surface 21ta of the electrodes 21t is coplanar with the lower surface of the light reflecting member 24F and is exposed out of the light reflecting member 24F. The light reflecting member 24F is made of, for example, a resin material in which a light-reflective filler is dispersed and is capable of reflecting light. The light reflecting member 24F is provided on the lower surface 25a side of the light-transmitting member 25D, and the lower surface 21ma of the main body 21m of the light-emitting element 21 and the lateral surfaces of the electrodes 21t are covered with the light reflecting member 24F, so that leakage of light from the light-emitting element 21 to the first main surface 10a side of the unit light-transmitting plate member 10 can be suppressed. That is, absorption by a wiring board, or the like, which can be provided on the first main surface 10a side of the unit light-transmitting plate member 10 is avoided, so that the light utilization efficiency can be improved. In this example, the lower surface of the light reflecting member 24F is identical with the first surface 20a of the light source 20F, and the lateral surface 20s of the light source 20F includes the lateral surface 25s of the light-transmitting member 25D and the lateral surface 24s of the light reflecting member 24F.

Figure 5G:
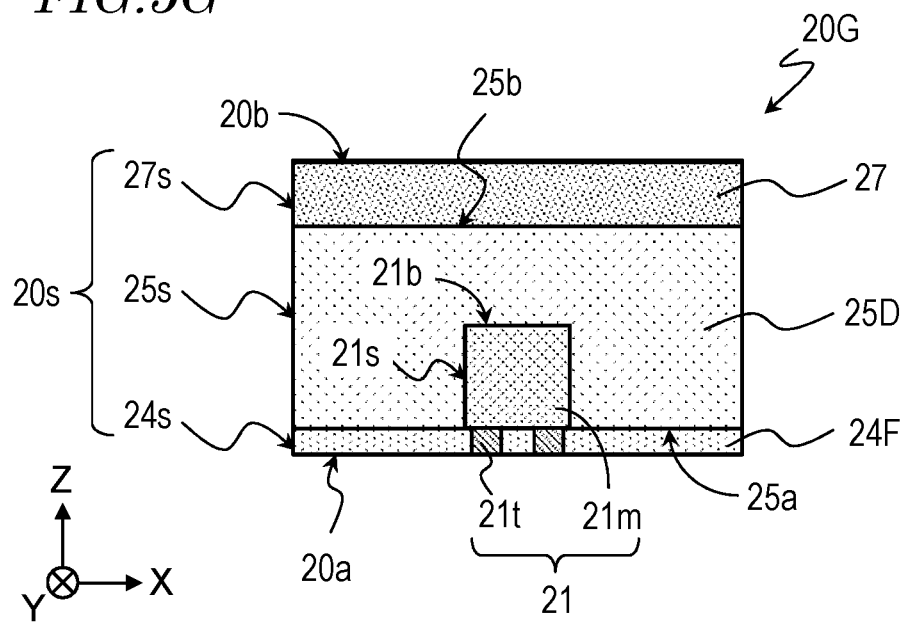
FIG. 5G is a schematic cross-sectional view showing still another example of the configuration of a light source which is applicable to a light-emitting unit.

As illustrated in FIG. 5G, the light source may include both the light adjusting member 27 and the light reflecting member 24F. The light source 20G shown in FIG. 5G includes the light adjusting member 27 provided on the upper surface 25b of the light-transmitting member 25D as compared with the light source 20F shown in FIG. 5F. Therefore, the lateral surface 20s of the light source 20G includes the lateral surface 27s of the light adjusting member 27 in addition to the lateral surface 25s of the light-transmitting member 25D and the lateral surface 24s of the light reflecting member 24F.

Figure 5H:
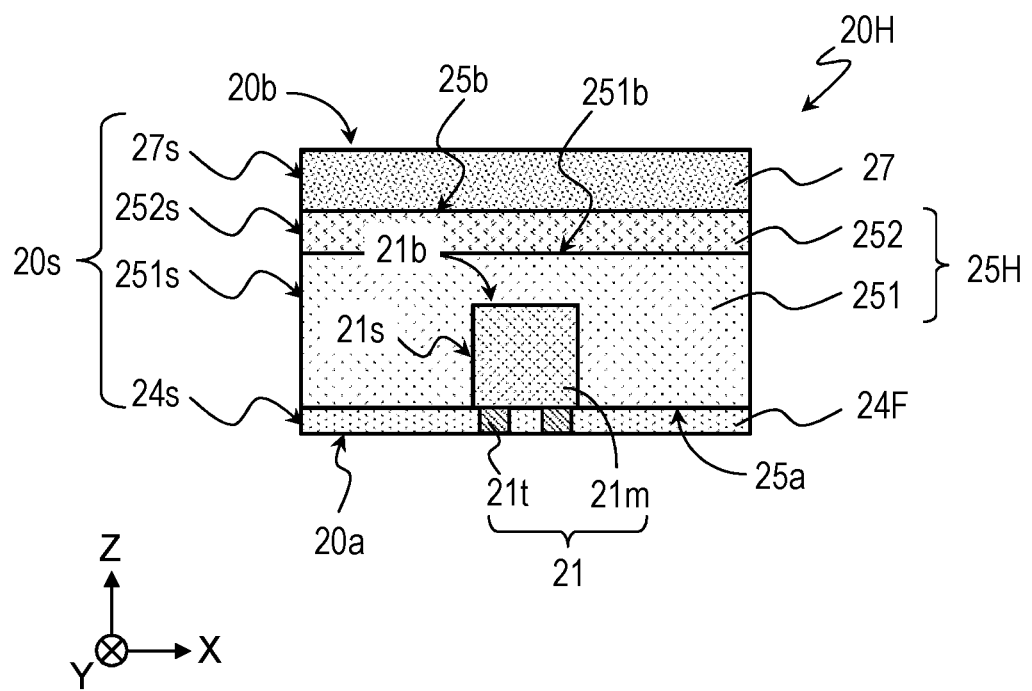
FIG. 5H is a schematic cross-sectional view showing still another example of the configuration of a light source which is applicable to a light-emitting unit.

The light source 20H shown in FIG. 5H is an example of the configuration which includes a light-transmitting member 25H in place of the light-transmitting member 25D in the example previously described with reference to FIG. 5G. As shown in FIG. 5H, the light-transmitting member 25H has a two-layer structure including a first light-transmitting member 251 and a second light-transmitting member 252. The first light-transmitting member 251 covers the light emission surface 21b and the lateral surface 21s of the light-emitting element 21 as does the above-described light-transmitting member 25D. The second light-transmitting member 252 is located on the upper surface 251b of the first light-transmitting member 251. That is, the second light-transmitting member 252 is interposed between the first light-transmitting member 251 and the light adjusting member 27. In this example, the lateral surface 20s of the light source 50H includes the lateral surface 24s of the light reflecting member 24F, the lateral surface 27s of the light adjusting member 27, and the lateral surface of the light-transmitting member 25H, i.e., the lateral surface 251s of the first light-transmitting member 251 and the lateral surface 252s of the second light-transmitting member 252.

Figure 5I:
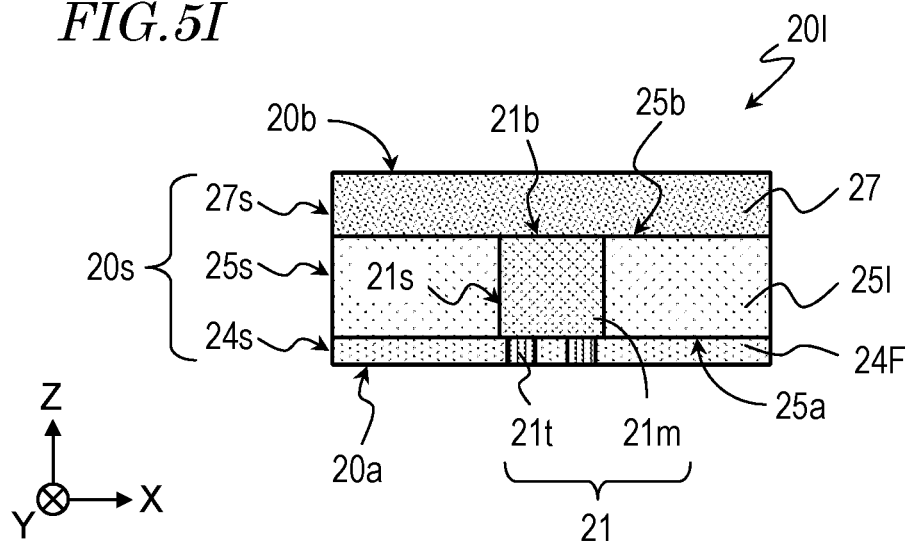
FIG. 5I is a schematic cross-sectional view showing still another example of the configuration of a light source which is applicable to a light-emitting unit.

As shown in FIG. 5I, it is not essential that part of the light-transmitting member (for example, the light-transmitting member 25D) intervenes between the light emission surface 21b of the light-emitting element 21 and the light adjusting member 27. As compared with the light source 20G shown in FIG. 5G, the light source 20I shown in FIG. 5I includes a light-transmitting member 25I in place of the light-transmitting member 25D. As shown in FIG. 5I, the light-transmitting member 25I covers the lateral surface 21s of the light-emitting element 21 but is not present on the light emission surface 21b. In the example shown in FIG. 5I, the upper surface 25b of the light-transmitting member 25I is coplanar with the light emission surface 21b of the light-emitting element 21, and the light adjusting member 27 is shaped so as to cover these surfaces together. The light adjusting member 27 may be in direct contact with the light emission surface 21b of the light-emitting element 21. The light-transmitting member 25I may contain a material whose refractive index is different from that of the base material such that the light-transmitting member 25I has a light diffusing function. The light-transmitting member 25I may contain a wavelength converting material, such as phosphor particles or the like.

The light source 20J of FIG. 5J generally has a configuration realized by substituting the wavelength conversion member 22 of the light source 20 previously described with reference to FIG. 5A with a plate-like light-transmitting member 25J. In this example, the upper surface 24b of the light reflecting member 24 is coplanar with the light emission surface 21b of the light-emitting element 21 and the upper surface 23b of the bonding member 23, and the light-transmitting member 25J is provided over and across the upper surfaces of the light-emitting element 21, the bonding member 23 and the light reflecting member 24. In this example, the lower surface of the light reflecting member 24 and the upper surface of the light-transmitting member 25J are respectively identical with the first surface 20a and the second surface 20b of the light source 20J. The lateral surface 20s of the light source 20J includes the lateral surface 25s of the light-transmitting member 25J and the lateral surface 24s of the light reflecting member 24.

Figure 5J:
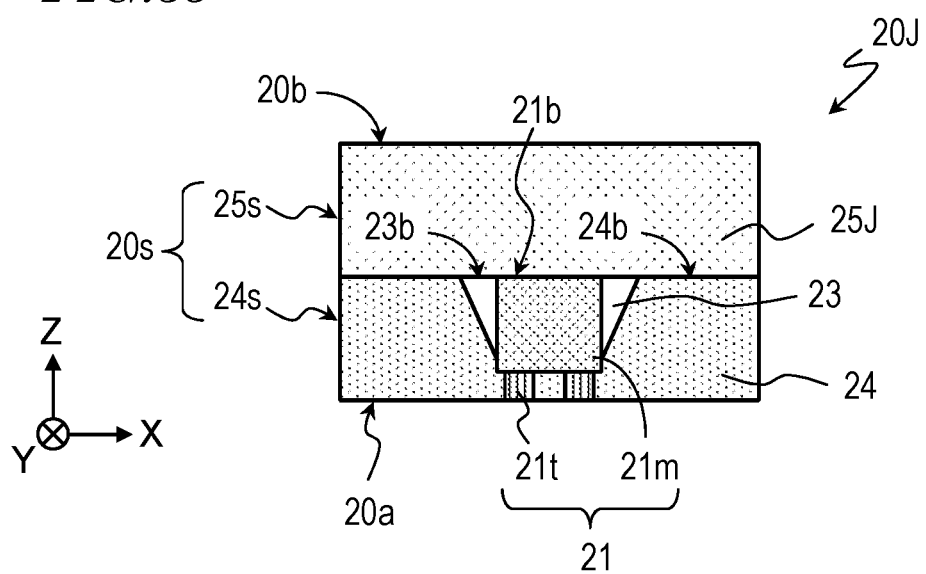
FIG. 5J is a schematic cross-sectional view showing still another example of the configuration of a light source which is applicable to a light-emitting unit.

In the configuration illustrated in FIG. 5J, the light emission surface 21b of the light-emitting element 21 and the upper surface 23b of the bonding member 23 are exposed out of the light reflecting member 24 that is arranged so as to surround the light-emitting element 21. In such a configuration, light from the light-emitting element 21 can be concentrated above the light-emitting element 21, and the light-transmitting member 25J makes it easy to control the distribution of light in the light source 20J. Also in the configuration illustrated in FIG. 5A, the light reflecting member 24 is arranged so as to surround the light-emitting element 21 and, therefore, the same effects can be expected.

Figure 5K:
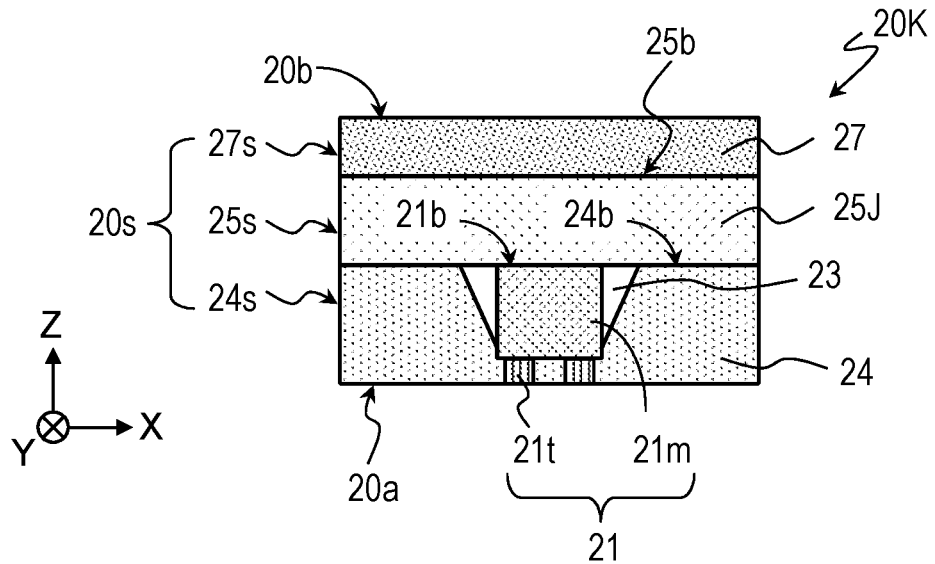
FIG. 5K is a schematic cross-sectional view showing still another example of the configuration of a light source which is applicable to a light-emitting unit.

The light source 20K shown in FIG. 5K has a configuration realized by further providing a light adjusting member 27 on the upper surface 25b of the light-transmitting member 25J of the light source 20J shown in FIG. 5J. Thus, in this example, the lateral surface 20s of the light source 20K includes not only the lateral surface 25s of the light-transmitting member 25J and the lateral surface 24s of the light reflecting member 24 but also the lateral surface 27s of the light adjusting member 27.

Figure 5L:
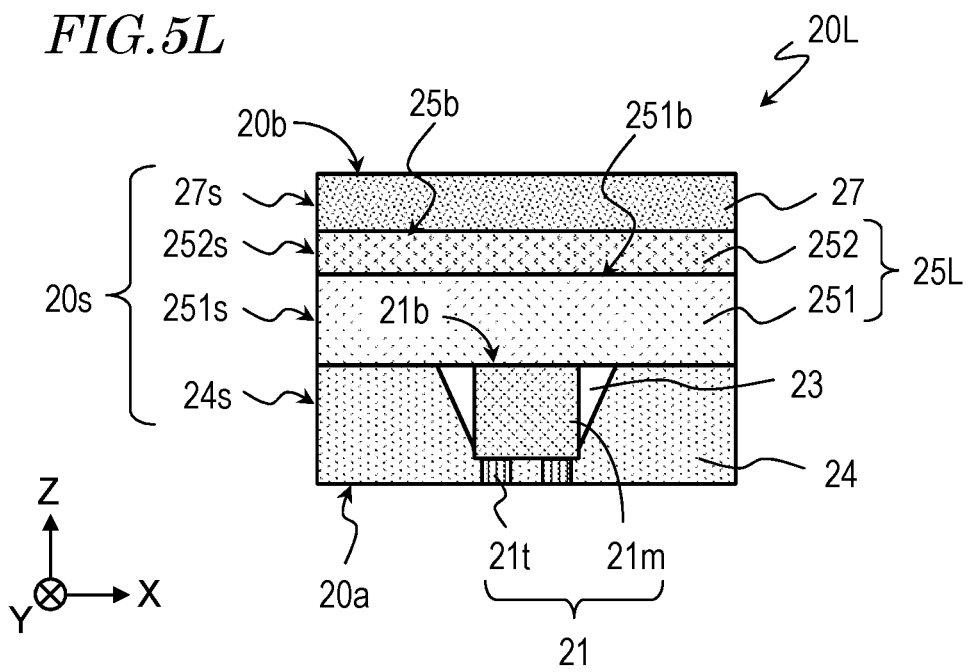
FIG. 5L is a schematic cross-sectional view showing still another example of the configuration of a light source which is applicable to a light-emitting unit.

The light source 20L shown in FIG. 5L has a configuration realized by substituting the light-transmitting member 25J of the light source 20K shown in FIG. 5K with a light-transmitting member 25L. Likewise as in the example previously described with reference to FIG. 5H, the light-transmitting member 25L has a two-layer structure including a first light-transmitting member 251 and a second light-transmitting member 252. Note that, however, herein, the first light-transmitting member 251 has a plate-like shape. The lateral surface 20s includes the lateral surface 24s of the light reflecting member 24, the lateral surface 27s of the light adjusting member 27, the lateral surface 251s of the first light-transmitting member 251 and the lateral surface 252s of the second light-transmitting member 252. This feature is basically the same as the light source 20H shown in FIG. 5H.

Figure 5M:
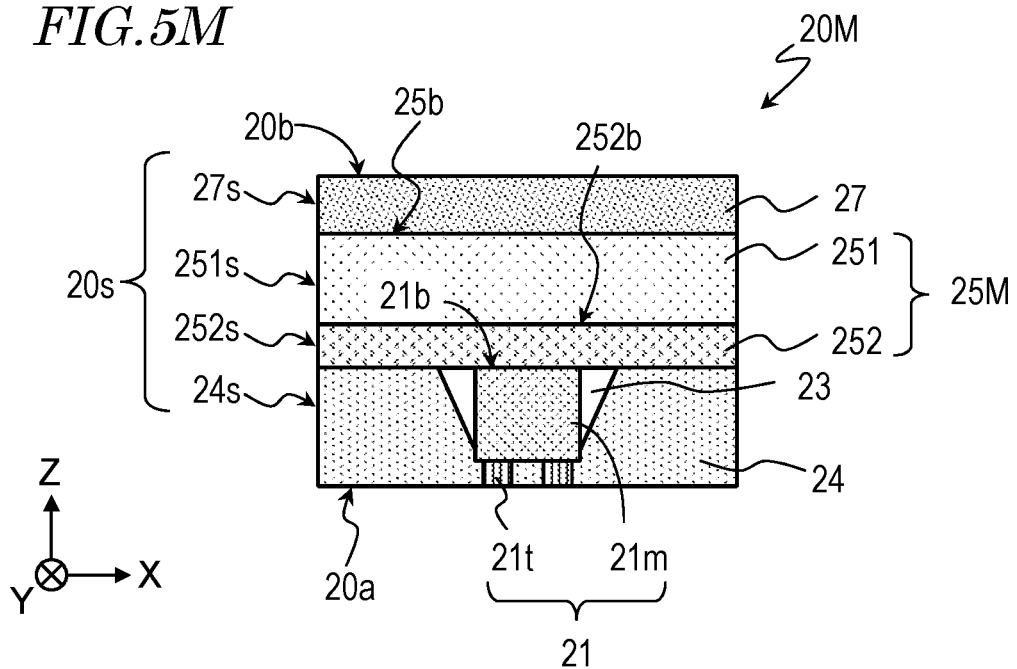
FIG. 5M is a schematic cross-sectional view showing still another example of the configuration of a light source which is applicable to a light-emitting unit.

The light source 20M shown in FIG. 5M includes a light-transmitting member 25M in place of the light-transmitting member 25L as compared with the light source 20L shown in FIG. 5L. The light-transmitting member 25M is realized by replacing the first light-transmitting member 251 and the second light-transmitting member 252 of the light-transmitting member 25L with each other. That is, in this example, the first light-transmitting member 251 is located on the upper surface 252b of the second light-transmitting member 252.

The arrangement of the first light-transmitting member 251 and the second light-transmitting member 252 in the light source is not limited to such an arrangement that the first light-transmitting member 251 is closer to the light-emitting element 21 than the second light-transmitting member 252. Note that a wavelength converting material, such as phosphor or the like, may be selectively dispersed in either of the first light-transmitting member 251 and the second light-transmitting member 252. For example, the first light-transmitting member 251 may be a layer which contains a wavelength converting material, and the second light-transmitting member 252 may be a layer which does not substantially contain a wavelength converting material.

Alternatively, each of the first light-transmitting member 251 and the second light-transmitting member 252 may contain a wavelength converting material. Note that, however, in this case, the first light-transmitting member 251 and the second light-transmitting member 252 may contain different wavelength converting materials. The first light-transmitting member 251 and the second light-transmitting member 252 may contain the same wavelength converting material such that the density of the wavelength converting material is different between these members. The light-transmitting member in the light source may have a multi-layer structure consisting of three or more layers. As in the example shown in FIG. 5H, when the light-transmitting member has such a shape that covers the light emission surface 21b and the lateral surface 21s of the light-emitting element 21, the light-transmitting member may include two portions, for example, a portion which covers the light emission surface 21b of the light-emitting element 21 (e.g., a plate-like portion) and a portion which covers the lateral surface 21s of the light-emitting element 21 (e.g., an annular portion). When the light-transmitting member includes a portion which covers the light emission surface 21b of the light-emitting element 21 and a portion which covers the lateral surface 21s of the light-emitting element 21, these portions may be made of the same material. Alternatively, between these two portions, for example, the type and/or density of the wavelength converting material dispersed may be different.

Figure 5N:
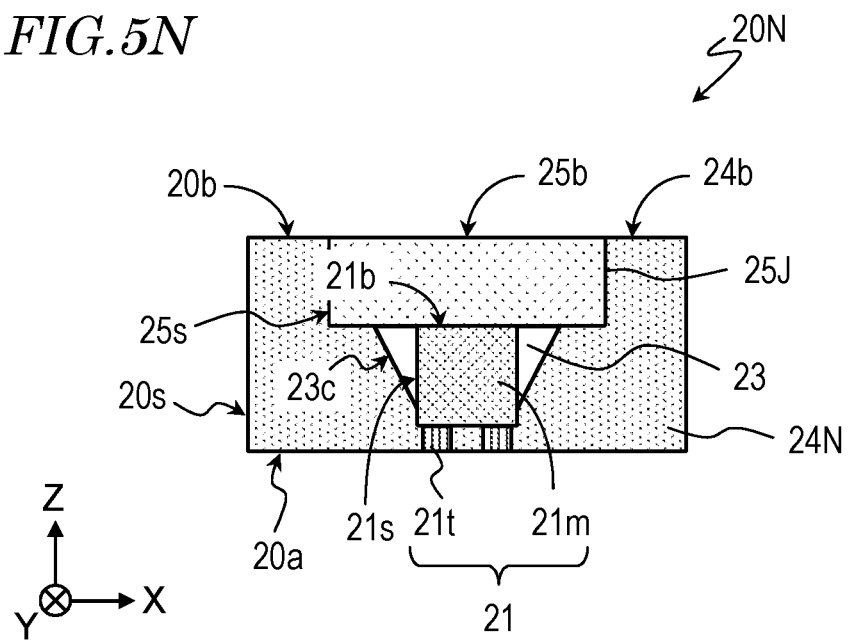
FIG. 5N is a schematic cross-sectional view showing still another example of the configuration of a light source which is applicable to a light-emitting unit.

The light source 20N shown in FIG. 5N includes a light reflecting member 24N. The light reflecting member 24N directly or indirectly covers the lateral surface 21s of the light-emitting element 21 as does the light reflecting member 24 of the light source 20J shown in FIG. 5J. Note that, however, in this example, the light reflecting member 24N also covers the lateral surface 25s of the light-transmitting member 25J. Herein, "indirectly covering the lateral surface 21s of the light-emitting element 21" means covering the lateral surface 21s of the light-emitting element 21 via any other member such as the bonding member 23 provided on the lateral surface 21s of the light-emitting element 21. In the example shown in FIG. 5N, the light reflecting member 24N covers not only part of the lateral surface 21s of the light-emitting element 21 but also the outer surface 23c of the bonding member 23.

In the configuration illustrated in FIG. 5N, the upper surface 25b of the light-transmitting member 25J is exposed out of the light reflecting member 24N and is coplanar with the upper surface 24b of the light reflecting member 24N. Herein, the aggregate of the upper surface 25b of the light-transmitting member 25J and the upper surface 24b of the light reflecting member 24 forms the second surface 20b of the light source 20N. In such a configuration that the lateral surface 25s of the light-transmitting member 25J is covered with the light reflecting member 24N, light emitted from the light source 20N is concentrated above the light-emitting element 21. Thus, it can facilitate, for example, control of the distribution of light by means of the light-reflective member 40 located inside the second recess 12 on the second main surface 10b side of the unit light-transmitting plate member 10.

Figure 5O:
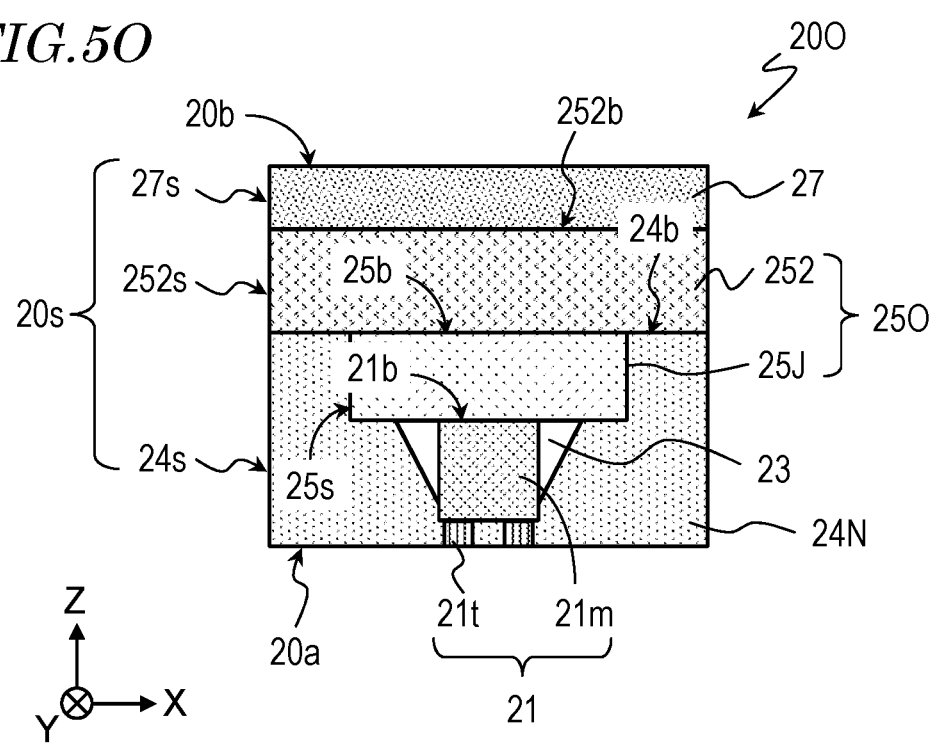
FIG. 5O is a schematic cross-sectional view showing still another example of the configuration of a light source which is applicable to a light-emitting unit.

The light source 20O shown in FIG. 5O includes a light adjusting member 27 located above the upper surface 25b of the light-transmitting member 25J in addition to the elements shown in FIG. 5N. Furthermore, herein, a second light-transmitting member 252 is provided between the light-transmitting member 25J and the light adjusting member 27. The second light-transmitting member 252 covers together the upper surface 25b of the light-transmitting member 25J and the upper surface 24b of the light reflecting member 24N. The light adjusting member 27 is located on the upper surface 252b of the second light-transmitting member 252. In this example, the light-transmitting member 25J and the second light-transmitting member 252 realize a light-transmitting member 250 which has a two-layer structure of these members.

In the light source 20O, the light reflecting member 24N covers the lateral surface 25s of the light-transmitting member 25J on the lower layer side in the light-transmitting member 250 of the two-layer structure but does not cover the lateral surface 252s of the second light-transmitting member 252 on the upper layer side. Covering the lateral surface 25s of the light-transmitting member 25J with the light reflecting member 24N enables light emitted from the light-emitting element 21 to be concentrated above the light-transmitting member 25J. Thus, the light adjusting member 27 on the upper surface 252b of the second light-transmitting member 252 more effectively functions, and control of the distribution of light by means of the light adjusting member 27 can be facilitated.

In the examples previously described with reference to FIG. 5J, FIG. 5K, FIG. 5L, FIG. 5M, FIG. 5N and FIG. 5O, the light-transmitting member (the light-transmitting member 25J, 25L or 25M) and the light-emitting element 21 are bonded together by the bonding member 23. Part of the bonding member 23 may be present between the light-emitting element 21 and the light-transmitting member. Note that the bonding member 23 may be omitted.

The light source applied to the light-emitting units 101 may include two or more light-emitting elements. FIG. 5P shows an example where a light source applied to a single light-emitting unit 101 includes a plurality of light-emitting elements. The light source 20P shown in FIG. 5P includes four light-emitting elements in total. Note that, in FIG. 5P, an exemplary appearance of the light source 20P as viewed in a direction normal to the second surface 20b and a schematic cross section of the light source 20P taken perpendicularly to the second surface 20b are shown together in a single drawing.

In the configuration illustrated in FIG. 5P, the light source 20P includes a single light-emitting element 21G, a single light-emitting element 21B, and two light-emitting elements 21R. As shown in the upper part of FIG. 5P, herein, these four light-emitting elements have an array of two rows and two columns in plan view. In this example, the light-emitting elements 21R are provided at the position of the first row and the first column and at the position of the second row and the second column, and the light-emitting element 21G is provided at the position of the first row and the second column. Further, the light-emitting element 21B is provided at the position of the second row and the first column. In this example, the light-transmitting member 25J is provided above the four light emission surface s 21b so as to cover these four light-emitting elements together, and the light adjusting member 27 is further provided on the upper surface 25b of the light-transmitting member 25J. The light source 20P further includes a light reflecting member 24P which covers the lateral surface 21s of each light-emitting element.

The light-emitting element 21G is an LED which emits, for example, green light. The light-emitting element 21B is an LED which emits, for example, blue light. The light-emitting elements 21R are LEDs which emit, for example, red light. When a plurality of light-emitting elements of different emission peak wavelengths are provided in a single light source as in this example such that primary colors are obtained, for example, white light can be realized without a wavelength converting material dispersed in the light-transmitting member 25J. As a matter of course, the number of light-emitting elements 21 in a single light source is not limited to four. When a light source includes a plurality of light-emitting elements, the emission wavelength may be different among these light-emitting elements, or the emission wavelength may be equal among these light-emitting elements.

As in the examples previously described with reference to FIG. 5A, FIG. 5F, FIG. 5G, FIG. 5H, FIG. 5I, FIG. 5J, FIG. 5K, FIG. 5L, FIG. 5M, FIG. 5N, FIG. 5O and FIG. 5P, in a configuration that includes a light reflecting member which covers the lower surface 21ma of the main body 21m of the light-emitting element 21 and the lateral surfaces of the electrodes 21t (light reflecting member 24, 24F or 24P), an interconnect layer coupled with the electrodes 21t of the light-emitting element 21 may be provided on the first surface 20a of the light source. The interconnect layer on the first surface 20a is, for example, part of the above-described interconnect layer 60 and can be realized by patterning of a metal film formed by plating, sputtering, or the like. The metal film may be a single-layer film of Ag, Ni, Au, Ru, Ti, Pt, or the like, or may be a multilayer film. The interconnect layer on the first surface 20a may be in the form of, for example, a multilayer film realized by sequentially depositing Ag and Cu, a multilayer film realized by sequentially depositing Ni and Au, a multilayer film realized by sequentially depositing Ni, Ru and Au, a multilayer film realized by sequentially depositing Ti, Pt and Au, or a multilayer film realized by sequentially depositing Cu, Ni and Au.

Figure 6A:
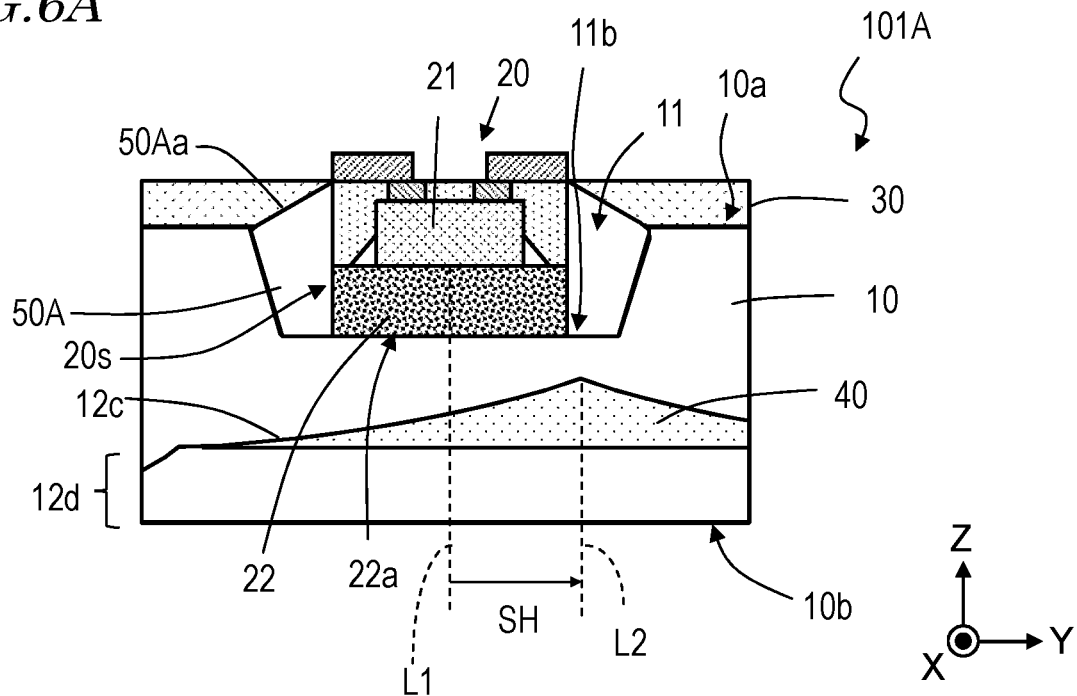
FIG. 6A is an enlarged schematic cross-sectional view of the first light-emitting unit of the light-emitting module shown in FIG. 1A.
Figure 6B:
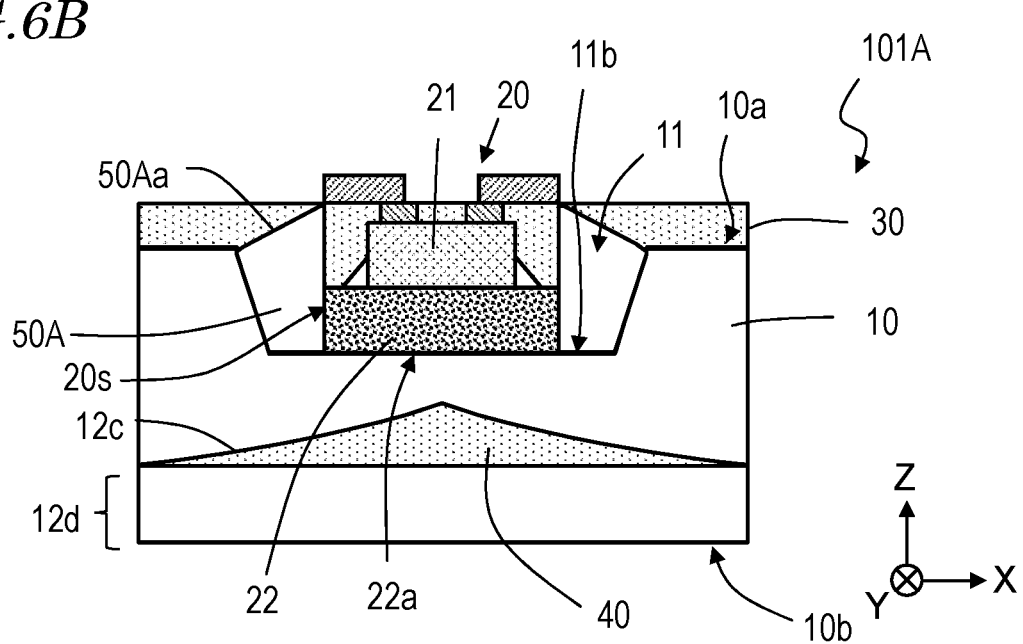
FIG. 6B is an enlarged schematic cross-sectional view of the first light-emitting unit of the light-emitting module shown in FIG. 1A.
Figure 6C:
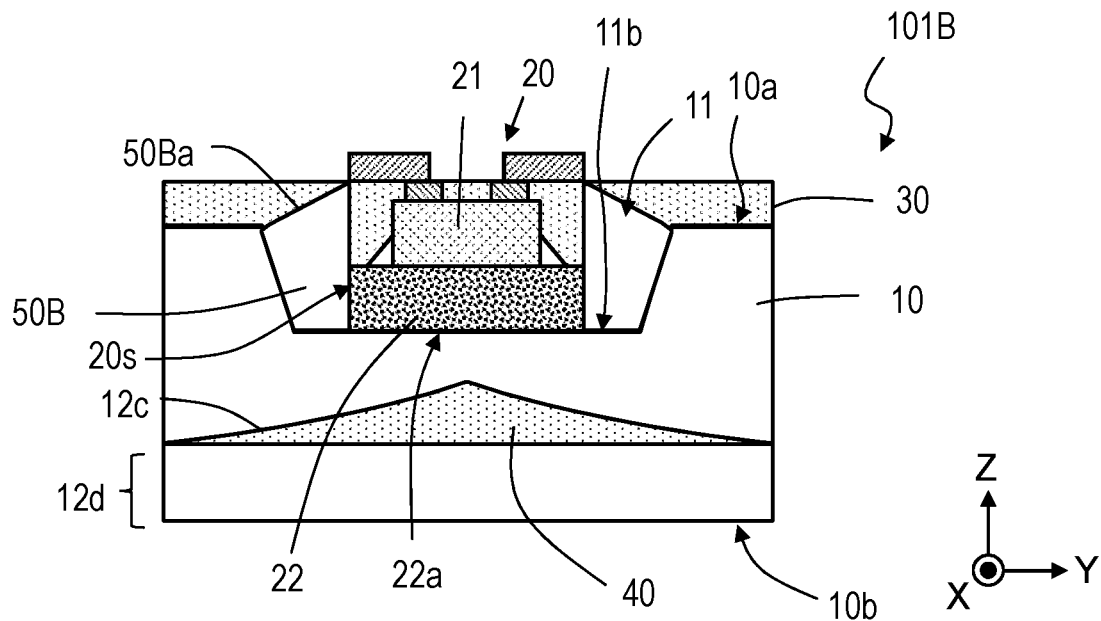
FIG. 6C is an enlarged schematic cross-sectional view of the second light-emitting unit of the light-emitting module shown in FIG. 1A.

Each of the above-described light sources 20C, 20D, 20E, 20F, 20G, 20H, 20I, 20J, 20K, 20L, 20M, 20N, 20O and 20P can be prepared by integrating the other members such as light adjusting member, light-transmitting member, light reflecting member, and the like, into the light-emitting element 21. Alternatively, the light source applied to the light-emitting module 201 or some or all of the constituent members of the light source may be provided by purchase.
Light-Transmitting Members 50A, 50B FIG. 6A and FIG. 6B are schematic cross-sectional views enlargedly showing the vicinity of a first recess 11 of the first light-emitting unit 101A. FIG. 6A schematically shows a YZ cross section of the first light-emitting unit 101A. FIG. 6B schematically shows a ZX cross section of the first light-emitting unit 101A. FIG. 6C is a schematic cross-sectional view enlargedly showing the vicinity of a first recess 11 of the second light-emitting unit 101B. In FIG. 6A, FIG. 6B and FIG. 6C, for the sake of clarity, the first light-emitting unit 101A and the second light-emitting unit 101B are shown upside down as compared with FIG. 3A and FIG. 4A, such that the bottom of the first recess 11 is located on the lower side.

As shown in FIG. 6A, FIG. 6B and FIG. 6C, herein, the light source 20 is provided in the first recess 11 of the light-emitting unit 101, and the light-transmitting member 50 is provided in the first recess 11 so as to cover at least part of the lateral surface 20s of the light source 20. In the first recess 11 of the first light-emitting unit 101A, a light-transmitting member 50A is provided. In the first recess 11 of the second light-emitting unit 101B, a light-transmitting member 50B is provided. Hereinafter, as the light source applied to the light-emitting units 101, the light source 20 shown in FIG. 5A is illustrated although, as a matter of course, the other examples previously described with reference to FIG. 5B, FIG. 5C, FIG. 5D, FIG. 5E, FIG. 5F, FIG. 5G, FIG. 5H, FIG. 5I, FIG. 5J, FIG. 5K, FIG. 5L, FIG. 5M, FIG. 5N, FIG. 5O and FIG. 5P are also applicable instead of the light source 20.

The light source 20 is provided in the first recess 11 such that the second surface 20b of the light source 20 (herein, a main surface 22a of the wavelength conversion member 22 which is not bonded to the light-emitting elements 21, and which is the light extraction surface) faces the bottom surface 11b of the first recess 11. The light-transmitting member 50A, 50B covers at least part of the light source 20 and is provided in a space inside the first recess 11 which is not occupied by the light source 20. In other words, in each of the light-emitting units 101, the light source 20 is secured to the inside of the first recess 11 by the light-transmitting member 50A or 50B.

As shown in FIG. 6A, in each of the first unit regions 211A, the optical axis of the lens structure, in other words, the center of the second recess 12, is not coincident with the optical axis of the light source 20. In this example, the optical axis of the lens structure of the first light-emitting unit 101A is offset in +Y direction with respect to the optical axis of the light source 20. Note that, in this example, in a ZX cross section of the first light-emitting unit 101A, the optical axis of the lens structure is coincident with the optical axis of the light source 20 (see FIG. 6B). By offsetting the position of the optical axis of the lens structure, for example, from the optical axis of the light source 20, between two different cross sections which are perpendicular to the first main surface 10a of the unit light-transmitting plate member 10, in other words, by offsetting the position of the center of the lens structure with respect to the optical axis of the light source 20, the reflection characteristic of the unit light-transmitting plate member 10 on the second main surface 10b side has in-plane anisotropy. That is, by forming the lens structure in the unit light-transmitting plate member 10 such that the optical axis of the lens structure is offset from the optical axis of the light source 20, different light distribution characteristics can be achieved between, for example, two different directions in the XY plane (for example, X direction and Y direction).

In contrast, as shown in FIG. 6C, in the second light-emitting unit 101B, the second recess 12 as the lens structure is provided in the second main surface 10b of the unit light-transmitting plate member 10 such that the optical axis of the second recess 12 is generally coincident with the optical axis of the light source 20. Therefore, the second light-emitting unit 101B is different from the first light-emitting unit 101A in that there is not a significant difference in light distribution characteristic between X direction and Y direction. Thus, for example, by varying the distance from the optical axis of the light source 20 to the optical axis of the lens structure between the first light-emitting unit 101A and the second light-emitting unit 101B, the distribution of light outgoing from the first unit regions 211A and the distribution of light outgoing from the second unit regions 211B can be different from each other.

Thus, in the present embodiment, in the first light-emitting units 101A included in the plurality of light-emitting units 101, the second recess 12 is formed in the second main surface 10b of the unit light-transmitting plate member 10 such that the optical axis of the lens structure is offset from the optical axis of the light source 20. For example, by deviating the lens structure to the positive or negative side in a certain direction such that, in each of the first light-emitting units 101A, the optical axis of the lens structure is "offset" in a certain direction in the XY plane, an asymmetric distribution of light about the optical axis of the light source 20 can be realized along that direction within a single first light-emitting unit 101A.

According to an embodiment of the present disclosure, when a single first light-emitting unit 101A is considered, the proportion of light reflected at the interface between the unit light-transmitting plate member 10 and the light-reflective member 40 which is diffused in the in-plane direction of the unit light-transmitting plate member 10 can be increased, for example, on the negative side in Y direction as compared with the positive side in Y direction. In other words, for example, by deviating the position of the optical axis of the lens structure to the positive side in Y direction from the position of the optical axis of the light source 20, the proportion of light which travels in a transverse direction (in-plane direction) after being reflected at the interface between the unit light-transmitting plate member 10 and the light-reflective member 40 can be reduced on the positive side in Y direction.

Figure 6D:
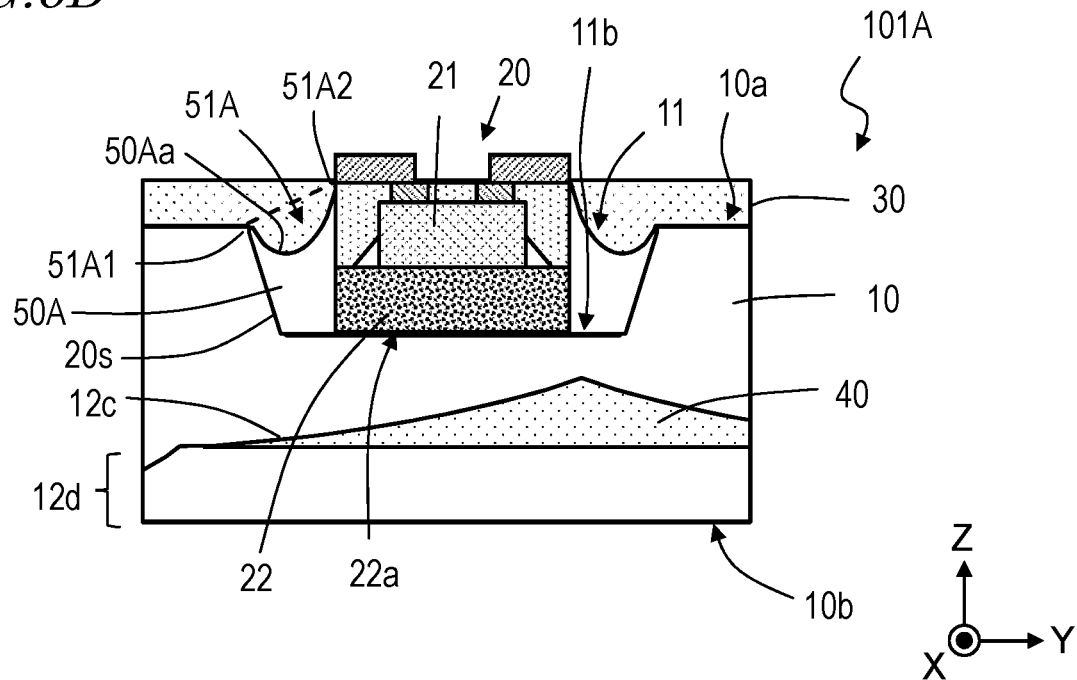
FIG. 6D is an enlarged schematic cross-sectional view showing another form of the first light-emitting unit of the light-emitting module shown in FIG. 1A.

FIG. 6D shows another example of the shape of the light-transmitting member 50A. In the configuration shown in FIG. 6D, the upper surface 50Aa of the light-transmitting member 50A has a first receding part 51A receding to the bottom surface 11b side of the first recess 11. Herein, whether or not the upper surface 50Aa has the first receding part 51A may be determined by whether or not, for example, in a cross section, the upper surface 50Aa is receding to the bottom surface 11b side relative to the line between the point 51A1 at which the upper surface 50Aa is in contact with the inner lateral surface of the first recess 11 and the point 51A2 at which the upper surface 50Aa is in contact with the lateral surface 20s of the light source 20 (broken line in FIG. 6D). The first receding part 51A may be arranged along four sides of the rectangular shape of the light source 20 so as to surround the light source 20 in plan view.

Figure 6E:
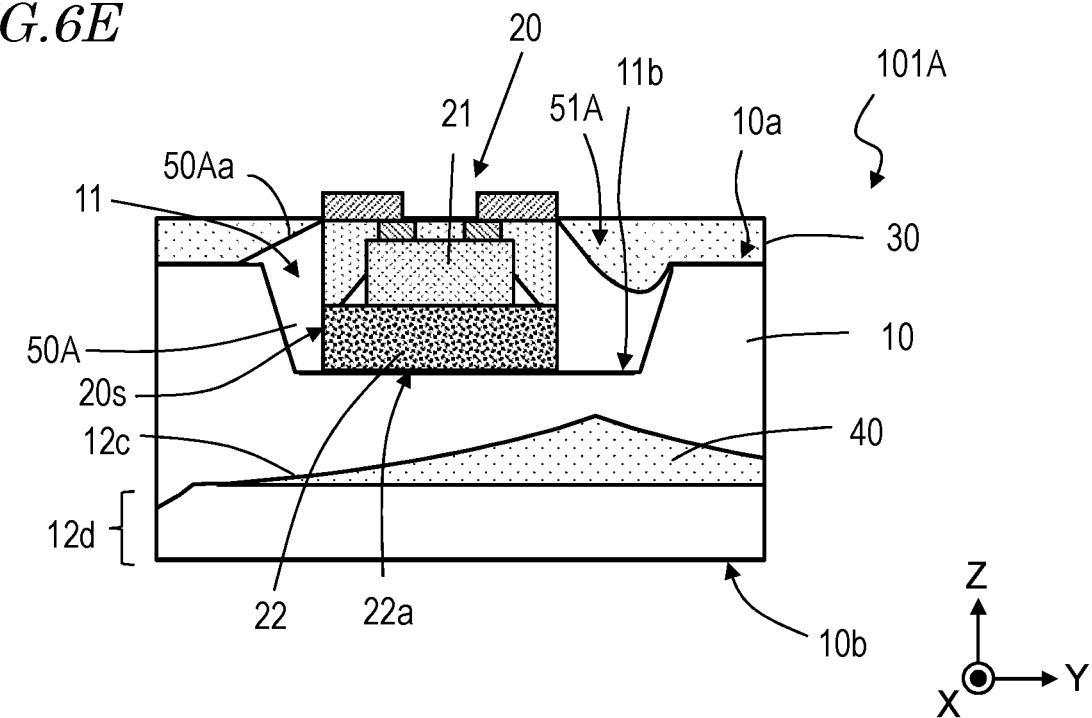
FIG. 6E is an enlarged schematic cross-sectional view showing still another form of the first light-emitting unit of the light-emitting module shown in FIG. 1A.

The upper surface 50Aa of the light-transmitting member 50A may have different shapes at opposite sides of the light source 20 as viewed in cross section as shown in FIG. 6E. For example, the position of the optical axis of the light source 20 with respect to the center of the first recess 11 may be intentionally or accidentally offset so that, as viewed in cross section, the upper surface 50Aa of the light-transmitting member 50A has different shapes between the left side and the right side of the light source 20. In the example shown in FIG. 6E, the upper surface 50Aa has the first receding part 51A on the positive side in Y direction relative to the light source 20. On the other hand, the shape of the upper surface 50Aa on the negative side in Y direction relative to the light source 20 is linear as viewed in cross section. Note that, in this example, on the negative side in Y direction relative to the light source 20, part of the light-transmitting member 50A is located on the first main surface 10a of the unit light-transmitting plate member 10. The light-transmitting member 50 may be selectively provided inside the first recess 11 or may be partially located on the first main surface 10a of the unit light-transmitting plate member 10 as in this example.

The cross-sectional shape of the upper surface 50Aa such as illustrated in FIG. 6E can be realized by, for example, arranging the light source 20 in the first recess 11 such that the optical axis of the light source 20 is offset with respect to the center of the first recess 11. A light-transmitting member 50A whose geometry is asymmetrical about the light source 20 may be formed by arranging a light source 20 in a first recess 11 such that the optical axis of the light source 20 is offset to, for example, the negative side in Y direction with respect to the center of the first recess 11, filling the inside of the first recess 11 with the material of the light-transmitting member 50A, and thereafter, curing the material of the light-transmitting member 50A.

Figure 6F:
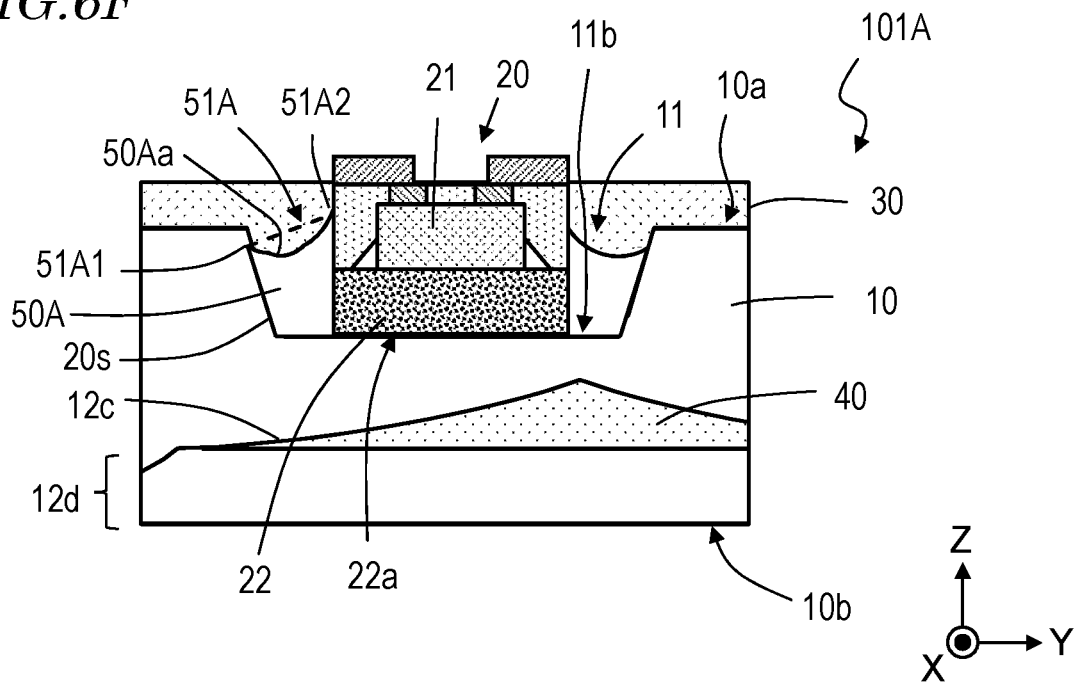
FIG. 6F is an enlarged schematic cross-sectional view showing still another form of the first light-emitting unit of the light-emitting module shown in FIG. 1A.

In this example, the light-transmitting member 50A is in contact with the entire inner lateral surface of the first recess 11 and with the entire lateral surface 20s of the light source 20. Therefore, the point 51A1 and the point 51A2 are respectively present at the highest part of the inner lateral surface of the first recess 11 and the highest part of the lateral surface 20s of the light source 20. However, as shown in FIG. 6F, the point 51A1 and the point 51A2 may be present at an intermediate part in the vertical direction of the inner lateral surface and the lateral surface 20s, respectively. The light-transmitting member 50A may be in contact with part of the inner lateral surface of the first recess 11 and with part of the lateral surface 20s of the light source 20. The same also applies to the second light-emitting unit 101B. The light-transmitting member 50B may be in contact with part of the inner lateral surface of the first recess 11 and with part of the lateral surface 20s of the light source 20.

Referring again to FIG. 6C for the second light-emitting unit 101B, in this example, the shape of the upper surface 50Ba appearing at the left side and the right side of the light source 20 as viewed in cross section is generally linear. When the second light-emitting unit 101B is considered, in a typical embodiment, the light source 20 is secured to the unit light-transmitting plate member 10 such that the center of the first recess 11 and the center of the second recess 12 are coincident and the optical axis of the light source 20 passes through the center of the first recess 11 in plan view. Therefore, herein, the optical axis of the light source 20 of the second light-emitting unit 101B is also generally coincident with the center of the second recess 12 that is the lens structure. In such a configuration, basically, the shape of the upper surface 50Ba of the light-transmitting member 50B is generally symmetrical about the light source 20 in both of a YZ cross section and a ZX cross section. Note that the second light-emitting unit 101B is the same as the first light-emitting unit 101A in that the upper surface 50Ba of the light-transmitting member 50B is covered with the light reflecting layer 30.

In the configuration illustrated in FIG. 6C, the upper surface 50Ba of the light-transmitting member 50B does not have a receding part but is linear as viewed in cross section. By selectively providing a receding part in either of the upper surface 50Ba of the light-transmitting member 50B of the second light-emitting unit 101B and the upper surface 50Aa of the light-transmitting member 50A of the first light-emitting unit 101A, the difference in distribution of light between the first unit regions 211A and the second unit regions 211B can be increased.

The light-transmitting members 50A, 50B are made of a resin composition which contains a transparent resin material as the base material as is the bonding member 23. The material of the light-transmitting members 50 may be different from, or may be the same as, the material of the bonding member 23. The light-transmitting members 50 typically have a lower refractive index than the refractive index of the unit light-transmitting plate member 10.

The shape of the light-transmitting member 50A of the first light-emitting unit 101A and the shape of the light-transmitting member 50B of the second light-emitting unit 101B may be controlled by, for example, adjusting the position of the light source 20 to be provided in the first recess 11 and the amount of an uncured material of the light-transmitting members 50A, 50B to be provided in the first recess 11 in consideration of the volume reduction caused by curing as will be described in the following section.

Intermediate Through Holes 15A, 15B

In the configurations illustrated in FIG. 6A, FIG. 6B, FIG. 6C, FIG. 6D, FIG. 6E and FIG. 6F, the first recess 11 and the second recess 12 provided in the unit light-transmitting plate member 10 of each of the light-emitting units 101 are spaced away from each other by the interposition of the material of the unit light-transmitting plate member 10. In other words, in these examples, the unit light-transmitting plate member 10 of each of the light-emitting units 101 does not have a feature penetrating through the light-transmitting plate member 210 from the first main surface 210a to the second main surface 210b. However, the plurality of light-emitting units 101 may include a light-emitting unit which has, in its part, a feature penetrating through the light-transmitting plate member 210 from the first main surface 210a to the second main surface 210b.

Figure 6G:
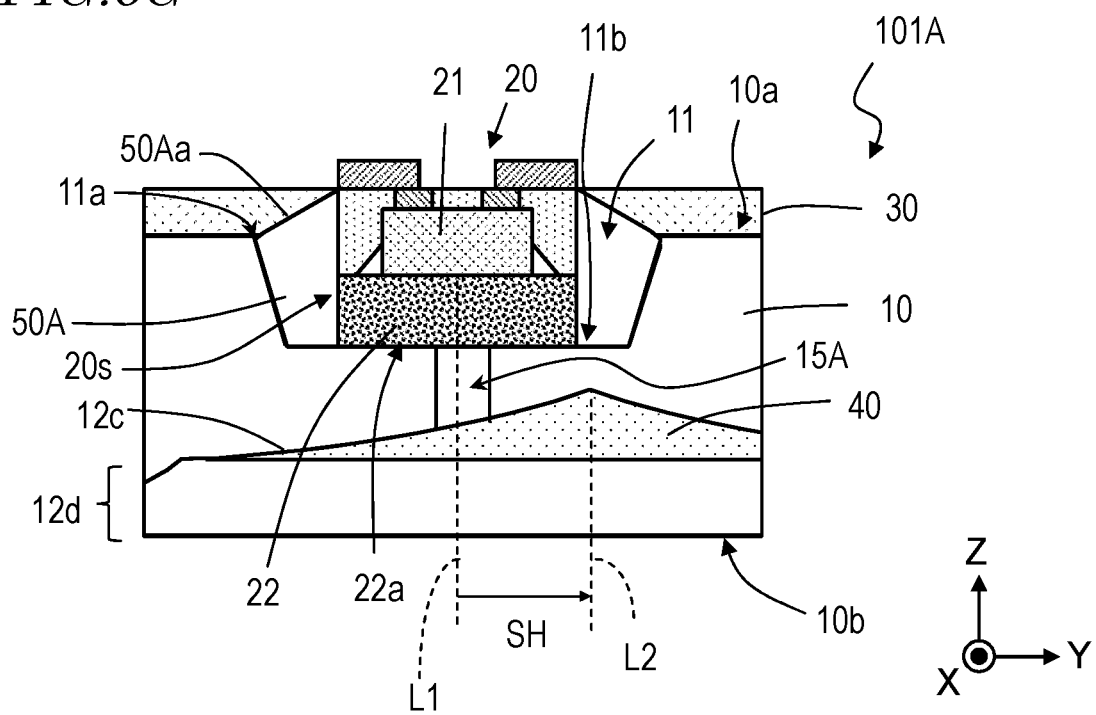
FIG. 6G is an enlarged schematic cross-sectional view showing another example of the configuration of a unit light-transmitting plate member 10 of a first light-emitting unit 101A.
Figure 6H:
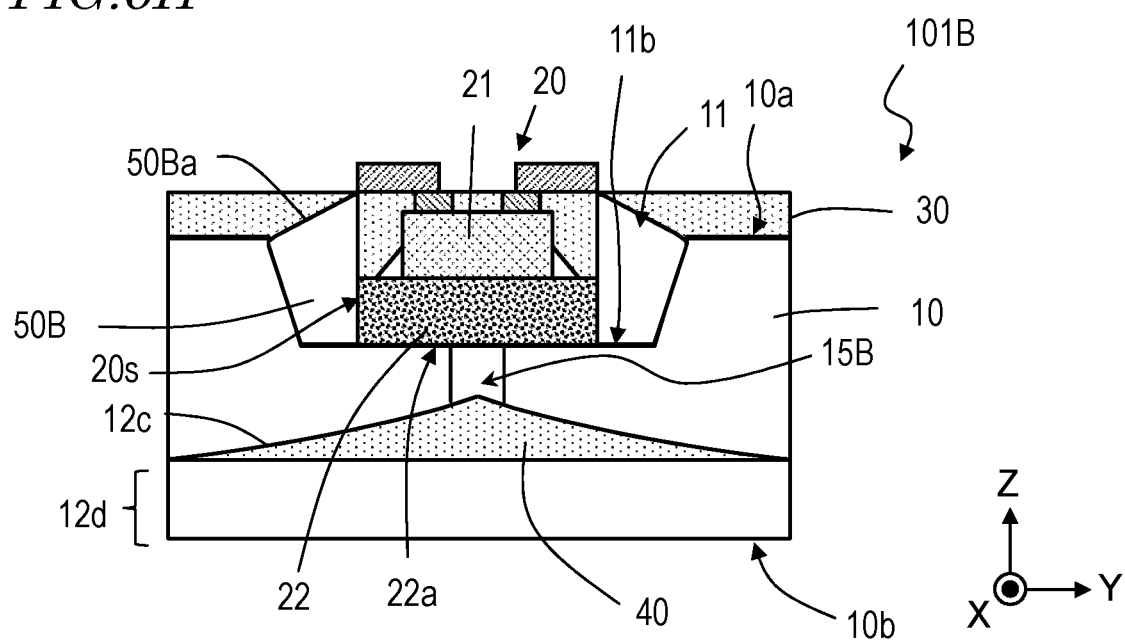
FIG. 6H is an enlarged schematic cross-sectional view showing another example of the configuration of a unit light-transmitting plate member 10 of a second light-emitting unit 101B.

FIG. 6G shows another example of the configuration of the unit light-transmitting plate member 10 of the first light-emitting unit 101A. FIG. 6H shows another example of the configuration of the second light-emitting unit 101B. Herein, both the cross section of the first light-emitting unit 101A and the cross section of the second light-emitting unit 101B are YZ cross sections.

In the configuration illustrated in FIG. 6G, the unit light-transmitting plate member 10 of the first light-emitting unit 101A has an intermediate through hole 15A which connects the first recess 11 with the second recess 12. As schematically shown in FIG. 6G, herein, the intermediate through hole 15A extends from the bottom surface 11b of the first recess 11 to a lateral surface which defines the conical shape of the first portion 12c of the second recess 12, and the inner space of the first recess 11 is in communication with the inner space of the second recess 12 via the intermediate through hole 15A. Likewise, in the configuration illustrated in FIG. 6H, the unit light-transmitting plate member 10 of the second light-emitting unit 101B has an intermediate through hole 15B extending from the first recess 11 to the second recess 12.

In the examples shown in FIG. 6G and FIG. 6H, the intermediate through hole 15A, 15B is located near the center of the unit light-transmitting plate member 10. The position at which the intermediate through hole 15A, 15B is located only needs to be a position where the first recess 11 overlaps the second recess 12 in plan view. The size of the intermediate through hole 15A and the size of the intermediate through hole 15B are smaller than the opening 11a at the first main surface 10a of a corresponding first recess 11 and the opening at the second main surface 10b of a corresponding second recess 12 in plan view. The center of the intermediate through hole 15A and/or 15B may be generally coincident with the deepest part of the first recess 11 or the deepest part of the second recess 12. The intermediate through holes 15A, 15B may be used as, for example, alignment marks in placing a light source (herein, the light source 20) in the first recess 11.

The intermediate through holes 15A, 15B have, for example, a cylindrical shape. As a matter of course, the shape of the intermediate through holes 15A, 15B is not limited to this example. For example, the inner lateral surface which defines the shape of the intermediate through holes 15A, 15B may be inclined from the normal direction of the first main surface 10a as viewed in cross section. The inner lateral surface which defines the shape of the intermediate through holes 15A, 15B is not limited to a linear shape as viewed in cross section but may have a shape which includes curved portions, bends, steps, etc.

The inside of the intermediate through hole 15A may be hollow or may be partially or entirely filled with, for example, a light-transmitting material. Also, it is not essential that the inside of the intermediate through hole 15B is hollow. For example, part of the inside of the intermediate through hole 15A and/or the intermediate through hole 15B may be occupied by the material of the light-transmitting member 50 or the material of the light-reflective member 40.

The intermediate through hole 15A may be provided in every one of the unit light-transmitting plate members 10 of at least one first light-emitting unit 101A included in the light-emitting module 201 or may be provided in some of the unit light-transmitting plate members 10 of at least one first light-emitting unit 101A. Also, it is not essential that the intermediate through hole 15B is provided in every one of the unit light-transmitting plate members 10 of a plurality of second light-emitting units 101B included in the light-emitting module 201. The intermediate through hole 15B may be selectively provided in some of the unit light-transmitting plate members 10 of the plurality of second light-emitting units 101B.

(Manufacturing Method of Light-Emitting Module 201)

The light-emitting module 201 may be manufactured according to, for example, the following method. First, a light-transmitting plate member 210 is provided in which a first recess 11 and a second recess 12 are provided in each of the unit regions 211 (see FIG. 2A, FIG. 2B and FIG. 2C). The die used in this step is configured to form such a cavity that, for example, for the first unit regions 211A, the center of the first recess 11 is not coincident with the center of the second recess 12 in which the lens structure is provided, while for the second unit regions 211B the center of the first recess 11 is coincident with the center of the second recess 12. The positions and number of the first light-emitting units 101A or the second light-emitting units 101B may be arbitrarily determined according to the shape of the cavity of the die. Note that, inside the cavity, one of a protrusion corresponding to the shape of the first recess 11 and a protrusion corresponding to the shape of the second recess 12 has a part which is in contact with the other, or a through hole extending from one of the first recess 11 and the second recess 12 to the other is formed after the shape of a light-transmitting plate member which has the first recess 11 and the second recess 12 is given, whereby the shape of the unit light-transmitting plate member 10 which has the intermediate through holes 15A, 15B is realized.

Then, an uncured material of the light-transmitting members 50A, 50B is provided in the first recess 11 of the unit light-transmitting plate member 10 using a dispenser or the like. In this step, the amount of an uncured material of a light-transmitting member to be provided in the first recess 11 of the first unit region 211A that is to be the first light-emitting unit 101A and the amount of an uncured material of a light-transmitting member to be provided in the first recess 11 of the second unit region 211B that is to be the second light-emitting unit 101B may be varied. For example, the amount of the uncured material to be provided in the first recess 11 of the first unit region 211A may be small as compared with the first recess 11 of the second unit region 211B such that, when the light source 20 is arranged and the material is cured, the first receding part 51A is formed in the upper surface 50Aa of the light-transmitting member 50A.

Thereafter, the light source 20 is arranged in the first recess 11, and the uncured material of the light-transmitting member is cured. Herein, the light source 20 is arranged in the first recess 11 such that the position of the optical axis of the light source 20 is generally coincident with the center of the first recess 11 in plan view. As will be described later, the light source 20 may be arranged in the first recess 11 such that the position of the optical axis of the light source 20 is offset from the center of the first recess 11. In this case, the arrangement of the light source 20 in the first recess 11 may be varied between the first unit regions 211A and the second unit regions 211B.

Then, a resin material in which a light-reflective filler is dispersed is applied to the first main surface 10a side of the unit light-transmitting plate member 10, and the resin material is cured. Further, a light-reflective resin layer resulting from curing of the resin material is ground till the electrodes 21t of the light source 20 are exposed. Thereby, a light reflecting layer 30 which covers the first main surface 10a of the unit light-transmitting plate member 10 can be formed.

Thereafter, an interconnect layer 60 is formed on the light reflecting layer 30. Also, in the second recess 12 of the second main surface 210b of the light-transmitting plate member 210, a light-reflective member 40 is formed by, for example, an inkjet method or the like. Thereby, a light-emitting module 201 is completed which includes the first light-emitting units 101A and the second light-emitting units 101B.

(Light Distribution Characteristics of First Light-Emitting Unit 101A and Second Light-Emitting Unit 101B)

Herein, the light distribution characteristics of the first light-emitting unit 101A and the second light-emitting unit 101B and the difference therebetween are described with reference to FIG. 7A and FIG. 7B. In each of the first light-emitting unit 101A and the second light-emitting unit 101B, light emitted from the light source 20 travels toward the second main surface 10b of the light-transmitting plate member. The second main surface 10b has the second recess 12, and part of the light traveling toward the second main surface 10b is reflected to the first main surface 10a side by the light-reflective member 40 provided in the second recess 12. The light traveling to the first main surface 10a is reflected by the light reflecting layer 30 and again travels to the second main surface 10b side.

As previously described, herein, the optical axis of the lens structure of the first light-emitting unit 101A is deviated to the positive side in Y direction in the drawing with respect to the optical axis of the light source 20. Therefore, light outgoing from the first unit region 211A is deviated with respect to the center of the first unit region 211A, and as a result, in FIG. 7A, different distributions of light are achieved between the left-side part and the right-side part of the light source 20. Specifically, as schematically shown in FIG. 7A, light emitted to the negative side in Y direction is likely to be reflected toward the periphery of the unit light-transmitting plate member 10, while larger part of light emitted to the positive side in Y direction is reflected toward the second main surface 10b of the unit light-transmitting plate member 10 at an angle close to the vertical. That is, particularly in a range on the positive side in Y direction of the first light-emitting unit 101A, the position of the optical axis of the lens structure is offset from the optical axis of the light source 20 and, therefore, light emitted from the light source 20 is likely to travel upward without diverging.

Meanwhile, in the second light-emitting unit 101B, the position of the optical axis of the lens structure is generally coincident with the position of the optical axis of the light source 20. Therefore, in the vicinity of the center of each of the second unit regions 211B, the distribution of light is symmetrical about the center of the second unit region 211B. As a result, according to the present embodiment, the first light-emitting unit 101A and the second light-emitting unit 101B can have different light distribution characteristics and, furthermore, the distribution of light can have anisotropy within a single first light-emitting unit 101A. Thus, according to the embodiment of the present disclosure, a light-emitting module can be provided in which, when seen as the entirety of the two-dimensional array of the plurality of light-emitting units 101, the light distribution characteristic of the light emission surface is partially adjustable.

(Use Form of Light-Emitting Module 201)

In each of the above-described examples, the first light-emitting unit 101A and the second light-emitting unit 101B have different light distribution characteristics. More specifically, in the second light-emitting unit 101B, the angular range in which the luminous intensity is half the luminous intensity on the optical axis of the light source 20 is generally symmetrical about the optical axis in both of the YZ plane and the ZX plane. Meanwhile, in the first light-emitting unit 101A, the angular range in which the luminous intensity is half the luminous intensity on the optical axis of the light source 20 is asymmetrical about the optical axis in Y direction. Particularly, when the light distribution characteristic in Y direction is compared between the first light-emitting unit 101A and the second light-emitting unit 101B, the angular range in which the luminous intensity is half the luminous intensity on the optical axis of the light source 20 on the positive side in Y direction is smaller in the first light-emitting unit 101A.

Herein, in an embodiment of the present disclosure, in the light-emitting module 201, the positions and number of the first light-emitting units 101A may be arbitrarily selected. The number of the first unit regions 211A included in the light-transmitting plate member 210 of a single light-emitting module 201 may be one or may be plural. The plurality of unit regions 211 only need to include at least one first unit region 211A. Note that when the plurality of unit regions 211 include a plurality of first unit regions 211A, it is not essential that all of the first unit regions 211A are arranged in succession within a single light-transmitting plate member 210.

Due to such features, the light-emitting module 201 can have conflicting characteristics, the versatility and the light distribution characteristic that depends on its use. For example, the light-emitting module 201 can be suitably used as a backlight for liquid crystal display devices.

Figure 8A:
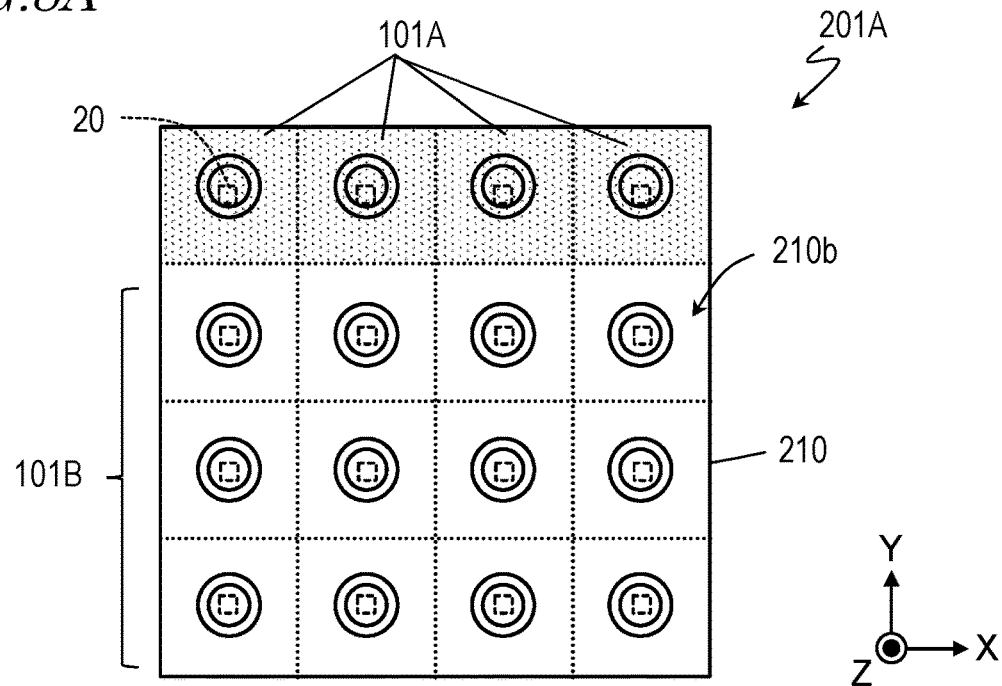
FIG. 8A is a schematic top view showing a configuration example of the light-emitting module.
Figure 8B:
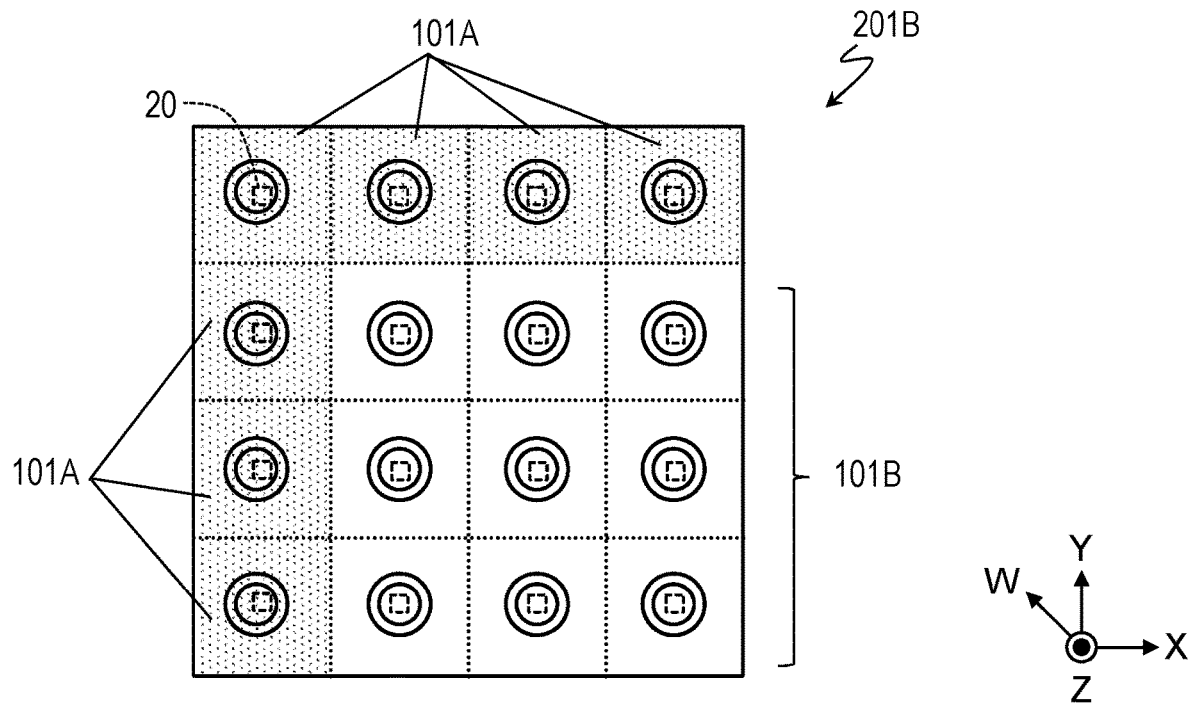
FIG. 8B is a schematic top view showing another configuration example of the light-emitting module.
Figure 8C:
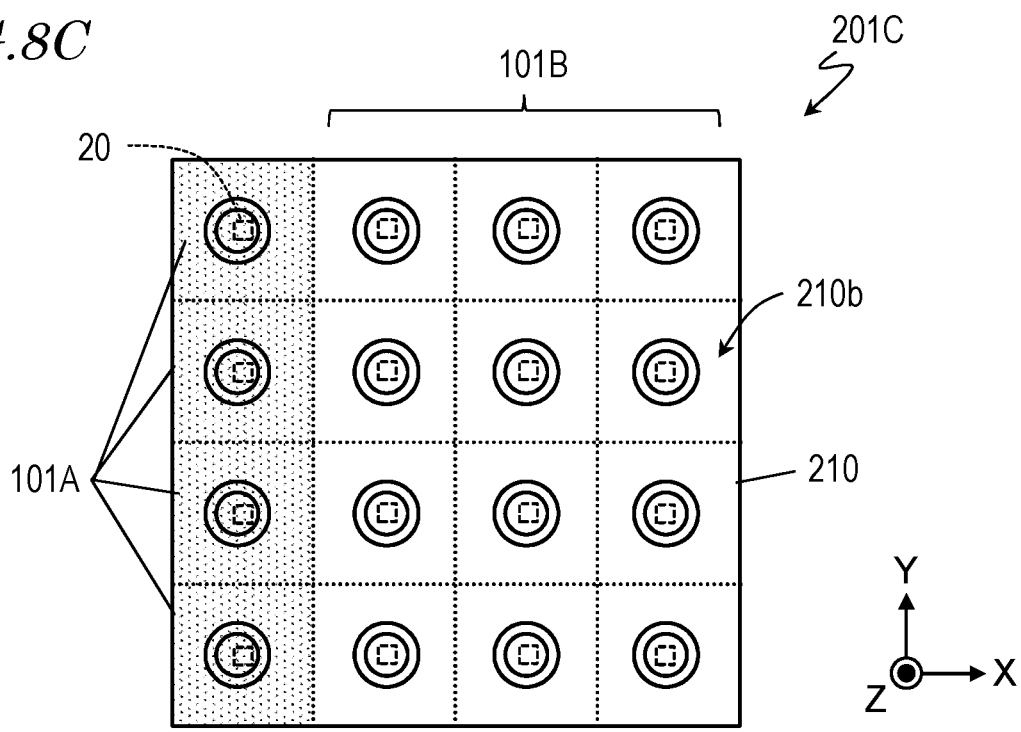
FIG. 8C is a schematic top view showing still another configuration example of the light-emitting module.

FIG. 8A, FIG. 8B and FIG. 8C show exemplary arrays of the first light-emitting units 101A and the second light-emitting units 101B in the light-emitting module. The light-emitting module 201A shown in FIG. 8A includes 16 unit regions 211 in total which are arrayed in 4 rows and 4 columns likewise as in the example previously described with reference to FIG. 1B. In this example, 4 first light-emitting units 101A are located in the first row, so that 4 first unit regions 211A are aligned along one side of the rectangular shape of the second main surface 210b of the light-transmitting plate member 210. When the first light-emitting unit 101A of each of the first unit regions 211A is considered, herein, the lens structure is provided in the second main surface 210b such that the optical axis of the lens structure is "offset" in +Y direction in the drawing with respect to the optical axis of the light source 20 in a range of, for example, not less than 25 μm and not more than 250 μm so as not to be coincident with the optical axis of the light source 20. Meanwhile, the remaining ones of the 16 unit regions 211 are the second unit regions 211B in which the second light-emitting units 101B are located. For the sake of clarity, in FIG. 8A, among the plurality of unit regions 211, the positions of the first unit regions 211A are shaded. The same also applies to FIG. 8B and FIG. 8C which will be described in the following paragraphs.

In the light-emitting module 201B shown in FIG. 8B, 7 first light-emitting units 101A in total are located at the positions of the first row and the first column in the array of 4 rows and 4 columns, and 9 second light-emitting units 101B in total are located at the remaining positions. Herein, among 4 first light-emitting units 101A at the upper side of the light-transmitting plate member 210, i.e., in the first row of the array of 4 rows and 4 columns, in each of 3 first light-emitting units 101A located in the second, third and fourth columns, the arrangement of the lens structure is "offset" in +Y direction in the drawing with respect to the optical axis of the light source 20 likewise as in the example shown in FIG. 8A. Among 4 first light-emitting units 101A at the left side of the light-transmitting plate member 210, i.e., in the first column of the array of 4 rows and 4 columns, in each of 3 first light-emitting units 101A in the second, third and fourth rows, the arrangement of the lens structure is "offset" in −X direction in the drawing with respect to the optical axis of the light source 20.

In the example shown in FIG. 8B, furthermore, in one of the 7 first light-emitting units 101A which is at the corner of the rectangular shape of the light-transmitting plate member 210, the arrangement of the lens structure is "offset" to the positive side in W direction with respect to the optical axis of the light source 20 where W direction forms an angle of 135° with respect to X direction. In other words, in FIG. 8B, in the first light-emitting unit 101A at the upper left corner of the light-transmitting plate member 210, the arrangement of the second recess 12 is adjusted such that the optical axis of the lens structure is closer to the corner of the light-transmitting plate member 210. Thus, the direction of the "offset" of the optical axis of the lens structure with respect to the optical axis of the light source 20 is not limited to a direction parallel with one side of the rectangular shape of the second main surface 210b of the light-transmitting plate member 210.

In the light-emitting module 201C shown in FIG. 8C, 4 first light-emitting units 101A in total are located at the positions of the first column in the array of 4 rows and 4 columns, and 12 second light-emitting units 101B in total are located at the positions of the second, third and fourth columns. When the first light-emitting unit 101A of each of the first unit regions 211A shown in FIG. 8C is considered, herein, the optical axis of the lens structure is "offset" in –X direction in the drawing with respect to the optical axis of the light source 20.

As described herein, the light-emitting modules 201A, 201B and 201C each include a plurality of light-emitting units 101 two-dimensionally arrayed in row and column directions. A plurality of first light-emitting units 101A are located in the outermost row or column of the array of the plurality of light-emitting units 101. In this case, a plurality of unit regions 211 of the light-transmitting plate member 210 are two-dimensionally arrayed in row and column directions. A plurality of first unit regions 211A are located in the outermost row or column of the array of the plurality of unit regions 211.

Figure 8D:
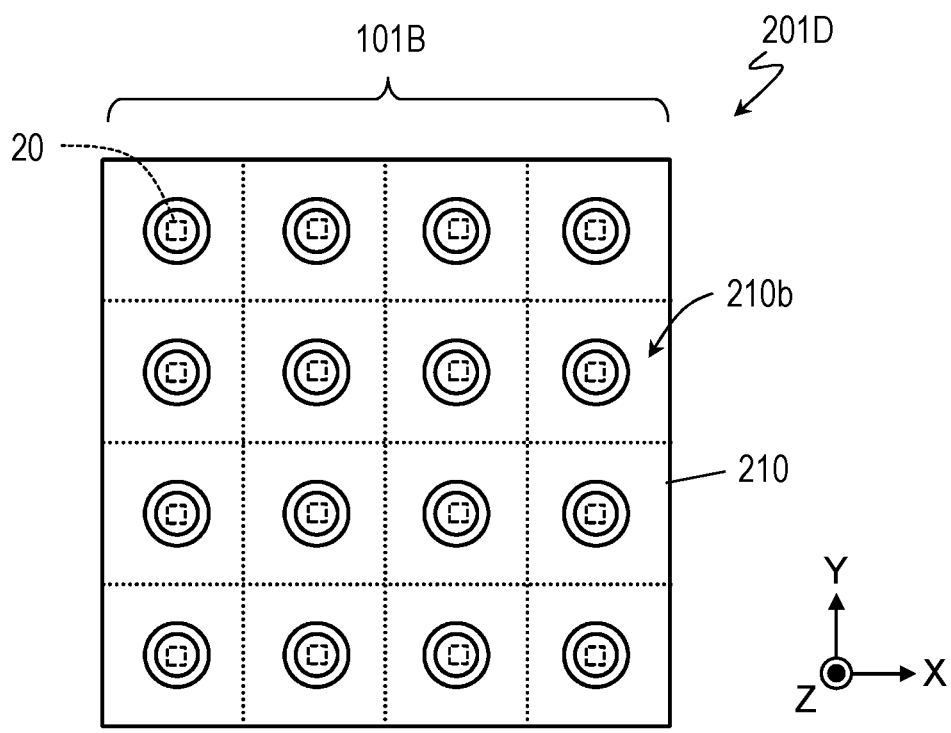
FIG. 8D is a schematic top view showing still another configuration example of the light-emitting module.

In contrast, the light-emitting module 201D shown in FIG. 8D includes only the second light-emitting units 101B. As will be described in the following paragraphs, a plurality of pieces of the light-emitting modules 201A, 201B and 201C and the light-emitting module 201D of the present embodiment are provided and combined into a two-dimensional array, whereby a surface-emission light source can be constructed which has a larger light emission surface.

FIG. 9 schematically shows an example of a backlight which can be constructed using the light-emitting modules 201A, 201B, 201C and 201D. The backlight 301 shown in FIG. 9 is constructed by arraying a plurality of light-emitting modules in 8 rows and 16 columns, each of the plurality of light-emitting modules including unit regions 211 arrayed in 4 rows and 4 columns. The entire light emission surface of the backlight 301 has a rectangular shape. When the longitudinal length L and transverse length W of each of the light-emitting modules are, for example, about 24.3 mm and about 21.5 mm, respectively, the backlight 301 is conformable to a liquid crystal panel which has a 15.6-inch screen size at the aspect ratio of 16:9.

As shown in FIG. 9, the backlight 301 includes the above-described light-emitting modules 201A, 201B, 201C and 201D. In the backlight 301, the light-emitting modules 201A, 201B, 201C and 201D are arranged such that the first light-emitting units 101A are close to four sides SU, SD, SR, SL that define the rectangular shape of the light emission surface. Specifically, at the perimeter (or outermost part) of the array of the light-emitting modules in 8 rows and 16 columns, any of the light-emitting modules 201A, 201B and 201C is provided, while at the remaining positions, the light-emitting modules 201D are provided.

For example, at the upper left corner (the corner between the side SU and the side SL) of the backlight 301, a light-emitting module 201B shown in FIG. 8B is provided. Likewise, also at the lower left corner (the corner between the side SL and the side SD), the lower right corner (the corner between the side SD and the side SR) and the upper right corner (the corner between the side SR and the side SU) of the backlight 301, light-emitting modules 201B are provided. Note that, however, the light-emitting modules 201B at these corners are rotated by 90°, 180° and 270° about the Z axis from the state shown in FIG. 8B. In other words, the light-emitting modules 201B in the backlight 301 are oriented at the respective positions such that the first light-emitting units 101A are located at the outermost part. That is, the first unit regions 211A of these light-emitting modules 201B are located close to the perimeter of the rectangular shape of the light emission surface as compared with the second unit regions 211B.

At the positions which are in contact with the side SL except for the aforementioned corners, 6 light-emitting modules 201C are provided. Also, at the positions which are in contact with the side SR that is opposite to the side SL except for the aforementioned corners, 6 light-emitting modules 201C are provided. Note that, however, in the backlight 301, the light-emitting modules 201C at the positions which are in contact with the side SR are the horizontally flipped version of the light-emitting modules 201C which are in contact with the side SL. That is, at the respective positions in the backlight 301, the light-emitting modules 201C each of which includes 4 first unit regions 211A along one side of the rectangular shape of the second main surface 210b are oriented such that the first light-emitting units 101A are located in the outermost part of the backlight 301.

At the positions which are in contact with the side SU and at the positions which are in contact with the side SD, 14 light-emitting modules 201A are provided on each side. At the respective positions, the light-emitting modules 201A are oriented such that the first light-emitting units 101A are located at the outermost part. At the other positions than the outermost light-emitting modules, light-emitting modules 201D are arrayed in 6 rows and 14 columns.

In the backlight 301, in ones of a plurality of two-dimensionally arrayed light-emitting units which are in the outermost part, the angular range in which the luminous intensity is half the luminous intensity on the optical axis of the light source 20 is relatively small on the periphery side of the backlight 301. In other words, the divergence of light to the outside of the backlight 301 is reduced as compared with the other light-emitting units in the backlight 301. Therefore, leakage of light to the surroundings of the backlight 301 is suppressed. Particularly when the backlight is used in a narrow-frame liquid crystal display device or the like, the surrounding area of a liquid crystal display panel is narrow, and it is difficult to form a structure for blocking light spreading outward from the backlight. Even in such a case, by using the backlight 301, leakage of light to the surroundings of the backlight 301 can be suppressed. Meanwhile, the light-emitting units located at the other positions than the outermost positions have a relatively wide beam angle so that unevenness in luminance is suppressed in large part of the light emission surface. Thus, by using the light-emitting modules 201A, 201B, 201C and 201D, the backlight 301 can be realized which has such excellent emission characteristics.

As described above, in each of the light-emitting modules 201, the positions and number of the light-emitting units 101A can be arbitrarily selected. The first light-emitting unit 101A can be formed by, for example, adjusting the arrangement and shape of protrusions in the cavity of the die according to a desired light distribution characteristic. Therefore, for changing the light distribution characteristic of some of the light-emitting units in the light-emitting module, it is not necessary to provide a plurality of types of light-transmitting plate members according to the positions and number of the light-emitting units or a plurality of types of light sources which have different beam angles. Further, according to the number of combinations of the light-emitting modules, the size as a surface-emission light source and the aspect ratio of the screen can be arbitrarily changed. Thus, the light-emitting module 201 is excellent in versatility and can provide emission characteristics according to its use.

When the plurality of unit regions 211 include two or more first unit regions 211A, the offset of the position of the optical axis of the lens structure with respect to the position of the optical axis of the light source 20 may be equal, or may be different, among the two or more first unit regions 211A. It is not essential in the embodiments of the present disclosure that the offset of the position of the optical axis of the lens structure with respect to the position of the optical axis of the light source 20 is equal among the plurality of first unit regions 211A.

In a two-dimensional array of a plurality of light-emitting modules, between two light-emitting modules adjoining in the row or column direction, the light-transmitting plate members 210 are typically in direct contact with each other. However, between the two adjoining light-transmitting plate members 210, a light guiding structure may be interposed for optically coupling these light-transmitting plate members 210. Such a light guiding structure can be formed by, for example, applying a light-transmitting adhesive agent to lateral surfaces of the light-transmitting plate members 210 and thereafter curing the applied adhesive agent. Alternatively, a light guiding structure may be formed by two-dimensionally arraying light-emitting modules 201A, 201B, 201C and 201D with gaps therebetween, filling a region between two adjoining light-transmitting plate members 210 with a light-transmitting resin material, and thereafter curing the resin material. The material of the light guiding structure located between the light-transmitting plate members 210 can be the same as, or similar to, the material of the above-described bonding member 23.

In the light-emitting modules 201A, 201B, 201C and 201D of the backlight 301, the interconnect layers 60 of the respective light-emitting modules may be electrically coupled together such that they can be concurrently driven. Alternatively, the interconnect layers 60 of the respective light-emitting modules may be electrically coupled together such that one or a plurality of light-emitting modules can be separately driven for local dimming.

Second Embodiment

In the foregoing embodiment, in the first unit regions 211A included in the plurality of unit regions 211, the optical axis of the lens structure is not coincident with the optical axis of the light source 20. Accordingly, light emitted from the first light-emitting unit 101A is deviated with respect to the center axis of the first unit region 211A. Thus, the first unit regions 211A are provided in the outermost part of the light-emitting module, and the direction of the offset of the optical axis of the lens structure from the optical axis of the light source 20 is adjusted such that the emitted light is deviated to the inside, whereby leakage of light from, for example, a casing (chassis) which supports an aggregate of a plurality of light-emitting modules can be suppressed.

Herein, in each of the above-described examples, the shape of each of the plurality of unit regions 211 that include one or more first unit regions 211A is rectangular in plan view. In each of the first unit regions 211A, the center of the first recess 11 is coincident with the center of the rectangular shape of the first unit region 211A. The light source 20 is provided inside the first recess 11 such that the position of the optical axis of the light source 20 is generally coincident with the center of the first recess 11. That is, in the previously-described examples, the position of the optical axis of the lens structure is offset in a certain direction relative to the center of the first unit region 211A at the second main surface 210b. However, the structure which is capable of deviating light emitted from the first light-emitting unit 101A with respect to the center axis of the first unit region 211A is not limited to a structure in which the position of the optical axis of the lens structure is offset with respect to the center of the first unit region 211A.

Figure 10A:
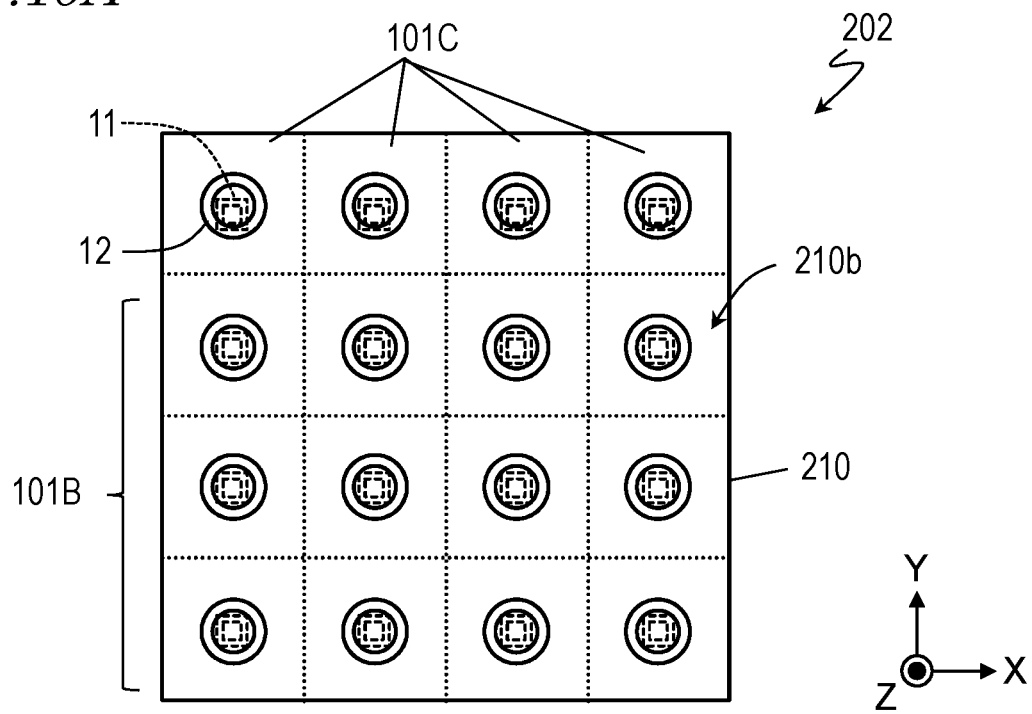
FIG. 10A is a schematic top view of a light-emitting module of the second embodiment of the present disclosure.

FIG. 10A is a schematic top view of an exemplary light-emitting module of the second embodiment of the present disclosure. As compared with a light-emitting module 201A which has previously been described with reference to FIG. 8A, the light-emitting module 202 shown in FIG. 10A includes first light-emitting units 101C in place of the first light-emitting units 101A. Specifically, the light-emitting module 202 includes at least one first light-emitting unit 101C and a plurality of second light-emitting units 101B.

Figure 10B:
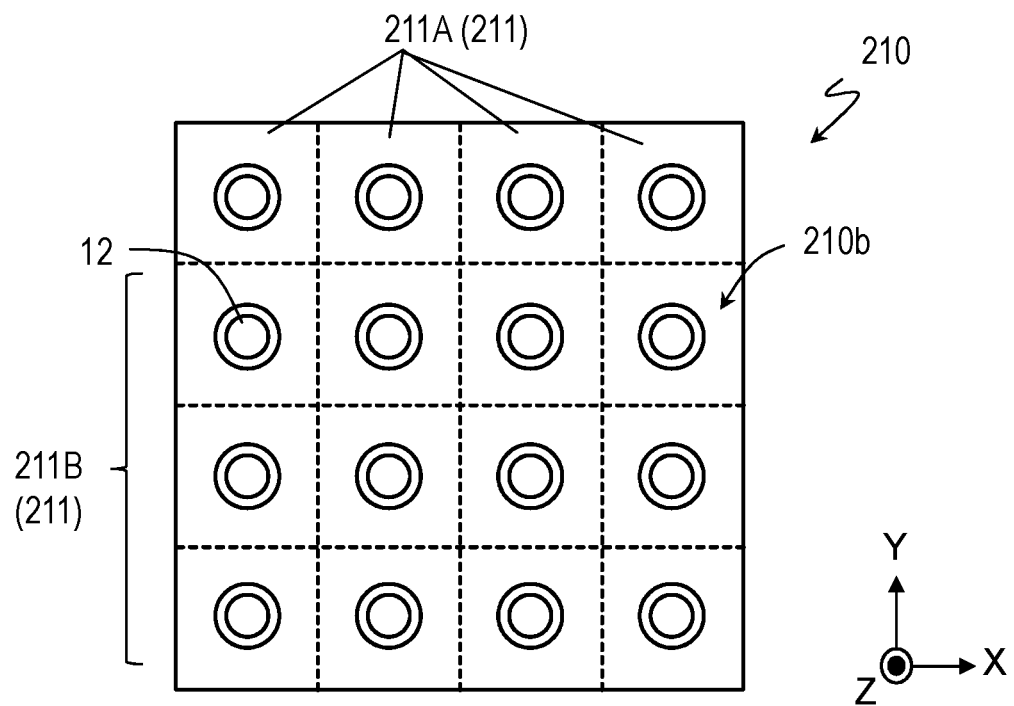
FIG. 10B is a schematic top view of a light-transmitting plate member of the light-emitting module shown in FIG. 10A.

In this example, in each of the first light-emitting units 101C, the center of the second recess 12 in which the lens structure is provided is generally coincident with the center of the rectangular shape of a corresponding first unit region 211A. That is, herein, in each of the first light-emitting units 101C, the position of the optical axis of the lens structure is coincident with the center of the rectangular shape of a corresponding first unit region 211A. FIG. 10B schematically shows an example of the appearance of the light-transmitting plate member of the light-emitting module 202 as viewed from the second main surface 210b side. As shown in FIG. 10B, herein, in each of the unit regions 211, the relationship in position between the center of the rectangular shape and the center of the second recess 12 is common among the plurality of unit regions 211.

Meanwhile, in each of the first light-emitting units 101C, the position of the center of the first recess 11 is offset from the center of the rectangular shape of a corresponding first unit region 211A. In this example, the position of the center of the first recess 11 is offset in −Y direction in the drawing with respect to the center of the rectangular shape of the first unit region 211A. Note that, herein, the light source 20 is provided inside the first recess 11 such that the optical axis of the light source 20 is coincident with the center of the first recess 11.

Such a relationship in arrangement between the optical axis of the lens structure and the center of the first recess 11 can also realize such a light distribution characteristic that the angular range in which the luminous intensity is half the luminous intensity on the optical axis of the light source 20 is smaller on the positive side than on the negative side in Y direction as in the first light-emitting unit 101A. Such a configuration that the position of the optical axis of the lens structure is relatively offset with respect to the optical axis of the light source 20 can realize the same light distribution characteristic as that of the first embodiment.

FIG. 10C is a schematic top view of another exemplary light-emitting module of the second embodiment of the present disclosure. As compared with the light-emitting module 202 shown in FIG. 10A, the light-emitting module 202 shown in FIG. 10C includes first light-emitting units 101D in place of the first light-emitting units 101C.

Considering each of the first light-emitting units 101D, also in this example, the position of the center of the first recess 11 is offset in −Y direction in the drawing from the center of the rectangular shape at the first main surface 10a of the unit light-transmitting plate member 10 of a corresponding first unit region 211A likewise as in the example previously described with reference to FIG. 10A. Further, in this example, in each of the first light-emitting units 101D, the optical axis of the lens structure is offset from the center of the rectangular shape at the second main surface 210b.

Particularly in this example, the position of the center of the first recess 11 is offset in −Y direction in the drawing from the center of the rectangular shape of the first unit region 211A, while the optical axis of the lens structure of that first unit region 211A is offset in +Y direction in the drawing from the center of the rectangular shape of the first unit region 211A. In the identical first unit region 211A, both the center of the first recess 11 and the optical axis of the lens structure are offset with respect to the center of the rectangular shape of that first unit region 211A, whereby the distance between the center of the first recess 11 and the optical axis of the lens structure can be increased. In this case, the direction of the offset of the center of the first recess 11 with respect to the center of the rectangular shape of the first unit region 211A may be opposite to (antiparallel with) the direction of the offset of the optical axis of the lens structure as in this example.

The direction of the "offset" of the center of the first recess 11 and the optical axis of the lens structure with respect to the center of the rectangular shape of the first unit region 211A only needs to be perpendicular to Z direction. The direction of this offset can be parallel with either of two adjoining sides of the rectangular shape of the first unit region 211A as in the examples of FIG. 8A, FIG. 8C, FIG. 10A and FIG. 10C.

Alternatively, the direction of the "offset" may be parallel with a diagonal direction of the rectangular shape of the first unit region 211A as in the example of the offset of the optical axis of the lens structure in the first light-emitting unit 101A at the upper left corner of the light-transmitting plate member 210, which has previously been described with reference to FIG. 8B. The direction of the offset of the center of the first recess 11 and/or the optical axis of the lens structure with respect to the center of the first unit region 211A may be non-parallel with two adjoining sides of the rectangular shape of the first unit region 211A. For example, the amount and direction of the offset of the center of the first recess 11 and the amount and direction of the offset of the optical axis of the lens structure relative to the center of the first unit region 211A may be separately controlled. Such a configuration enables finer adjustment of the light distribution characteristic.

Third Embodiment

Figure 10D:
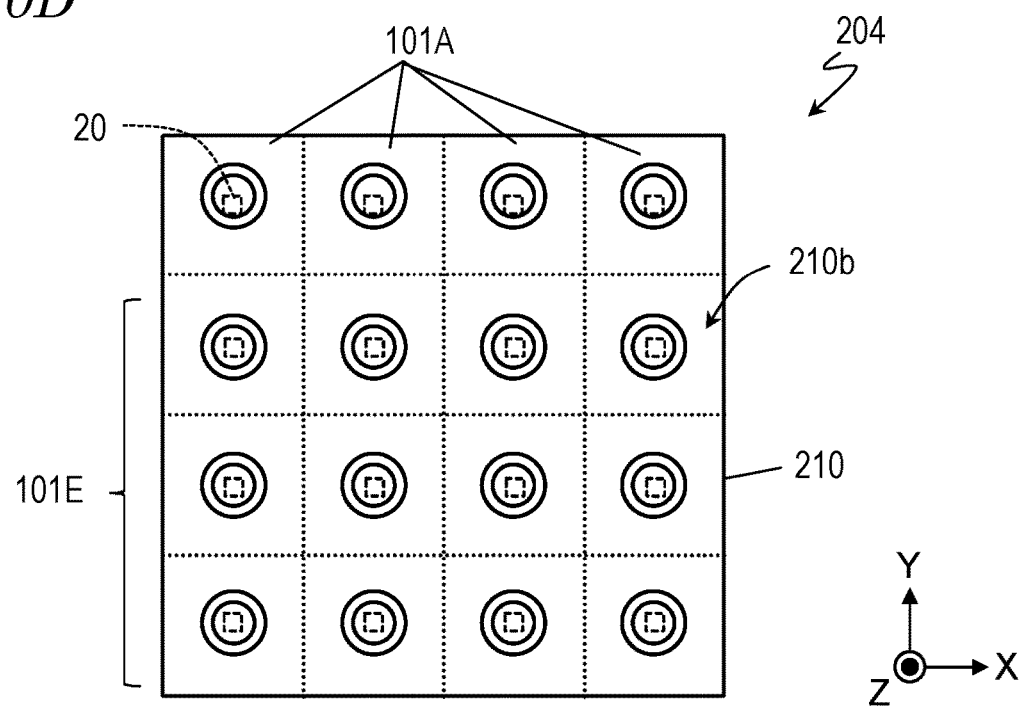
FIG. 10D is a schematic top view of a light-emitting module of the third embodiment of the present disclosure.

FIG. 10D is a schematic top view of an exemplary light-emitting module of the third embodiment of the present disclosure. As compared with the light-emitting module 201A which has previously been described with reference to FIG. 8A, the light-emitting module 204 shown in FIG. 10D is different from the light-emitting module 201 of the first embodiment in that the light-emitting module 204 includes third light-emitting units 101E in place of the second light-emitting units 101B. Specifically, the light-emitting module 202 includes at least one first light-emitting unit 101A and a plurality of third light-emitting units 101E. Note that, however, herein, the upper surface 50Aa of the light-transmitting member 50A of each first light-emitting unit 101A has a first receding part 51A as in the example previously described with reference to FIG. 6D.

The appearance of the light-transmitting plate member 210 of the light-emitting module 204 as taken out and viewed from the second main surface 210b side is basically the same as the appearance shown in FIG. 2A and, therefore, illustration thereof is herein omitted. In the light-transmitting plate member 210, the second unit regions 211C are provided at the positions of the third light-emitting units 101E. This feature is the same as that of the light-transmitting plate member 210 of the light-emitting module 201 shown in FIG. 2A.

Figure 10E:
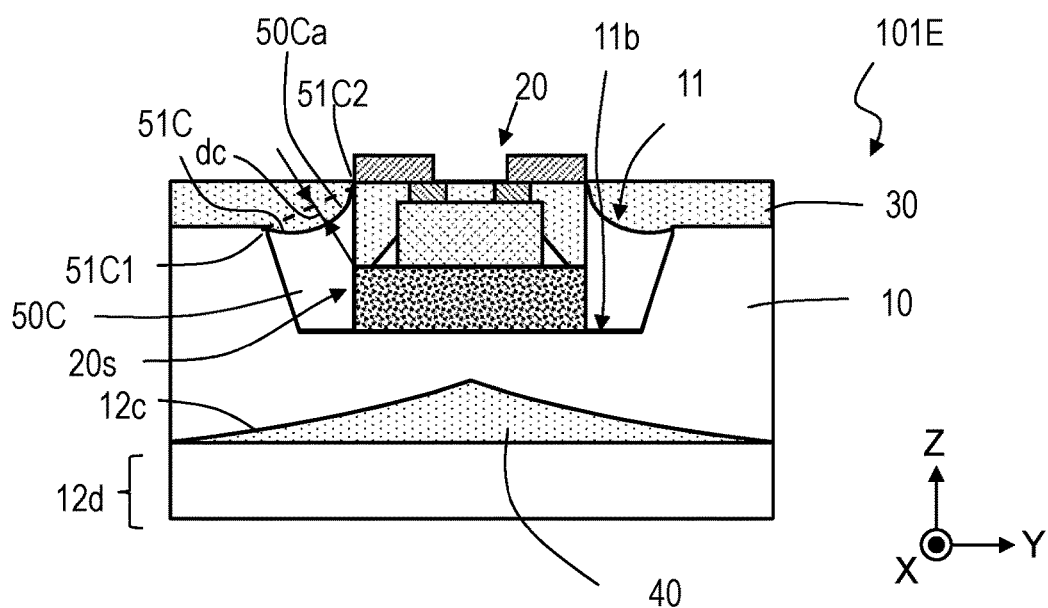
FIG. 10E is an enlarged schematic cross-sectional view of a third light-emitting unit of the light-emitting module shown in FIG. 10D.

FIG. 10E is a schematic cross-sectional view enlargedly showing the vicinity of the first recess 11 of the third light-emitting unit 101E. The configuration of the first light-emitting unit 101A of the present embodiment is the same as the configuration of the first light-emitting unit 101A of the first embodiment and, hence, the illustration and description thereof are omitted.

As shown in FIG. 10E, in the third light-emitting unit 101E, an upper surface 50Ca of a light-transmitting member 50C has a second receding part 51C receding to the bottom surface 11b side of the first recess 11. The depth dc of the second receding part 51C is smaller than the depth of the first receding part 51A of the first light-emitting unit 101A. Herein, the depth dc refers to the distance in a cross section as measured perpendicularly from the line between the point 51C1 at which the upper surface 50Ca is in contact with the inner lateral surface of the first recess 11 and the point 51C2 at which the upper surface 50Ca is in contact with the lateral surface 20s of the light source 20. The depth of the first receding part 51A of the first light-emitting unit 101A is also defined as the distance in a cross section as measured perpendicularly from the line between the point 51A1 at which the upper surface 50Aa is in contact with the inner lateral surface of the first recess 11 and the point 51A2 at which the upper surface 50Aa is in contact with the lateral surface 20s of the light source 20 (broken line in FIG. 6D).

Since the depth dc of the second receding part 51C of the third light-emitting unit 101E is smaller than the depth of the first receding part 51A of the first light-emitting unit 101A, the beam angle of the third light-emitting unit 101E is greater than the beam angle of the first light-emitting unit 101A. Therefore, a backlight which achieves the same effects as those of the first or second embodiment may also be realized by producing a plurality of types of light-emitting modules such as shown in, for example, FIG. 8A, FIG. 8B and FIG. 8C using the light-emitting module 204.

Fourth Embodiment

Figure 11A:
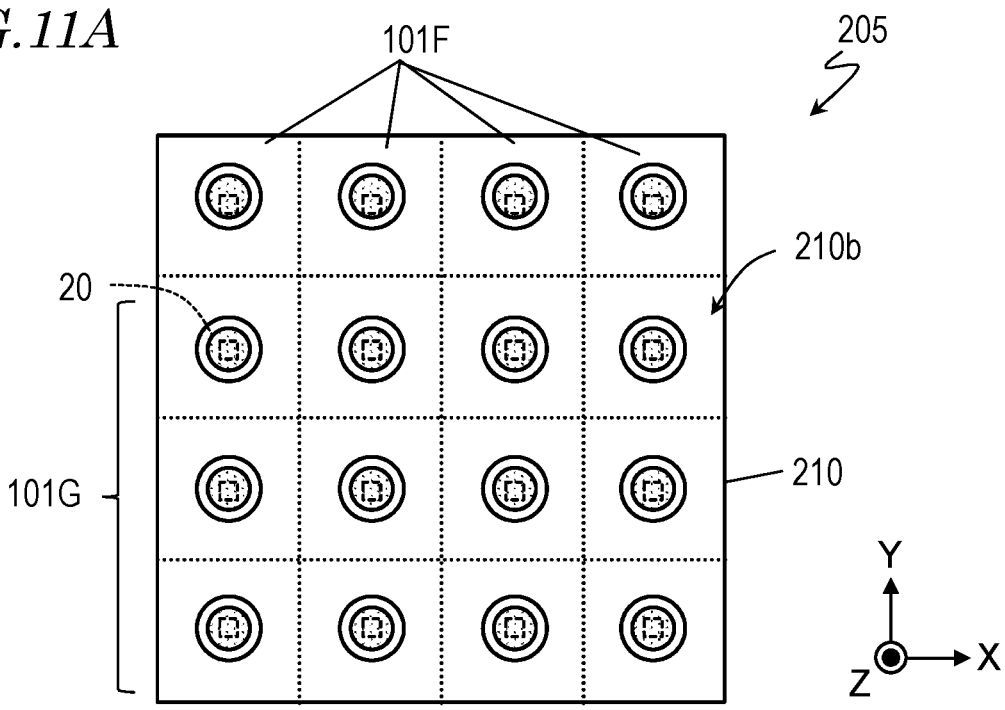
FIG. 11A is a schematic top view of a light-emitting module of the fourth embodiment of the present disclosure.

FIG. 11A is a schematic top view of an exemplary light-emitting module of the fourth embodiment of the present disclosure. As compared with the example previously described with reference to FIG. 1B, a light-emitting module 205 shown in FIG. 11A includes 4 first light-emitting units 101F and 12 second light-emitting units 101G in place of 4 first light-emitting units 101A and 12 second light-emitting units 101B. Each of the plurality of light-emitting units 101 that include the first light-emitting units 101F and the second light-emitting units 101G includes a lens structure on the second main surface 210b side as in the foregoing examples.

Figure 11B:
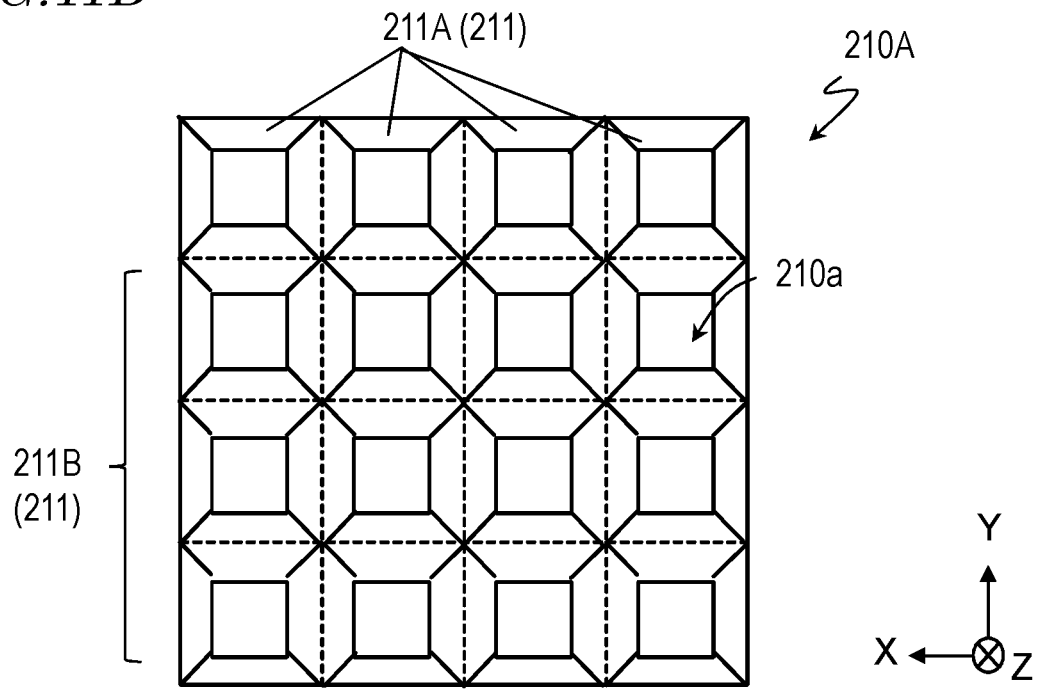
FIG. 11B is a schematic bottom view of a light-transmitting plate member of the light-emitting module shown in FIG. 11A.
Figure 11C:
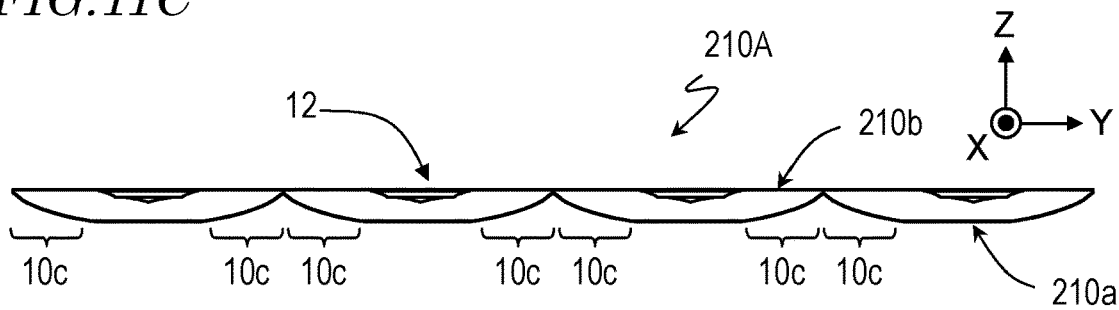
FIG. 11C is a schematic cross-sectional view of a light-transmitting plate member of the light-emitting module shown in FIG. 11A.

FIG. 11B and FIG. 11C are, respectively, a schematic bottom view and a schematic cross-sectional view of a light-transmitting plate member taken out of the light-emitting module 205 shown in FIG. 11A. As in the above-described examples, the light-transmitting plate member 210A shown in FIG. 11B and FIG. 11C includes at least one first unit region 211A and a plurality of second unit regions 211B. As seen from the comparison between FIG. 11A and FIG. 11B, in this example, the first light-emitting units 101A are provided at the positions of the first unit regions 211A included in the plurality of unit regions 211, and the second light-emitting units 101B are provided at the positions of the second unit regions 211B included in the plurality of unit regions 211.

As schematically shown in FIG. 11B and FIG. 11C, in the present embodiment, the light-transmitting plate member 210A does not have a first recess on the first main surface 210a side. Therefore, herein, the first main surface 210a of the light-transmitting plate member 210A exclusive of a curved surface portion 10c, in other words, part of the first main surface 210a which is the most distant from the second main surface 210b, is a flat surface. As will be described later, in the present embodiment, in each of the light-emitting units 101, the light source 20 is bonded to a flat region of the first main surface 210a so as to be provided on the first main surface 210a side of the light-transmitting plate member 210A. The present embodiment is the same as the above-described embodiments in that, in the first unit regions 211A, the optical axis of the lens structure is not coincident with the optical axis of the light source 20.

Figure 11D:
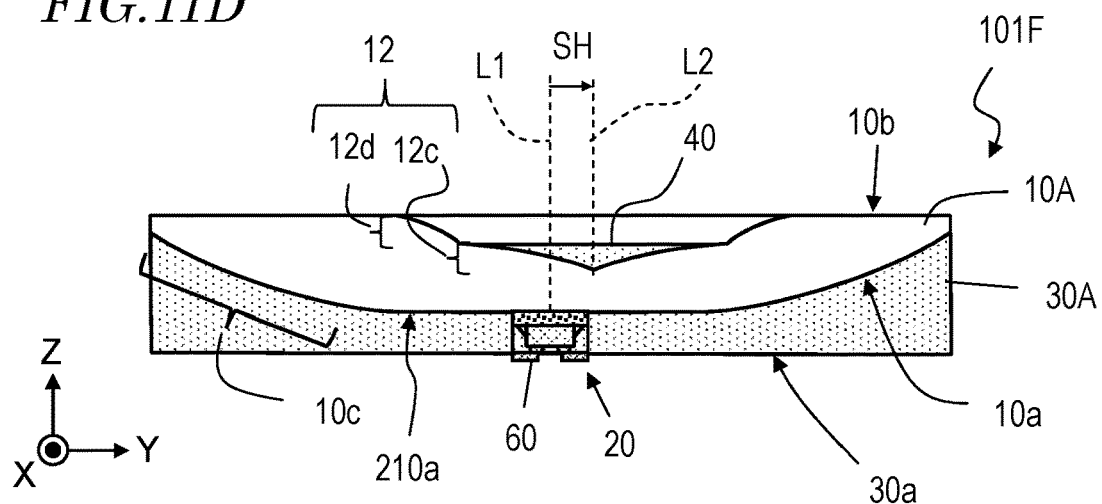
FIG. 11D is a schematic cross-sectional view of the first light-emitting unit of the light-emitting module shown in FIG. 11A.
Figure 11E:
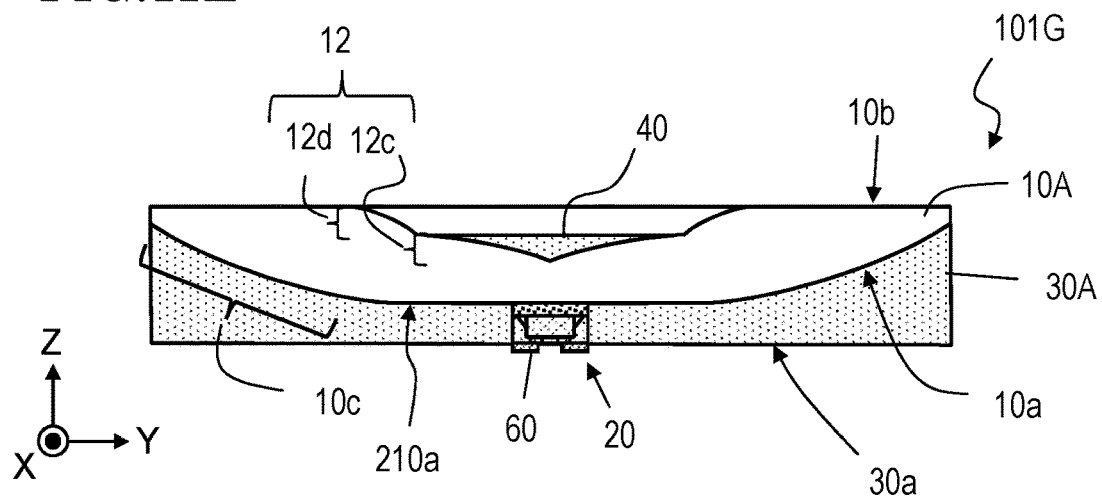
FIG. 11E is a schematic cross-sectional view of the second light-emitting unit of the light-emitting module shown in FIG. 11A.

FIG. 11D and FIG. 11E are, respectively, schematic cross-sectional views of the first light-emitting unit 101F and the second light-emitting unit 101G which are shown in FIG. 11A. The unit light-transmitting plate member 10A shown in FIG. 11D and FIG. 11B is a portion of the light-transmitting plate member 210A shown in FIG. 11B and FIG. 11C which corresponds to each of the unit regions 211. In the first unit regions 211A, the optical axis of the lens structure is not coincident with the optical axis of the light source 20 while, in the second unit regions 211B, the optical axis of the lens structure is generally coincident with the optical axis of the light source 20. The first light-emitting units 101F and the second light-emitting units 101G have common features except for the relationship in position between the optical axis of the lens structure and the optical axis of the light source 20.

As previously described with reference to FIG. 11B and FIG. 11C, herein, the first main surface 210a of the light-transmitting plate member 210A is substantially flat. As shown in FIG. 11D and FIG. 11E, in each of the light-emitting units 101, the light source 20 is bonded to a flat region of the first main surface 210a of the light-transmitting plate member 210A. In bonding the light source 20 to the light-transmitting plate member 210A, a resin composition may be used which is the same as, or similar to, the material of the light-transmitting members 50A, 50B.

In the configuration illustrated in FIG. 11B and FIG. 11C, the first light-emitting unit 101F and the second light-emitting unit 101G include a light reflecting layer 30A which covers the lateral surfaces of the light source 20 on the first main surface 10a side of the unit light-transmitting plate member 10A. The interconnect layer 60 is located on the first main surface 30a of the light reflecting layer 30A.

Herein, in each of the light-emitting units 101, the light source 20 is provided on the first main surface 10a side of the unit light-transmitting plate member 10A such that the optical axis of the light source 20 is coincident with the center of the unit region 211 at the first main surface 210a. Of the first unit regions 211A and the second unit regions 211B, in the first unit regions 211A, as shown in FIG. 11A and FIG. 11D, the position of the optical axis of the lens structure is offset by a predetermined distance in a certain direction from the center of the first unit region 211A at the second main surface 210b (herein, +Y direction in the drawings). Note that, however, the configuration where the position of the optical axis of the lens structure and the position of the optical axis of the light source 20 may be offset selectively in the first unit regions 211A is not limited to this example.

For example, in the first unit region 211A, the position of the optical axis of the lens structure may be coincident with the center of the first unit region 211A at the second main surface 210b. In this case, the position of the optical axis of the light source 20 is offset in the XY plane from the center of the first unit region 211A at the first main surface 210a. Such a configuration can also provide the same effects as those of the configuration where in the first unit region 211A the position of the optical axis of the lens structure is offset from the center of the first unit region 211A at the second main surface 210b.

Alternatively, in the first unit region 211A, the position of the optical axis of the lens structure may be offset in the XY plane from the center of the first unit region 211A at the second main surface 210b, and the position of the optical axis of the light source 20 may also be offset from the center of the first unit region 211A at the first main surface 210a. Separately controlling the amount and direction of the offset of the optical axis of the lens structure relative to the center of the first unit region 211A and the amount and direction of the offset of the optical axis of the light source 20 relative to the center of the first unit region 211A enables finer adjustment of the light distribution characteristic. In such a configuration, the direction of the offset of the optical axis of the lens structure and the direction of the offset of the optical axis of the light source 20 may be opposite to (antiparallel with) each other. According to such a configuration, it is easy to increase the distance from the optical axis of the lens structure to the optical axis of the light source 20.

Other Embodiments

Figure 12:
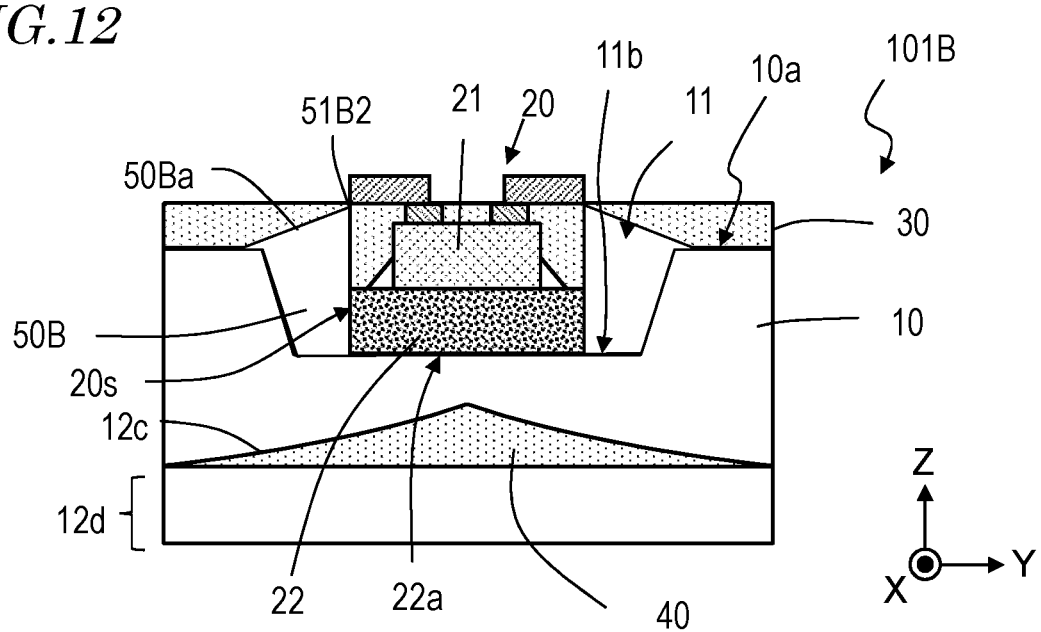
FIG. 12 is an enlarged schematic cross-sectional view showing another example of the shape of a light-transmitting member of the second light-emitting unit.

The light-emitting module of the present disclosure is not limited to the above-described embodiments but can be variously modified. FIG. 12 is a schematic cross-sectional view enlargedly showing a cross section in the vicinity of the first recess 11 of the second light-emitting unit 101B. FIG. 12 shows another example of the shape of the light-transmitting member 50B. In the example described with reference to FIG. 6C, the light-transmitting member 50B is provided only in the first recess 11. However, the shape of the light-transmitting member 50 is not limited to this example. As shown in FIG. 12, part of the light-transmitting member 50 may be present on the first main surface 10a of the unit light-transmitting plate member 10 at the periphery of the first recess 11.

Figure 13:
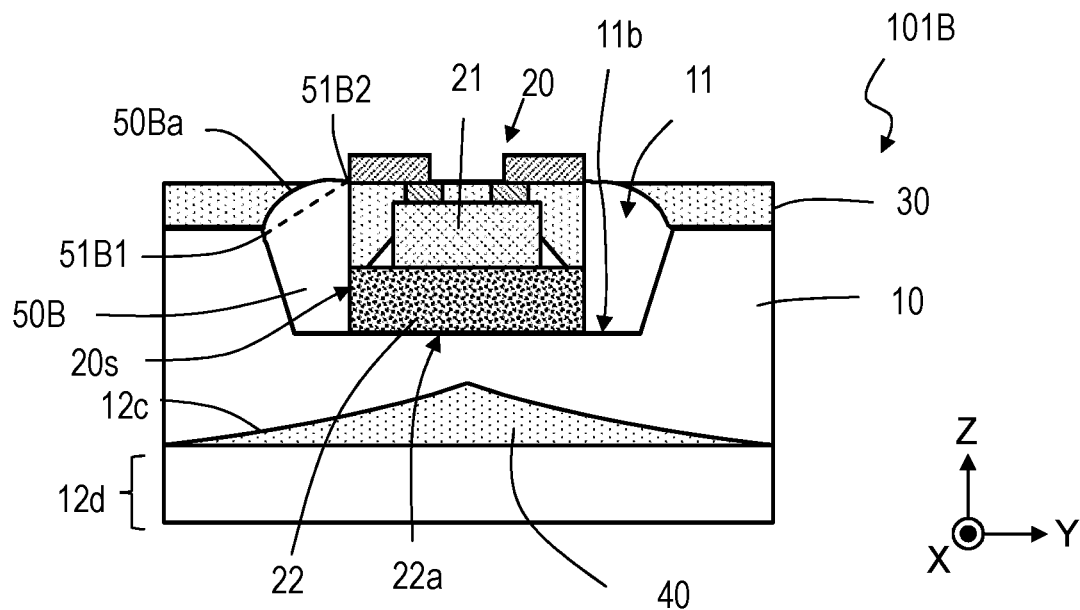
FIG. 13 is an enlarged schematic cross-sectional view showing still another example of the shape of the light-transmitting member of the second light-emitting unit.
Figure 14:
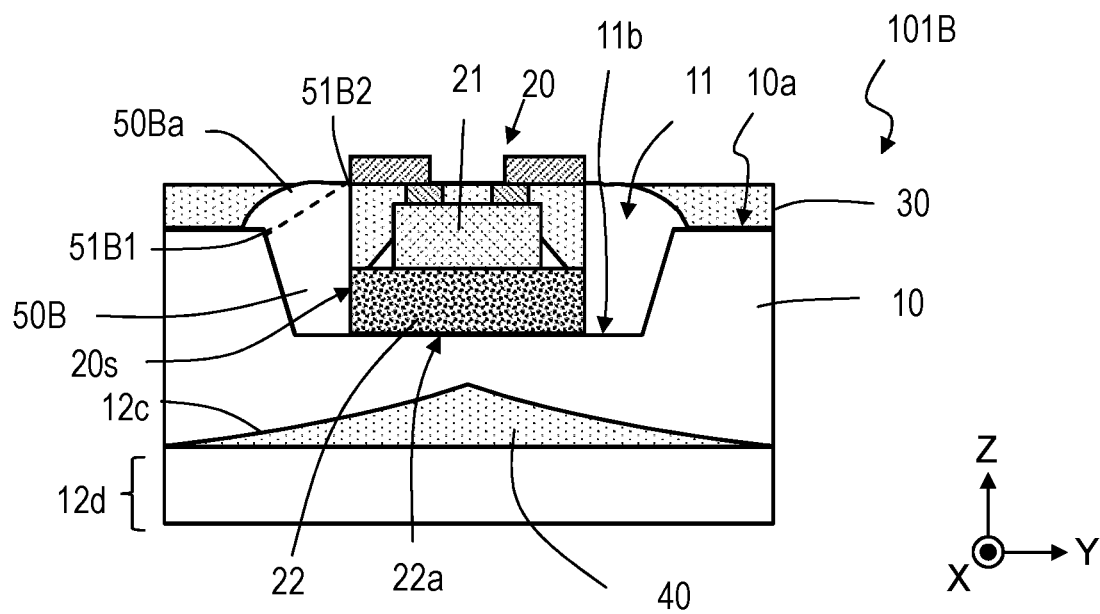
FIG. 14 is an enlarged schematic cross-sectional view showing still another example of the shape of the light-transmitting member of the second light-emitting unit.

FIG. 13 and FIG. 14 show other examples of the shape of the light-transmitting member 50. FIG. 13 and FIG. 14 enlargedly show a schematic cross section in the vicinity of the first recess 11 of the second light-emitting unit 101B as does FIG. 12. In the example shown in FIG. 6C and FIG. 12, the upper surface 50Ba of the light-transmitting member 50B is generally flat. However, as shown in FIG. 13 and FIG. 14, the upper surface 50Ba of the light-transmitting member 50B may be swollen above the line between the point 51B1 at which the upper surface 50Ba is in contact with the inner lateral surface of the first recess 11 and the point 51B2 at which the upper surface 50Ba is in contact with the lateral surface 20s of the light source 20 (broken line in FIG. 13 and FIG. 14). In other words, the upper surface 50Ba may have a convex shape. Also in this case, as shown in FIG. 14, part of the light-transmitting member 50 may be located on the first main surface 10a of the unit light-transmitting plate member 10 at the periphery of the first recess 11.

Other than the above-described configurations, the light-emitting module of the present disclosure may be variously modified. For example, a first light-emitting unit 101A, 101C or 101D may be provided at a position other than the outermost rows and columns of the light-emitting module. The light-emitting module only needs to include at least one first light-emitting unit 101A, 101C or 101D. The light-emitting module may only include a plurality of first light-emitting units 101A, 101C or 101D. When the light-emitting module includes a plurality of first light-emitting units, the plurality of first light-emitting units may be arranged continuously so as to adjoin one another within a single light-emitting module or may be arranged discretely and isolatedly within a single light-emitting module.

In a device which includes a display unit, the status of the device or information for operating the device may be displayed at a specific position on the screen. A light-emitting module of the present disclosure is useful as the backlight for such a display unit in which specific information is displayed in a specific region on the screen. When specific information is displayed in a specific region on the screen of the display unit, the characteristics of the backlight in that specific region may be different beforehand from those in the other regions. For example, when the light-emitting module is configured such that the first light-emitting unit 101A, 101C or 101D is provided in a specific region, the luminance as viewed from the front can be improved in the specific region. Therefore, the visibility of the information displayed in the specific region as viewed from the front can be improved.

The embodiments of the present disclosure are useful in surface-emission light sources for various uses. Particularly, the embodiments of the present disclosure are advantageously applicable to backlight units for liquid crystal display devices. The light emitting module or surface-emission light source according to the embodiments of the present disclosure may suitably be used in backlights for display devices of mobile devices, for which there are strong demands for reducing the thickness, surface-emitting devices that are capable of local dimming, etc.

While certain embodiments of the present invention have been described with respect to exemplary embodiments thereof, it will be apparent to those skilled in the art that the disclosed invention can be modified in numerous ways and can assume many embodiments other than those specifically described above. Accordingly, it is intended by the appended claims to cover all modifications of the invention that fall within the true spirit and scope of the invention.

What is claimed is:

1. A light-emitting module comprising:
    a light-transmitting plate member having a first main surface and a second main surface opposite to the first main surface, the light-transmitting plate member including a plurality of unit regions arrayed one-dimensionally or two-dimensionally, the plurality of unit regions including at least one first unit region and a plurality of second unit regions;
    a plurality of lens structures provided in the second main surface of the light-transmitting plate member, each of the plurality of lens structures corresponding to respective one of the plurality of unit regions each of the plurality of lens structures including a first recess proximate the first main surface of the light-transmitting plate member and a second recess proximate the second main surface of the light-transmitting plate member; and
    a plurality of light sources provided at the first main surface of the light-transmitting plate member, each of the light sources corresponding to respective one of the plurality of unit regions and respective one of the first recesses,
    wherein in the plurality of second unit regions, an optical axis of the lens structure and an optical axis of the light source are coincident with each other in a plan view, and
    in the at least one first unit region, an optical axis of the lens structure is offset from an optical axis of the light source in the plan view.

2. The light-emitting module of claim 1, further comprising a second reflecting layer which covers the first main surface.

3. The light-emitting module of claim 1, wherein
    the plurality of unit regions are two-dimensionally arranged in rows and columns in an array, and
    the at least one first unit region includes a plurality of first unit regions located in an outermost row or column of the array of the plurality of unit regions.

4. The light-emitting module of claim 1, wherein
    the light-transmitting plate member has a plurality of second recesses in the second main surface,
    each of the plurality of second recesses corresponds to one of the plurality of unit regions, and
    the plurality of lens structures are respectively provided in the plurality of second recesses.

5. The light-emitting module of claim 4, wherein each of plurality of lens structures further includes a first reflecting layer in the second recess.

6. The light-emitting module of claim 1, wherein
    the light-transmitting plate member has a plurality of first recesses in the first main surface,
    each of the plurality of first recesses corresponds to one of the plurality of unit regions, and
    the plurality of light sources are respectively provided in the plurality of first recesses of the light-transmitting plate member.

7. The light-emitting module of claim 6, wherein
    in the at least one first unit region, a center of the first recess is offset from a center of the at least one first unit region in the plan view, and
    an optical axis of the lens structure is coincident with a center of the at least one first unit region at the second main surface in the plan view.

8. The light-emitting module of claim 6, wherein
    in the at least one first unit region, a center of the first recess is coincident with a center of the at least one first unit region in the plan view, and
    an optical axis of the lens structure is offset from a center of the at least one first unit region at the second main surface in the plan view.

9. The light-emitting module of claim 6, wherein
    in the at least one first unit region, a center of the first recess is offset from a center of the at least one first unit region at the first main surface in the plan view, and an optical axis of the lens structure is offset from a center of the at least one first unit region at the second main surface in the plan view.

10. The light-emitting module of claim 9, wherein a direction of the offset of the center of the first recess is opposite to a direction of the offset of the optical axis of the lens structure.

11. The light-emitting module of claim 1, wherein
the first main surface is substantially flat, and
the plurality of light sources are bonded to the first main surface.

12. The light-emitting module of claim 11, wherein
in the at least one first unit region, an optical axis of the light source is offset from a center of the at least one first unit region at the first main surface in the plan view, and
an optical axis of the lens structure is offset from a center of the at least one first unit region at the second main surface in the plan view.

13. The light-emitting module of claim 11, wherein a direction of the offset of the optical axis of the light source is opposite to a direction of the offset of the optical axis of the lens structure.

14. The light-emitting module of claim 11, wherein
in the at least one first unit region, an optical axis of the light source is coincident with a center of the at least one first unit region at the first main surface in the plan view, and
an optical axis of the lens structure is offset from a center of the at least one first unit region at the second main surface in the plan view.

15. The light-emitting module of claim 14, wherein
the at least one first unit region has a rectangular shape in the plan view, and
a direction of the offset is parallel with either of two adjoining sides of the rectangular shape in the plan view.

16. The light-emitting module of claim 14, wherein
the at least one first unit region has a rectangular shape in the plan view, and
a direction of the offset is non-parallel with two adjoining sides of the rectangular shape in the plan view.

17. The light-emitting module of claim 11, wherein
in the at least one first unit region, an optical axis of the lens structure is coincident with a center of the at least one first unit region at the second main surface in the plan view, and
an optical axis of the light source is offset from a center of the at least one first unit region at the first main surface in the plan view.

18. The light-emitting module of claim 17, wherein
the at least one first unit region has a rectangular shape in the plan view, and
a direction of the offset is parallel with either of two adjoining sides of the rectangular shape in the plan view.

19. The light-emitting module of claim 17, wherein
the at least one first unit region has a rectangular shape in the plan view, and
a direction of the offset is parallel with a diagonal direction of the rectangular shape in the plan view.

20. The light-emitting module of claim 17, wherein
the at least one first unit region has a rectangular shape in the plan view, and
a direction of the offset is non-parallel with two adjoining sides of the rectangular shape in the plan view.

* * * * *